(12) United States Patent
Liao et al.

(10) Patent No.: US 12,276,838 B2
(45) Date of Patent: Apr. 15, 2025

(54) SEMICONDUCTOR DEVICE AND MANUFACTURING METHOD THEREOF HAVING GRATING COUPLED DIES AND NANOSTRUCTURES

(71) Applicant: Taiwan Semiconductor Manufacturing Company, Ltd., Hsinchu (TW)

(72) Inventors: Yu-Kuang Liao, Hsinchu (TW); Jia-Xsing Li, Hsinchu (TW); Ping-Jung Wu, Hsinchu (TW); Tsang-Jiuh Wu, Hsinchu (TW); Wen-Chih Chiou, Miaoli County (TW); Chen-Hua Yu, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 18/359,894

(22) Filed: Jul. 27, 2023

(65) Prior Publication Data
US 2023/0375783 A1 Nov. 23, 2023

Related U.S. Application Data

(63) Continuation of application No. 17/965,755, filed on Oct. 13, 2022, now Pat. No. 11,774,675, which is a
(Continued)

(51) Int. Cl.
*G02B 6/124* (2006.01)
*G02B 6/136* (2006.01)
*H01L 25/16* (2023.01)

(52) U.S. Cl.
CPC ............. *G02B 6/124* (2013.01); *G02B 6/136* (2013.01); *H01L 25/167* (2013.01)

(58) Field of Classification Search
CPC ...... G02B 6/124; G02B 6/136; G02B 6/4232; H01L 25/167
See application file for complete search history.

(56) References Cited

U.S. PATENT DOCUMENTS 6,343,171 B1 * 1/2002 Yoshimura .......... H01L 23/5389
385/24
6,611,635 B1 * 8/2003 Yoshimura .............. H01L 24/96
257/E25.032

(Continued)

*Primary Examiner* — Andrew Jordan
(74) *Attorney, Agent, or Firm* — JCIPRNET

(57) ABSTRACT

A semiconductor device includes a photonic die and an optical die. The photonic die includes a grating coupler and an optical device. The optical device is connected to the grating coupler to receive radiation of predetermined wavelength incident on the grating coupler. The optical die is disposed over the photonic die and includes a substrate with optical nanostructures. Positions and shapes of the optical nanostructures are such to perform an optical transformation on the incident radiation of predetermined wavelength when the incident radiation passes through an area of the substrate where the optical nanostructures are located. The optical nanostructures overlie the grating coupler so that the incident radiation of predetermined wavelength crosses the optical die where the optical nanostructures are located before reaching the grating coupler.

20 Claims, 42 Drawing Sheets

Related U.S. Application Data continuation of application No. 17/213,198, filed on Mar. 25, 2021, now Pat. No. 11,487,060.

(56) References Cited

U.S. PATENT DOCUMENTS

| | | | |
|---|---|---|---|
| 6,684,007 B2* | 1/2004 | Yoshimura | G02B 6/43 |
| | | | 257/E25.032 |
| 6,690,845 B1* | 2/2004 | Yoshimura | G02B 6/124 |
| | | | 257/E25.032 |
| 6,706,546 B2* | 3/2004 | Yoshimura | H05K 1/0274 |
| | | | 438/464 |
| 6,785,447 B2* | 8/2004 | Yoshimura | H01L 23/5389 |
| | | | 257/E25.032 |
| 6,865,310 B2* | 3/2005 | Yokouchi | G02B 6/12007 |
| | | | 385/9 |
| 7,046,893 B2* | 5/2006 | Dorn | G02B 1/045 |
| | | | 385/129 |
| 8,797,057 B2* | 8/2014 | Wu | G01R 31/2886 |
| | | | 438/18 |
| 8,993,380 B2 | 3/2015 | Hou et al. | |
| 9,116,203 B2* | 8/2015 | Wu | G01R 31/2601 |
| 9,164,026 B2* | 10/2015 | Chakravarty | G01N 21/253 |
| 9,281,254 B2 | 3/2016 | Yu et al. | |
| 9,285,554 B2* | 3/2016 | Doany | G02B 6/32 |
| 9,299,649 B2 | 3/2016 | Chiu et al. | |
| 9,372,206 B2 | 6/2016 | Wu et al. | |
| 9,412,678 B2* | 8/2016 | Hou | H01L 21/76898 |
| 9,425,126 B2 | 8/2016 | Kuo et al. | |
| 9,443,783 B2 | 9/2016 | Lin et al. | |
| 9,461,018 B1 | 10/2016 | Tsai et al. | |
| 9,496,189 B2 | 11/2016 | Yu et al. | |
| 9,618,572 B2* | 4/2017 | Wu | G01R 31/2886 |
| 9,653,427 B2* | 5/2017 | Wu | H01L 24/97 |
| 9,666,502 B2 | 5/2017 | Chen et al. | |
| 9,671,563 B2* | 6/2017 | Doany | G02B 6/3652 |
| 9,735,131 B2 | 8/2017 | Su et al. | |
| 9,754,831 B2* | 9/2017 | Kuo | H01L 23/53238 |
| 9,817,193 B2* | 11/2017 | Doany | G02B 6/29323 |
| 9,837,379 B2* | 12/2017 | Chen | H01L 21/78 |
| 9,846,126 B2* | 12/2017 | Gunn, III | G01N 21/255 |
| 10,083,913 B2* | 9/2018 | Tsai | H01L 21/486 |
| 10,109,613 B2* | 10/2018 | Lin | H01L 23/5389 |
| 10,175,294 B2* | 1/2019 | Wu | G01R 1/0416 |
| 10,269,584 B2* | 4/2019 | Chiu | H01L 21/4853 |
| 10,269,764 B2* | 4/2019 | Chen | H01L 25/0652 |
| 10,490,540 B2* | 11/2019 | Yu | H01L 25/50 |
| 10,663,512 B2* | 5/2020 | Wu | H01L 22/32 |
| 10,665,474 B2* | 5/2020 | Chiu | H01L 23/49816 |
| 10,700,040 B2* | 6/2020 | Chen | H01L 23/3114 |
| 10,784,248 B2* | 9/2020 | Yu | H01L 24/20 |
| 11,041,811 B2* | 6/2021 | Gunn, III | G01N 21/39 |
| 11,069,539 B2* | 7/2021 | Chiu | H01L 21/6835 |
| 11,092,826 B2* | 8/2021 | Janta-Polczynski | |
| | | | G02F 1/0955 |
| 11,145,622 B2* | 10/2021 | Chen | H01L 21/561 |
| 11,169,207 B2* | 11/2021 | Wu | G01R 31/2601 |
| 11,194,082 B2* | 12/2021 | Zhu | G02B 6/32 |
| 11,320,584 B2* | 5/2022 | Ryckman | G02B 6/136 |
| 11,487,060 B2* | 11/2022 | Liao | G02B 6/136 |
| 11,692,938 B2* | 7/2023 | Kabiri | G02B 5/285 |
| | | | 435/6.1 |
| 11,730,067 B2* | 8/2023 | Orcutt | H10N 69/00 |
| 11,774,675 B2* | 10/2023 | Liao | G02B 6/124 |
| | | | 385/14 |
| 2002/0028045 A1* | 3/2002 | Yoshimura | H01L 23/5389 |
| | | | 385/39 |
| 2002/0039464 A1* | 4/2002 | Yoshimura | H01L 24/24 |
| | | | 257/E25.032 |
| 2002/0097962 A1* | 7/2002 | Yoshimura | G02B 6/124 |
| | | | 385/16 |
| 2006/0110125 A1* | 5/2006 | Lin | B82Y 10/00 |
| | | | 385/147 |
| 2007/0166874 A1* | 7/2007 | Lin | B82Y 10/00 |
| | | | 438/102 |
| 2012/0206160 A1* | 8/2012 | Wu | G01R 31/2884 |
| | | | 324/756.07 |
| 2013/0209026 A1* | 8/2013 | Doany | G02B 6/32 |
| | | | 438/32 |
| 2014/0001645 A1* | 1/2014 | Lin | H01L 25/0657 |
| | | | 257/E23.079 |
| 2014/0140655 A1* | 5/2014 | Chakravarty | G01N 21/7746 |
| | | | 385/12 |
| 2014/0225258 A1* | 8/2014 | Chiu | H01L 21/6835 |
| | | | 257/737 |
| 2014/0252572 A1* | 9/2014 | Hou | H01L 25/0655 |
| | | | 438/112 |
| 2014/0327464 A1* | 11/2014 | Wu | G01R 31/2893 |
| | | | 324/756.07 |
| 2015/0194361 A1* | 7/2015 | Hou | H01L 23/3142 |
| | | | 257/773 |
| 2015/0228550 A1* | 8/2015 | Yu | H01L 22/20 |
| | | | 257/48 |
| 2015/0348872 A1* | 12/2015 | Kuo | H01L 21/76898 |
| | | | 257/774 |
| 2015/0362526 A1* | 12/2015 | Wu | H01L 22/32 |
| | | | 324/756.01 |
| 2015/0364386 A1* | 12/2015 | Yu | H01L 22/32 |
| | | | 438/15 |
| 2016/0172333 A1* | 6/2016 | Wu | H01L 22/14 |
| | | | 257/48 |
| 2016/0181124 A1* | 6/2016 | Chiu | H01L 21/6835 |
| | | | 438/125 |
| 2016/0195678 A1* | 7/2016 | Doany | G02B 6/34 |
| | | | 438/31 |
| 2016/0274183 A1* | 9/2016 | Wu | G01R 31/2884 |
| 2016/0307871 A1* | 10/2016 | Tsai | H01L 21/78 |
| 2016/0307872 A1* | 10/2016 | Chen | H01L 21/4857 |
| 2016/0358818 A1* | 12/2016 | Kuo | H01L 21/76898 |
| 2017/0005073 A1* | 1/2017 | Lin | H01L 21/76898 |
| 2017/0025359 A1* | 1/2017 | Tsai | H01L 23/49811 |
| 2017/0133351 A1* | 5/2017 | Su | H01L 23/5389 |
| 2017/0154870 A1* | 6/2017 | Chen | H01L 25/50 |
| 2017/0212167 A1* | 7/2017 | Wu | G01R 1/0416 |
| 2017/0261704 A1* | 9/2017 | Doany | G02B 6/136 |
| 2017/0345807 A1* | 11/2017 | Yu | H01L 24/20 |
| 2018/0090465 A1* | 3/2018 | Chen | H01L 24/20 |
| 2019/0128958 A1* | 5/2019 | Wu | G01R 31/2886 |
| 2019/0221445 A1* | 7/2019 | Chiu | H01L 23/49827 |
| 2019/0252352 A1* | 8/2019 | Chen | H01L 21/561 |
| 2020/0035661 A1* | 1/2020 | Yu | H01L 23/49811 |
| 2020/0110219 A1* | 4/2020 | Abbaslou | G02B 6/1228 |
| 2020/0264231 A1* | 8/2020 | Wu | G01R 31/2896 |
| 2020/0266076 A1* | 8/2020 | Chiu | H01L 23/49894 |
| 2020/0328183 A1* | 10/2020 | Chen | H01L 21/4853 |
| 2020/0355868 A1* | 11/2020 | Ryckman | G02B 6/107 |
| 2020/0400568 A1* | 12/2020 | Kabiri | H01L 27/14621 |
| 2021/0005594 A1* | 1/2021 | Yu | H01L 23/3157 |
| 2021/0063779 A1* | 3/2021 | Janta-Polczynski | |
| | | | G02F 1/0955 |
| 2021/0125963 A1* | 4/2021 | Chen | H01L 21/486 |
| 2021/0132272 A1* | 5/2021 | Zhu | G01J 3/2823 |
| 2021/0143143 A1* | 5/2021 | Yu | H01L 25/50 |
| 2021/0187503 A1* | 6/2021 | Chiou | G02B 21/02 |
| 2021/0313196 A1* | 10/2021 | Chiu | H01L 23/49827 |
| 2021/0397009 A1* | 12/2021 | Zhang | G02B 6/0035 |
| 2022/0120684 A1* | 4/2022 | Emadi | G01N 21/645 |
| 2022/0163729 A1* | 5/2022 | Mazed | G02F 1/3134 |
| 2022/0206221 A1* | 6/2022 | Ravichandran | G02B 6/4295 |
| 2022/0308284 A1* | 9/2022 | Liao | G02B 6/124 |
| 2023/0035735 A1* | 2/2023 | Liao | G02B 6/136 |
| 2023/0375783 A1* | 11/2023 | Liao | H01L 25/167 |
| 2024/0142378 A1* | 5/2024 | Kabiri | G01N 21/6402 |

* cited by examiner

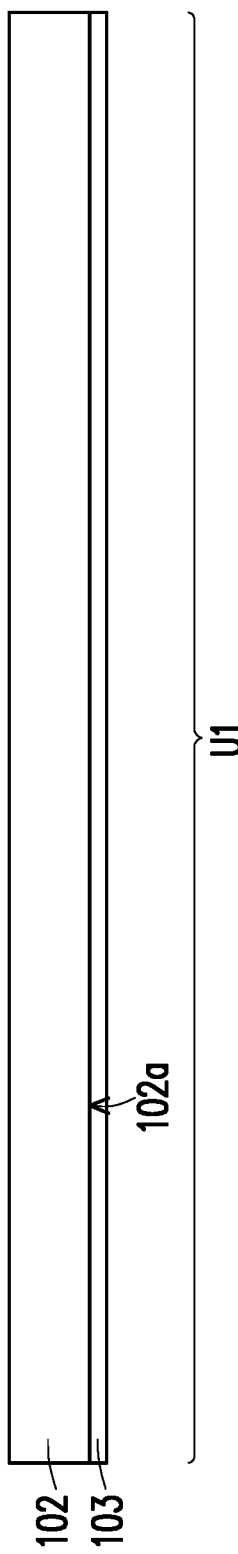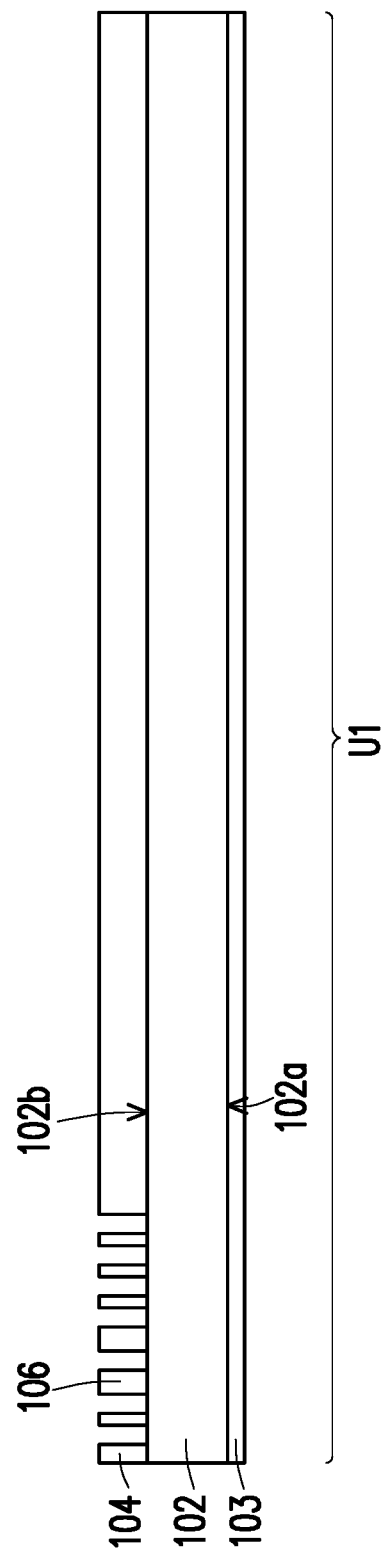
FIG. 1A
FIG. 1B

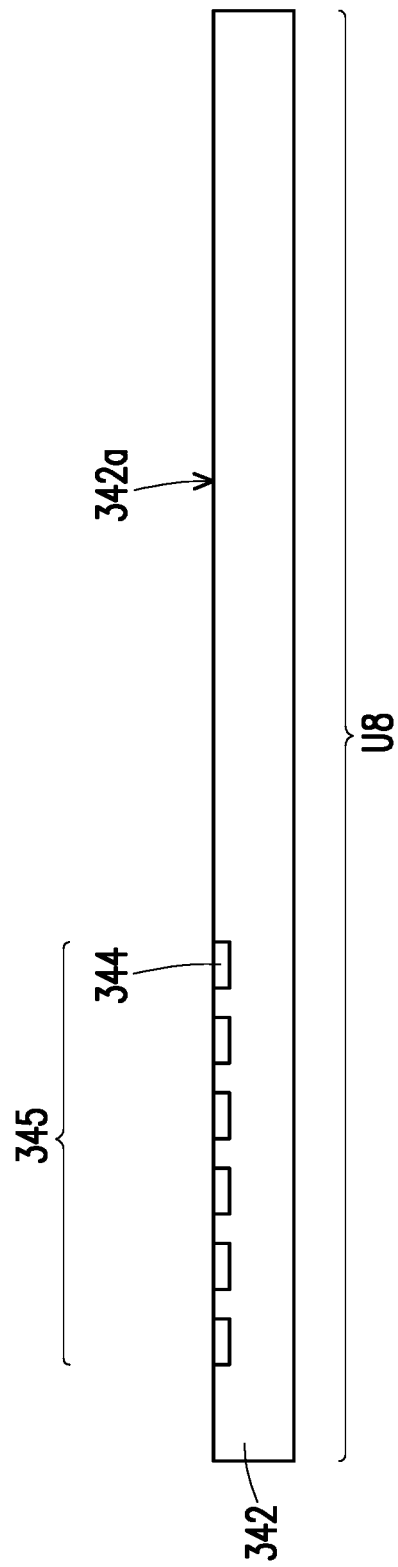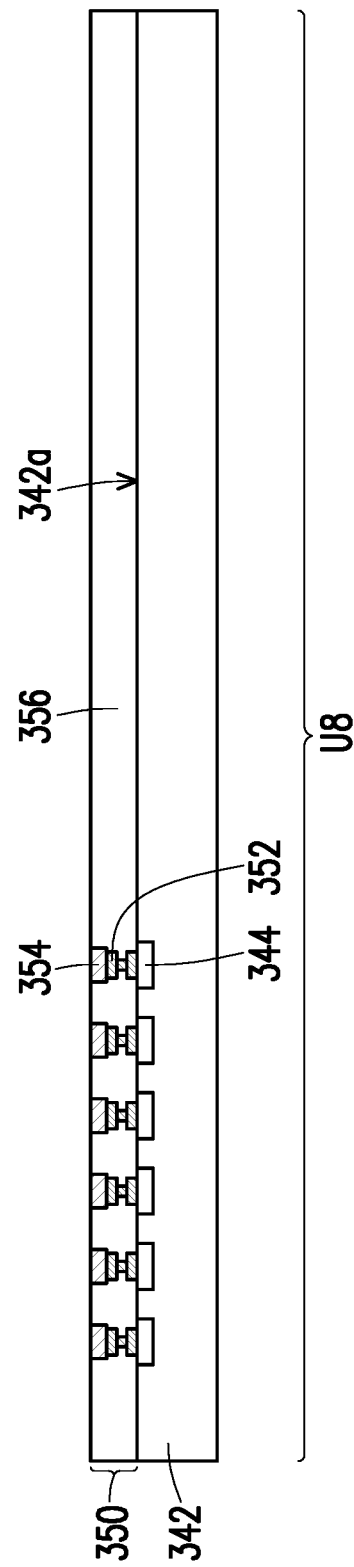

SEMICONDUCTOR DEVICE AND MANUFACTURING METHOD THEREOF HAVING GRATING COUPLED DIES AND NANOSTRUCTURES

CROSS-REFERENCE TO RELATED APPLICATION

This application is a continuation application of and claims the priority benefit of a prior application Ser. No. 17/965,755, filed on Oct. 13, 2022. The prior application Ser. No. 17/965,755 is a continuation application of and claims the priority benefit of a prior application Ser. No. 17/213,198, filed on Mar. 25, 2021. The entirety of each of the above-mentioned patent applications is hereby incorporated by reference herein and made a part of this specification.

BACKGROUND

Semiconductor devices and integrated circuits used in a variety of electronic apparatus, such as cell phones and other mobile electronic equipment, are typically manufactured on a single semiconductor wafer. The dies of the wafer may be processed and packaged with other semiconductor devices or dies at the wafer level, and various technologies and applications have been developed for wafer level packaging. Integration of multiple semiconductor devices has become a challenge in the field.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 1A to FIG. 1D are schematic cross-sectional views illustrating structures formed during a manufacturing process of an optical die according to some embodiments of the disclosure.

FIG. 10A to FIG. 10E are schematic cross-sectional views illustrating structures formed during a manufacturing process of an optical die according to some embodiments of the disclosure.

DETAILED DESCRIPTION

Figure 1C:
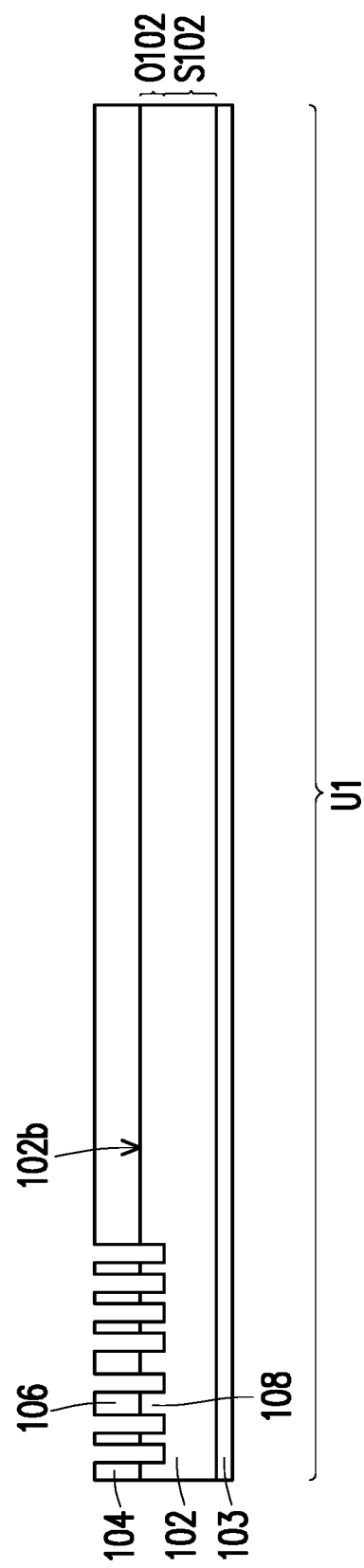

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3 DIC devices. The testing structures may include, for example, test pads formed in a redistribution layer or on a substrate that allows the testing of the 3D packaging or 3 DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

FIG. 1A to FIG. 1D are schematic cross-sectional views illustrating a manufacturing process of an optical die 100 according to some embodiments of the disclosure. In FIG. 1A, a substrate 102 is provided. In some embodiments, the substrate 102 may be in wafer form, and multiple optical dies 100 may be simultaneously fabricated. For example, different die unit regions U1 of the substrate 102 correspond to different optical dies 100. While in FIG. 1A is illustrated a single die unit region U1, the disclosure does not limit the number of die unit regions U1 included in the substrate 102.

The material of the substrate 102 is not particularly limited, and may be, for example, a material capable of transmitting radiation of at least one wavelength of interest. For example, a transmittance of the substrate 102 at the wavelength of interest may be 50% or more, such as 85% or more. For example, the transmittance of the substrate 102 may be in the range from 50% to 99%. In some embodiments, the wavelength of interest may fall in any useful region of the electromagnetic spectrum, such as in the ultraviolet (e.g., below 400 nm) and its sub-ranges such as the UV-A range, (e.g., between 315 nm to 400 nm) or the UV-B range (e.g., between 234 nm to 315 nm), in the visible (e.g., between 400 nm to 750 nm), or in the infrared (e.g., between 750 nm up to about 1 mm) and its sub-ranges such as infrared-A (e.g., up to 1400 nm), infrared-B (between 1400 nm to 3000 nm), and infrared-C (e.g., between 3000 nm to 1 mm). In some embodiments, the wavelength of interest may be more than a single wavelength, and such multiple individual wavelengths may fall in one or more of the above ranges. For example, the wavelength of interest may fall in the infrared-B and/or infrared-C range, and a material such as silicon may be used for the substrate 102. In some embodiments, the material of the substrate 102 includes one or more semiconductor materials, which may be elemental semiconductor materials, compound semiconductor materials, or semiconductor alloys. In some examples, the elemental semiconductor may include Si or Ge, and the compound semiconductor materials and the semiconductor alloys may respectively include SiGe, SiC, SiGeC, a III-V semiconductor, or a II-VI semiconductor. The III-V semiconductor includes materials such as GaN, GaP, GaAs, AlN, AlP, AlAs, InN, InP, InAs, GaNP, GaNAs, GaPAs, AlNP, AlNAs, AlPAs, InNP, InNAs, InPAs, GaAlNP, GaAlNAs, GaAlPAs, GaInNP, GaInNAs, GaInPAs, InAlNP, InAlNAs, or InAlPAs. The II-VI semiconductor include materials such as CdS, CdSe, CdTe, ZnS, ZnSe, ZnTe, HgS, HgSe, HgTe, CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, CdZnSeS, CdZnSeTe, CdZnSTe, CdHgSeS, CdHgSeTe, CdHgSTe, HgZnSeS, HgZnSeTe, or HgZnSTe. In some alternative embodiments, the material of the substrate 102 includes a dielectric material. For example, the substrate 102 may be an inorganic substrate, including silicon oxide, silicon nitride, silicon oxynitride, silicon carbide, silicon oxycarbide, siliconcarbooxynitride, a combination thereof, or the like. In some embodiments, organic dielectrics (e.g., polymers such as polyimide, epoxy resin, acrylic resin, phenol resin, benzocyclobutene (BCB), polybenzoxazole (PBO), a combination thereof, or the like) may also be selected for the substrate 102. In some embodiments, the material of the substrate 102 may be selected based on its refractive index at the wavelength of interest. For example, the refractive index of the material of the substrate 102 may be greater than 1 or 1.5, such as greater than 2 or even greater than 3.

In some embodiments, a bonding layer 103 is formed on a surface 102a of the substrate 102. The bonding layer 103 may include an inorganic material, such as silicon oxide, silicon nitride, silicon oxynitride, silicon carbide, silicon oxycarbide, siliconcarbooxynitride, a combination thereof, or the like. In some embodiments, the inorganic material can include a silicate, such as tetraethylorthosilicate (TEOS) oxide, or plasma enhanced TEOS (PETEOS) oxide. In some embodiments, the bonding layer 103 may be formed according to any suitable technique, such as by sputtering, spin-coating, or the like. For example, the bonding layer 103 may be formed by PVD, CVD, ALD, or the like.

In FIG. 1B, a patterned mask 104 is formed on a surface 102b of the substrate 102 opposite to the surface 102a where the bonding layer 103 has been formed. In some embodiments, the patterned mask 104 includes a positive or a negative photoresist, and is formed, for example, through a sequence of deposition (e.g., spin on), exposure, and development steps. In some embodiments, the patterned mask 104 is patterned to form a plurality of patterning microstructures 106. The patterning microstructures 106 may be formed in a selected region of the patterned mask 104, and portions of the substrate 102 are exposed by gaps existing in between adjacent patterning microstructures 106.

In FIG. 1C, the pattern of the patterning microstructures 106 is transferred to the substrate 102, from the side of the surface 102b. For example, one or more etching steps may be performed to remove exposed portions of the substrate 102 in between the patterning microstructures 106. The etching may be any acceptable etch process, such as wet or dry etching, a reactive ion etch (RIE), neutral beam etch (NBE), the like, or a combination thereof. The etching may be anisotropic. In some embodiments, the etch is performed so that optical nanostructures 108 are formed on the side of the surface 102b of the substrate 102, protruding from a bulk substrate layer S102 of the substrate 102. That is, the etching conditions may be selected so that the bulk substrate layer S102 of the substrate 102 remains underneath an optical layer O102 in which the optical nanostructures 108 are formed. For example, the optical nanostructures 108 may be defined by forming blind holes in the substrate 102.

Figure 1D:
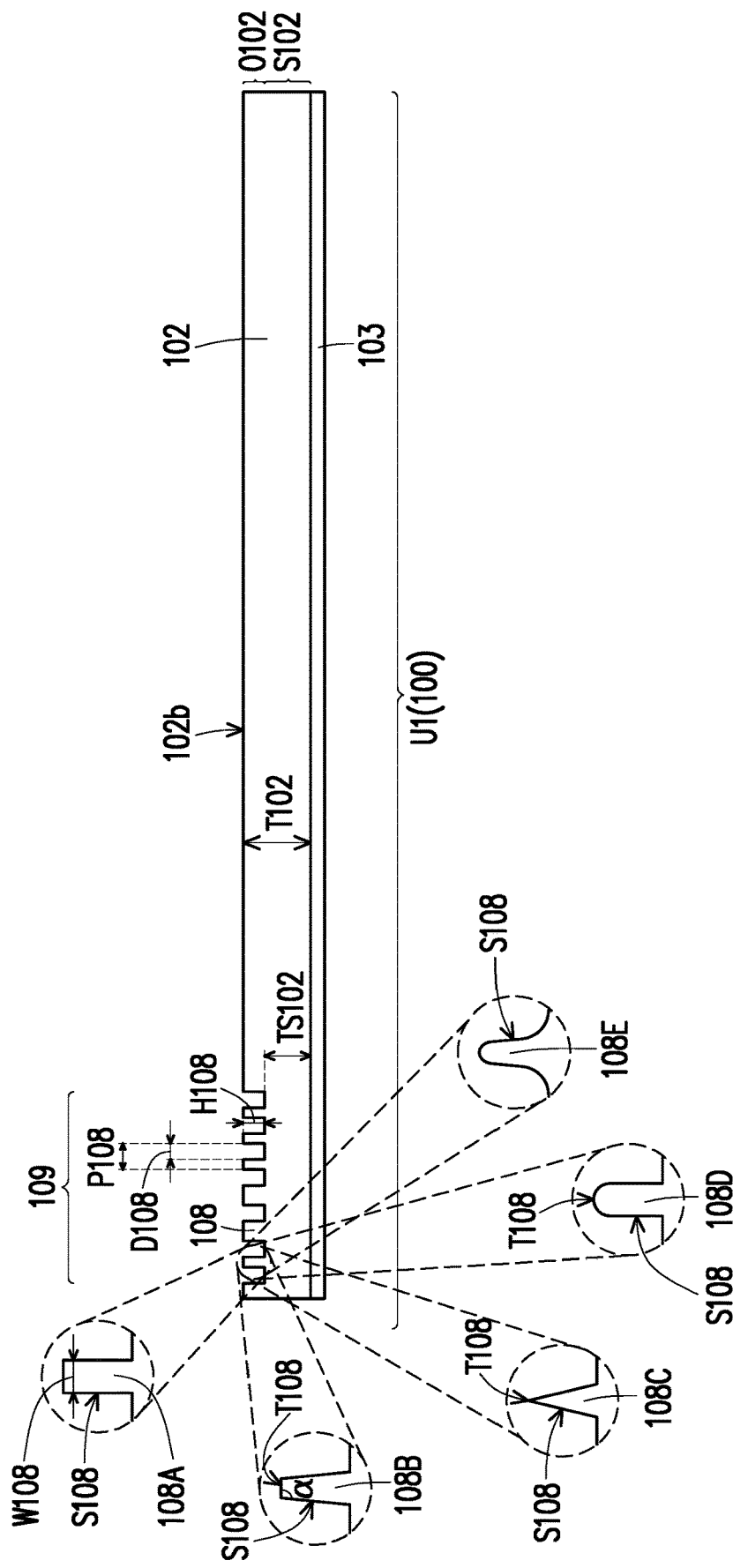

Referring to FIG. 1C and FIG. 1D, the photoresist mask 104 is removed, for example via ashing or stripping, to expose again the surface 102b of the substrate 102. After removal of the photoresist mask 104, the optical dies 100 may still be in wafer form, corresponding to different die unit regions U1 of the substrate 102. As illustrated in FIG. 1D, an optical die 100 includes an optically active area 109 in which the optical nanostructures 108 are located. The optical nanostructures 108 may be formed so that radiation incident on the optically active area 109 undergoes a desired optical transformation. For example, the optical nanostructures 108 of the optically active area 109 may be formed such that radiation incident on the optically active area 109 from the side of the surface 102b is focused upon passing through the optical die 100. That is, the optically active area 109 may have a lensing effect on incident radiation of selected wavelength, so that the optically active area 109 may act as a lens of a certain focal length for the incident radiation. While lensing has been described as an example, the disclosure is not limited thereto, and other optical effects or combinations thereof may be implemented by tuning the position and the shape of the optical nanostructures 108 to define the pattern of the optically active area 109. For example, the optically active area 109 may have a lensing effect, a polarizing effect (e.g., half-wave, quarter-wave, full-wave, multi-order, zero-order, etc.), a filtering effect (e.g., monochromatic or polychromatic, long-pass, band-pass, short-pass, etc.), a combination thereof, or the like.

The pattern formed by the optical nanostructures 108 (and, hence, the optical transformation effect on the incident radiation) may be determined by tuning the formation conditions of the optical nanostructures 108, such as the pattern of the patterning microstructures 106, the type of etching performed, the etchant mixture used, and so on. For example, changes in the pattern of the optical nanostructures 108 may be realized by tuning the etching depth through control of the reaction time, thus determining the height H108 of the optical nanostructures 108 (or, equivalently, the height of the optical layer O102). In some embodiments, the height H108 of the optical nanostructures 108 may be in the range from about 50 nanometers to a few micrometers (e.g., up to about 10 micrometers). In some embodiments, the height H108 of the optical nanostructures 108 may be selected according to the dielectric constant of the material constituting the optical layer O102 in which the optical nanostructures 108 are formed. As a way of example and not of limitation, when the optical layer O102 is made of silicon, the height H108 of the optical nanostructures 108 may be 1 micrometer or less, for example down to 50 nanometers or even less as long as the desired optical effect can be achieved; when the optical layer O102 is made of silicon nitride, the height H108 of the optical nanostructures 108 may be in the range from about 1 micrometer to about 3.5 micrometers; and when the optical layer O102 is made of oxide (e.g., silicon oxide), the height H108 of the optical nanostructures 108 may be in the range from about 3 micrometers to about 5 micrometers. Other structural parameters of the pattern of optical nanostructures 108 may also be varied, such as the distance D108 or the pitch P108 between adjacent optical nanostructures 108. The distance D108 may be the distance separating facing sidewalls S108 of adjacent optical nanostructures 108, while the pitch P108 may be the distance between corresponding sidewalls S108 of adjacent optical nanostructures 108. In some embodiments, the distance D108 and the pitch P108 may be selected so that the optical nanostructures 108 form a photonic crystal structure, for selecting or otherwise transforming the incident radiation.

In some embodiments, the shape of the optical nanostructures 108 can also be selected according to the application requirements, as shown in the examples illustrated in the insets of FIG. 1D. For example, the optical nanostructures 108A have substantially straight sidewalls S108 (e.g., perpendicular with respect to the surface of the bulk substrate layer S102), resulting in a rectangular profile. In some embodiments, the optical nanostructures 108A may be square or rectangular pillars, or elongated cuboids (depending on the aspect ratio of the side surfaces). In some alternative embodiments, the sidewalls S108 may be tapered with respect to the top surface T108, as illustrated for the optical nanostructures 108B. The tapering angle α is not particularly limited. In some embodiments, the tapering angle α may be greater than 90 degrees, such as up to 125 or 150 degrees. For example, the optical nanostructures 108B may have the shape of truncated pyramids or cones, or may be elongated trapezoidal prisms. In some alternative embodiments, the top surface T108 of the optical nanostructures 108 may be as small as to substantially coincide with a shared edge or corner between adjacent or opposite sidewalls S108, as illustrated, for example, for the optical nanostructures 108C. In some embodiments, the optical nanostructures 108C may have the shape of cones, pyramids, or elongated triangular prisms. In some alternative embodiments, the top surface T108 may be rounded, as illustrated for the optical nanostructures 108D. The sidewalls S108 may be substantially straight (as for the optical nanostructures 108D), tapered (as for the optical nanostructures 108B, 108C), bell-shaped (as illustrated for the optical nanostructures 108E), or of any other suitable profile. In some embodiments, individual optical nanostructures 108 formed in the optically active area 109 may have different shapes with respect to each other, so that in the optically active area 109 may be included any suitable combination of the optical nanostructures 108A-108E. It will be apparent that the shapes discussed above for the optical nanostructures 108A-108E are non-limiting examples, and that other shapes for the optical nanostructures 108 are contemplated within the scope of the disclosure. Based on the above, the optical nanostructures 108 may be considered columnar formations formed in the optical layer O102, in at least some embodiments protruding from the bulk substrate layer S102 of the substrate 102.

Figure 2A:
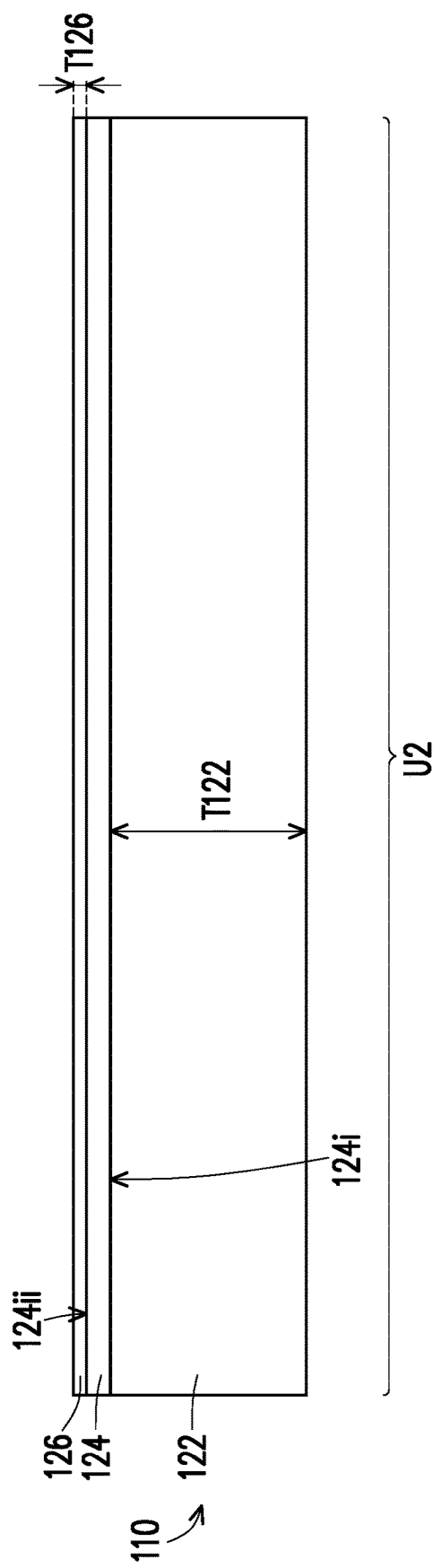
FIG. 2A to FIG. 2N are schematic cross-sectional views illustrating structures formed during a manufacturing process of a semiconductor device according to some embodiments of the disclosure.
Figure 2B:
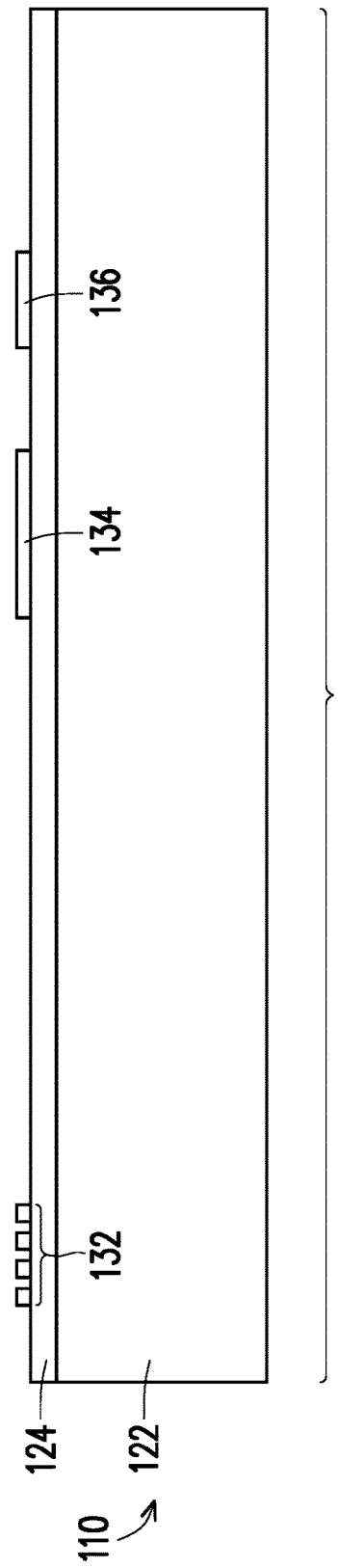
FIG. 2O is a schematic cross-sectional view of a semiconductor device in use according to some embodiments of the disclosure.
FIG. 2P is a schematic cross-sectional view of a semiconductor device according to some embodiments of the disclosure.
Figure 2C:
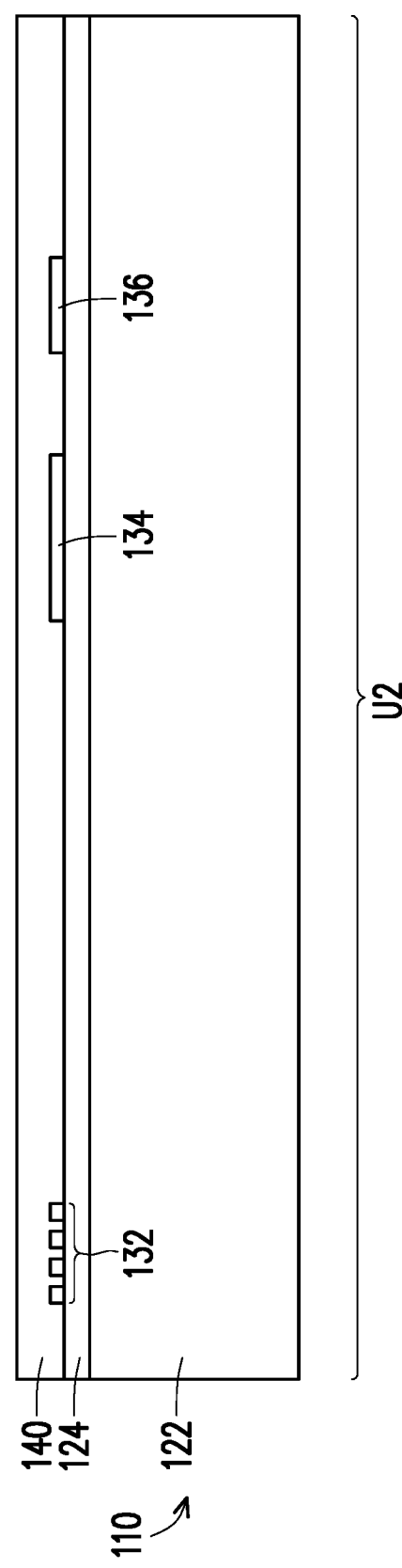
Figure 2D:
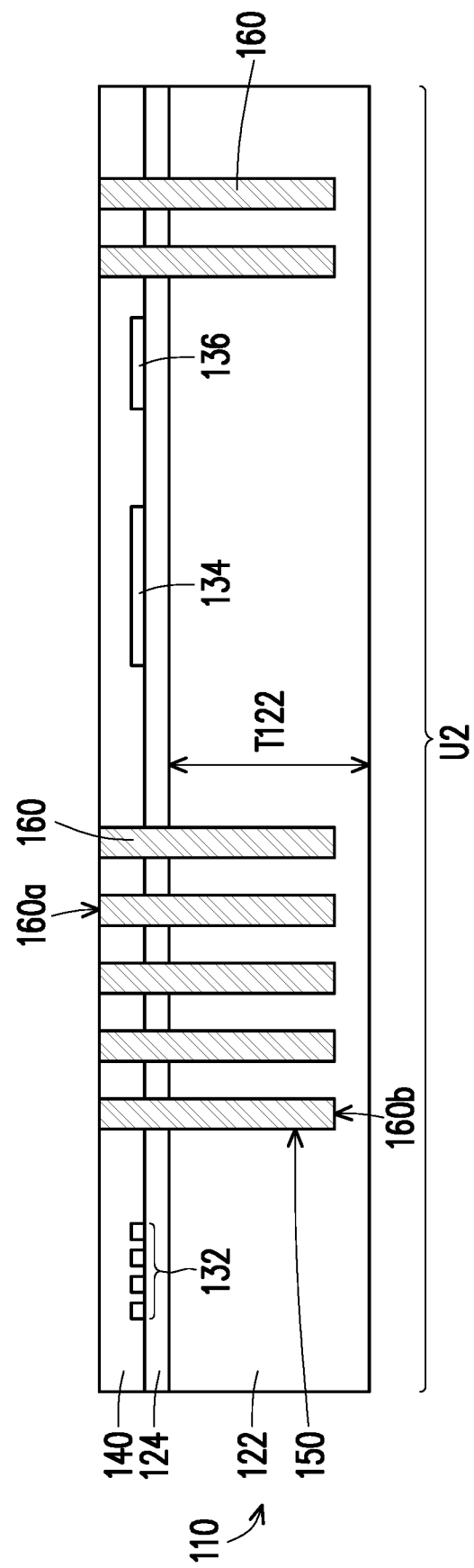
Figure 2E:
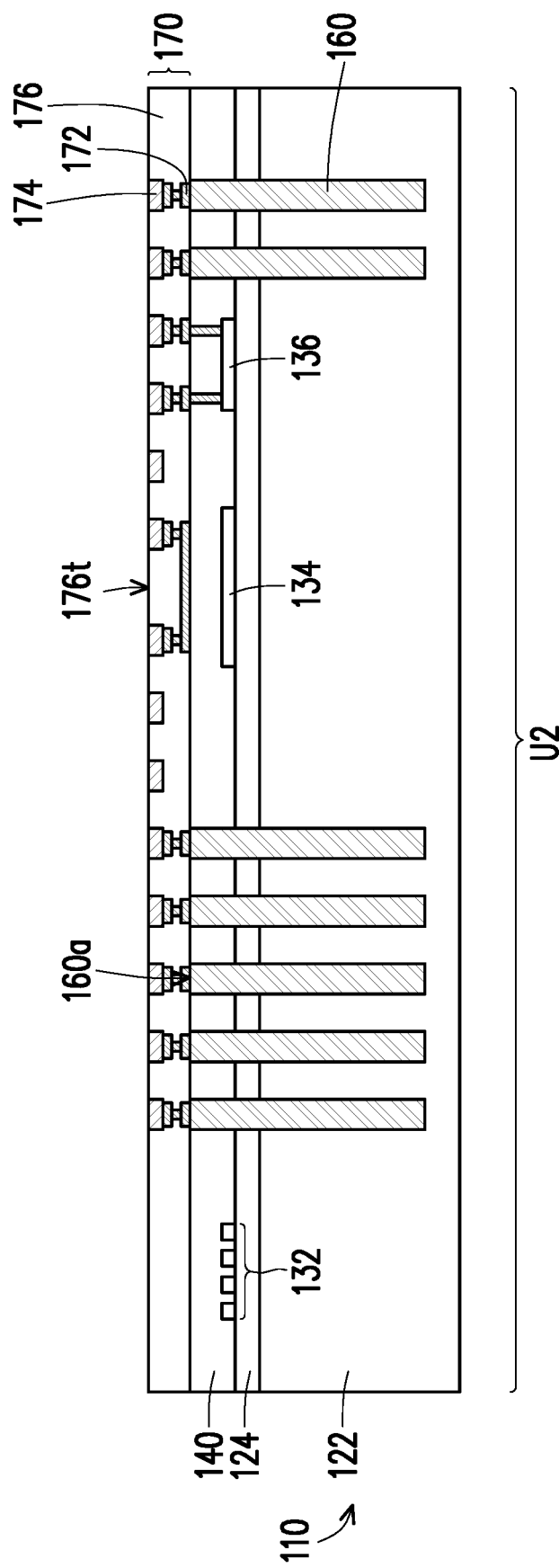
Figure 2F:
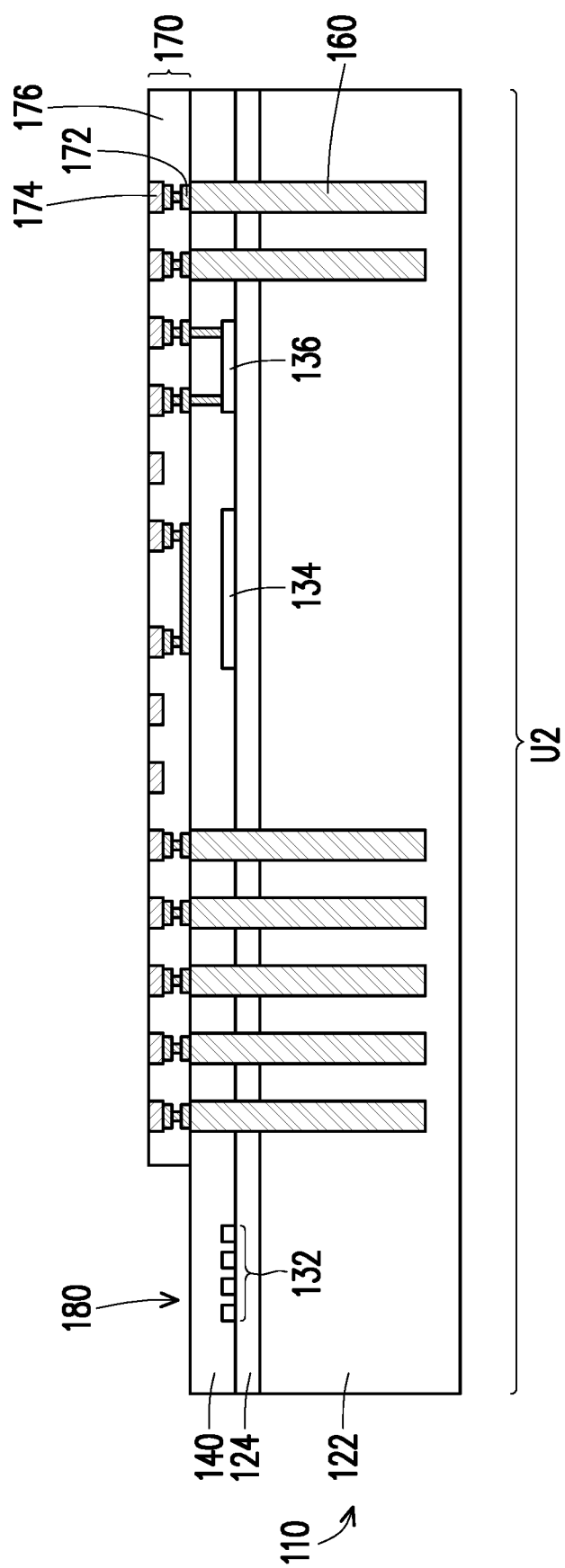
Figure 2G:
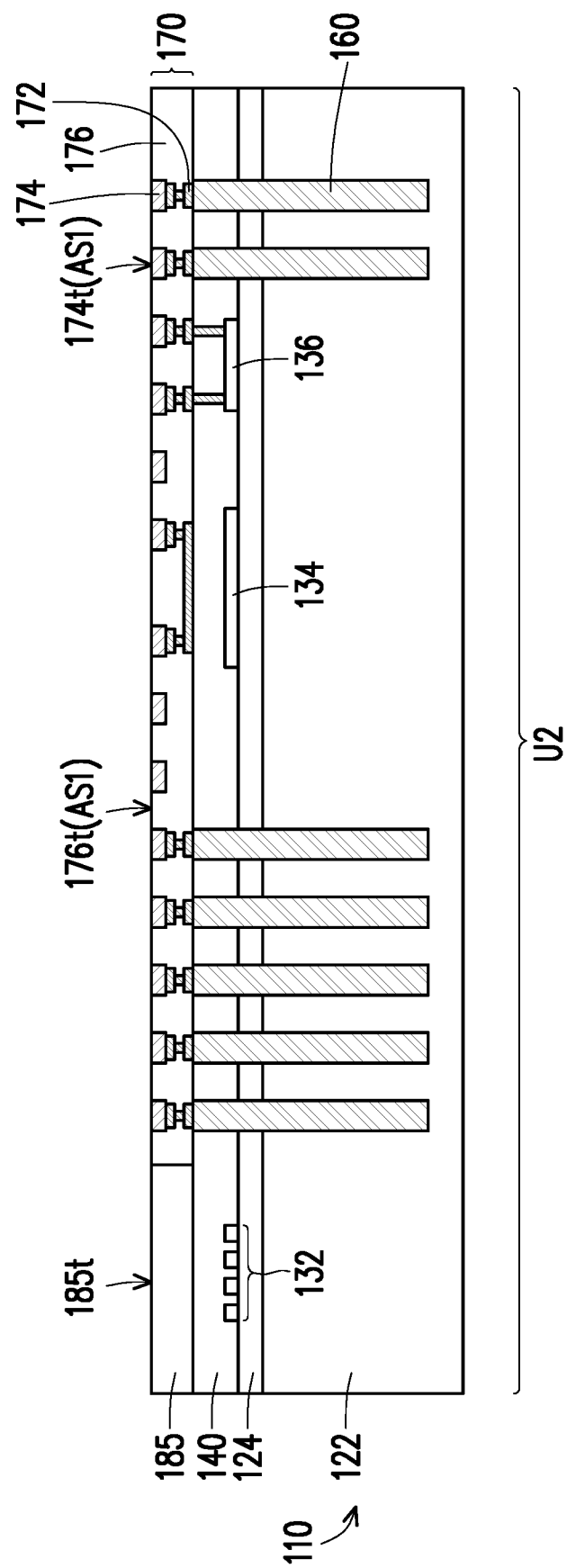
Figure 2H:
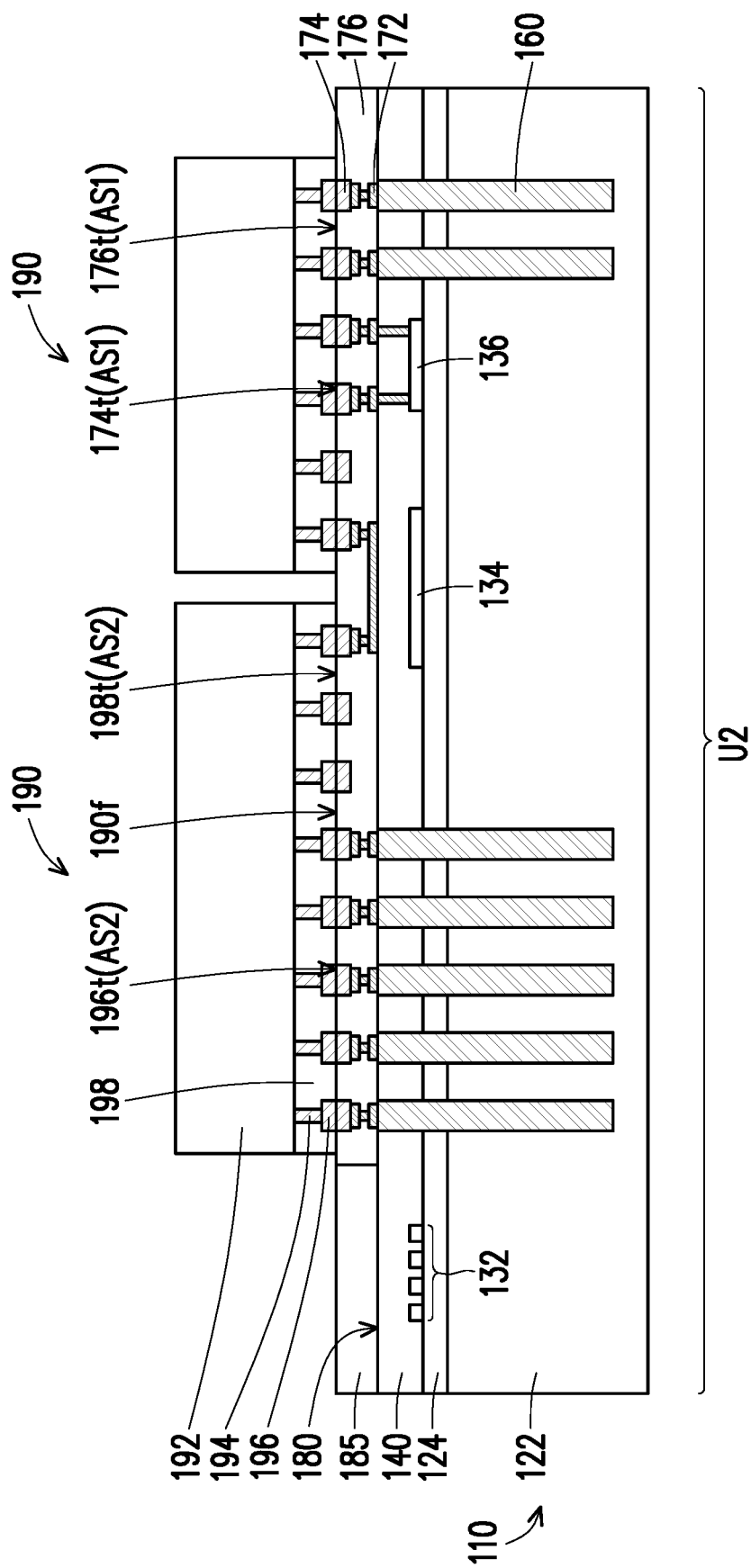
Figure 2I:
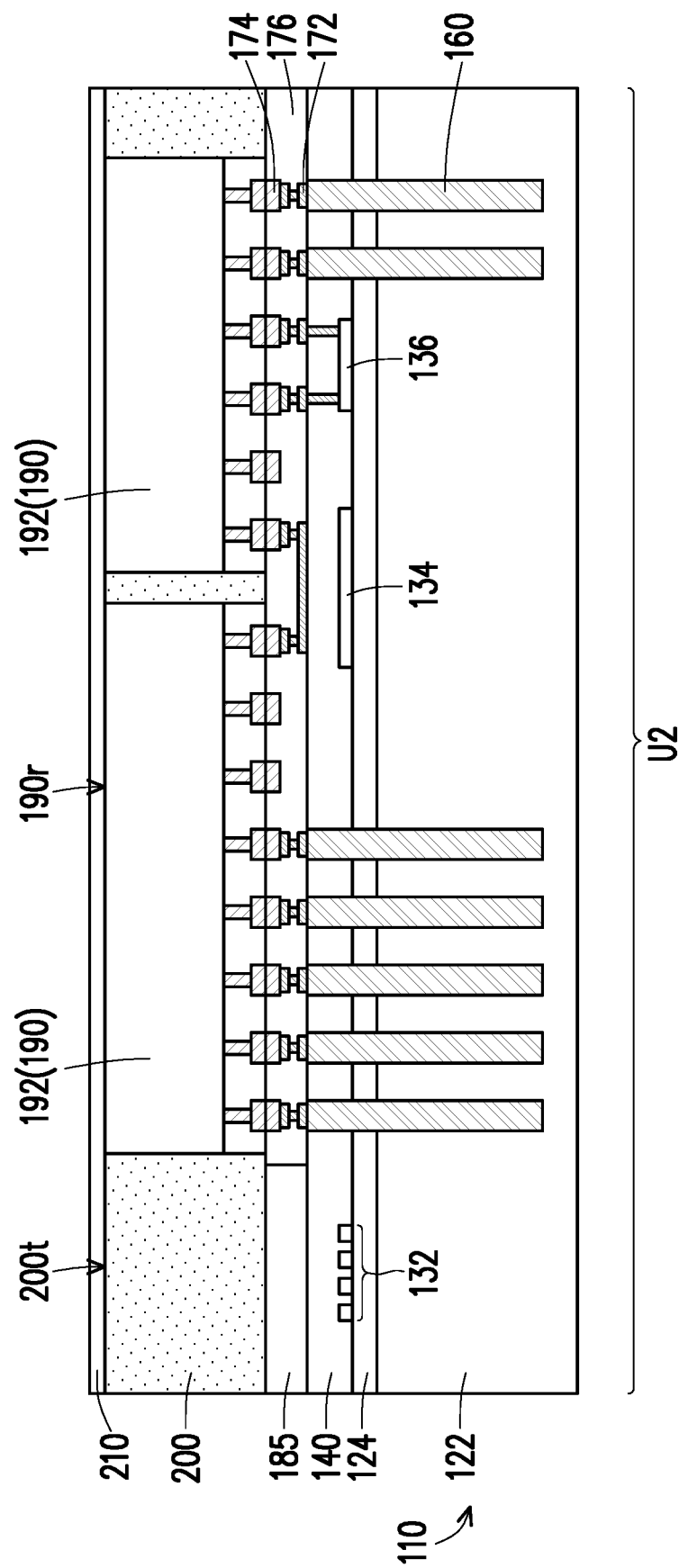
Figure 2J:
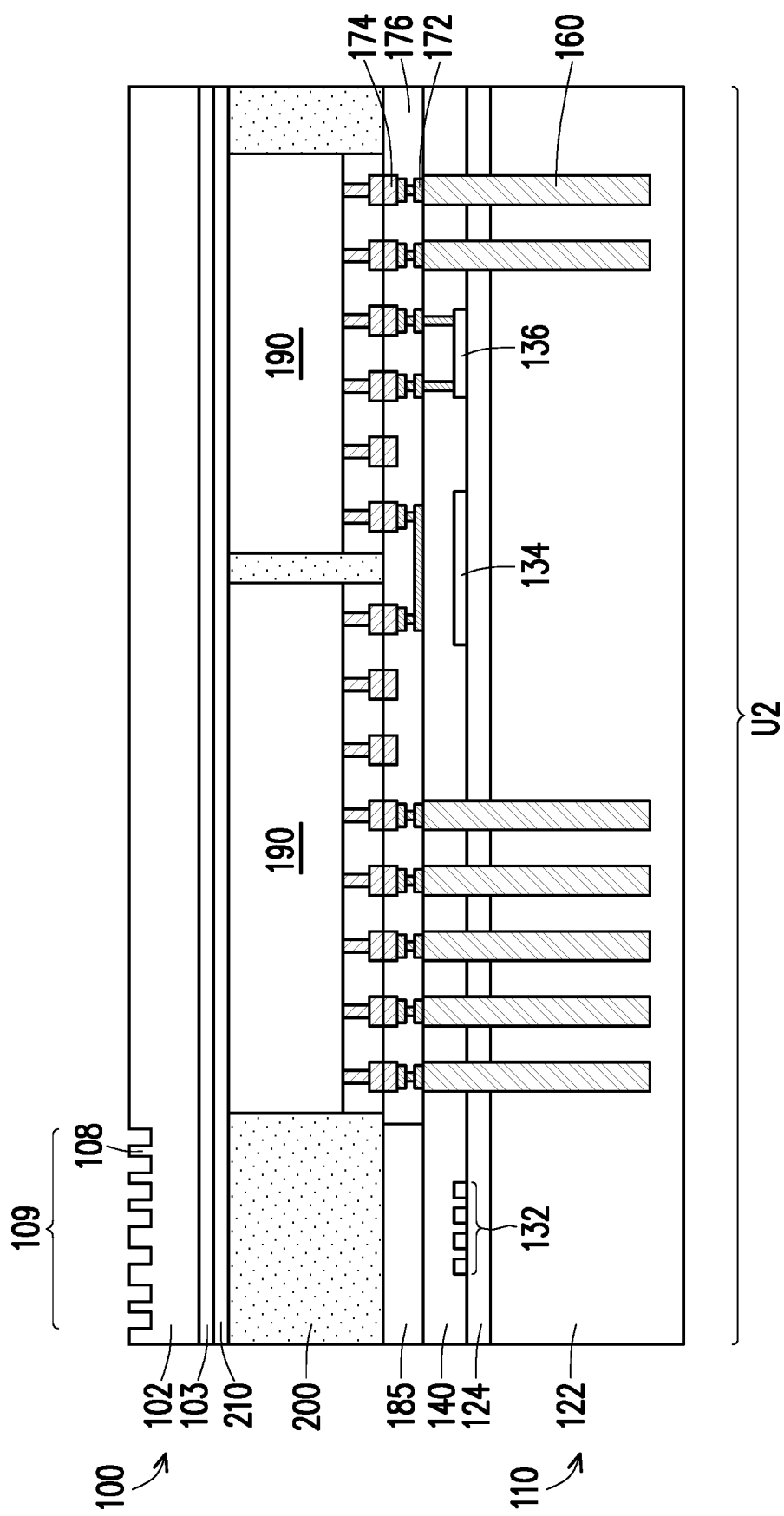
Figure 2K:
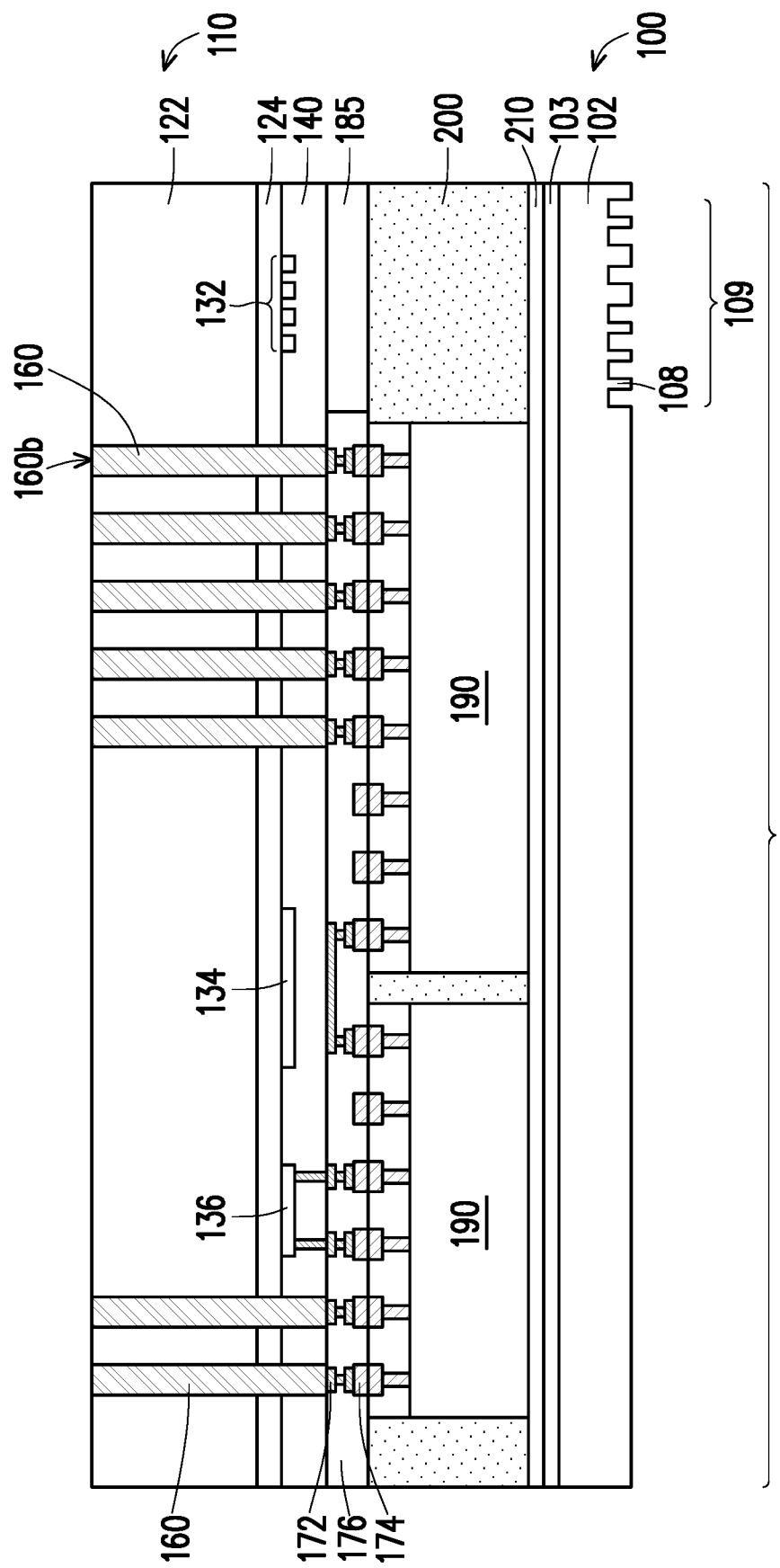
Figure 2L:
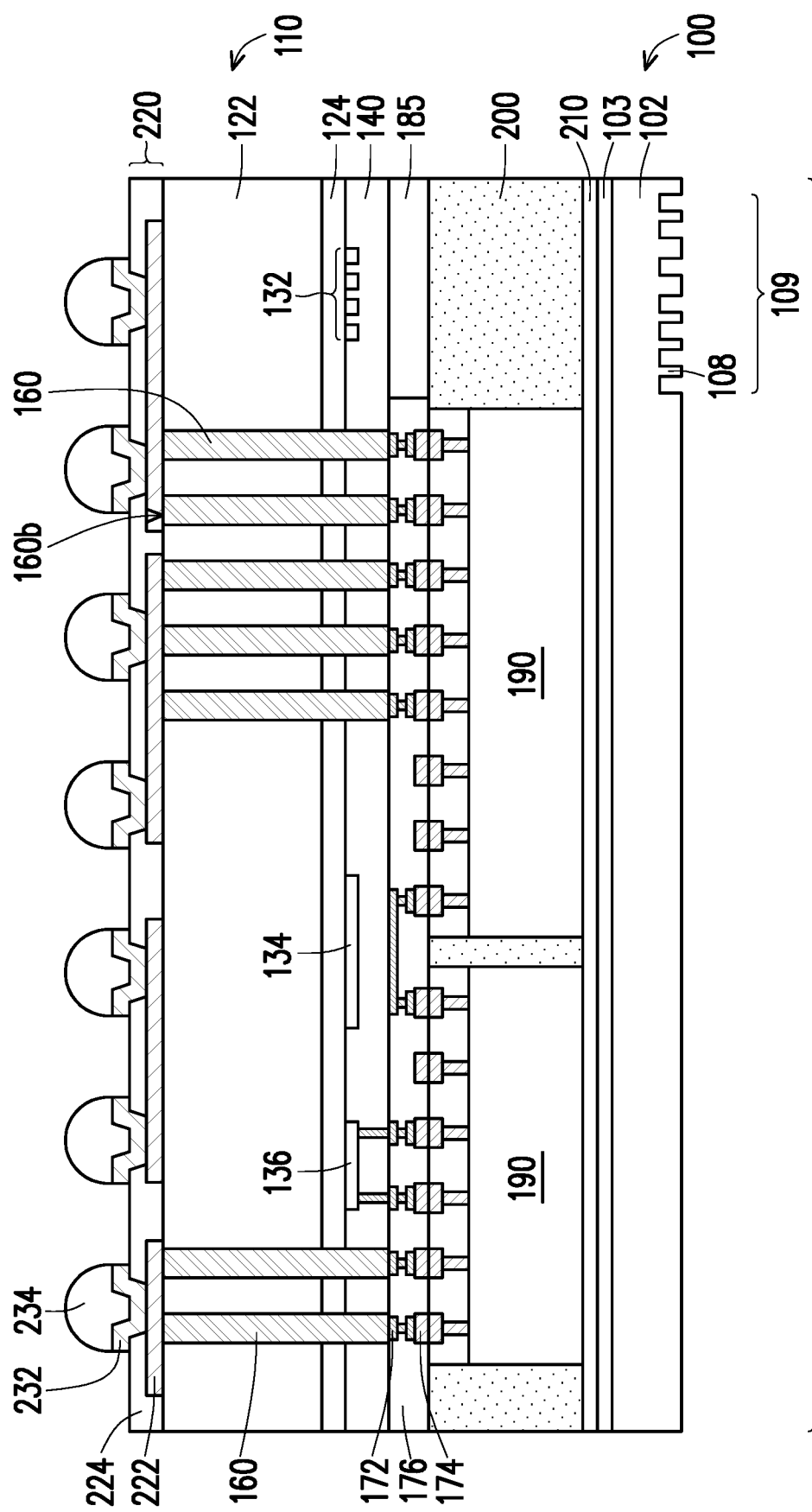
Figure 2M:
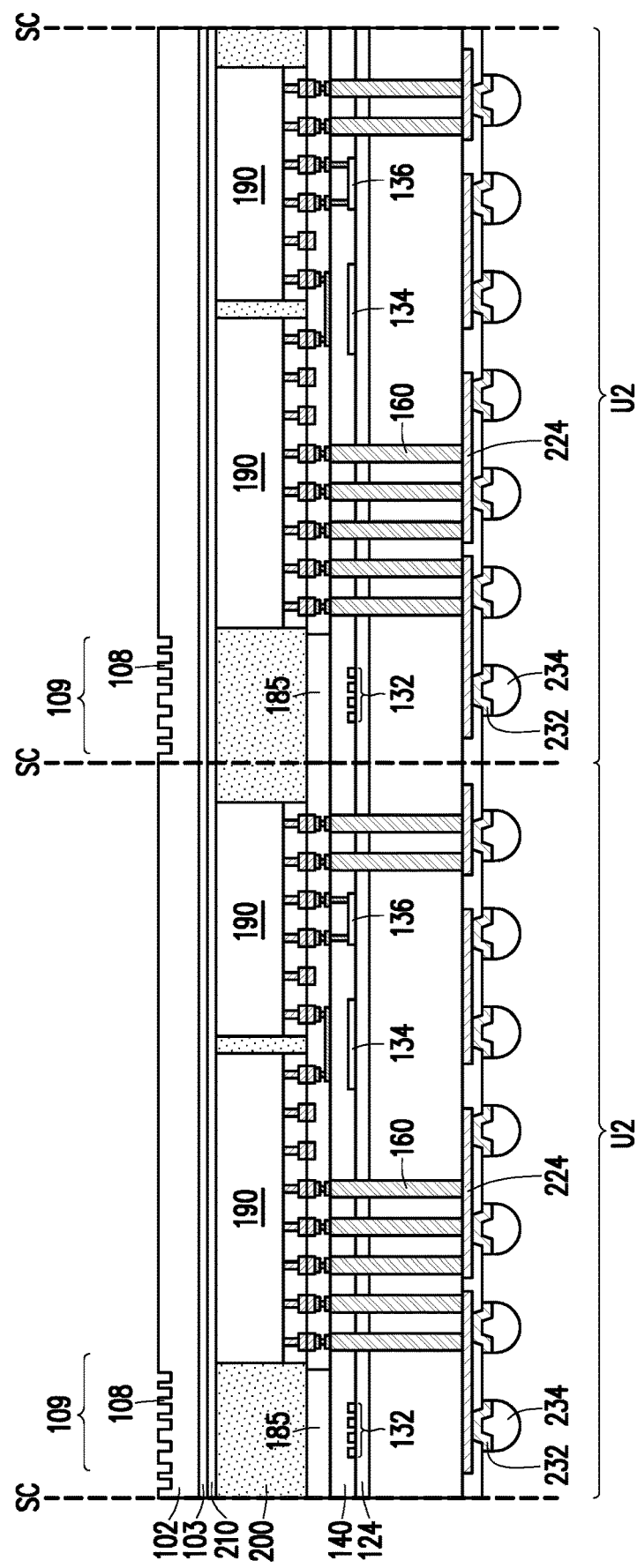
Figure 2N:
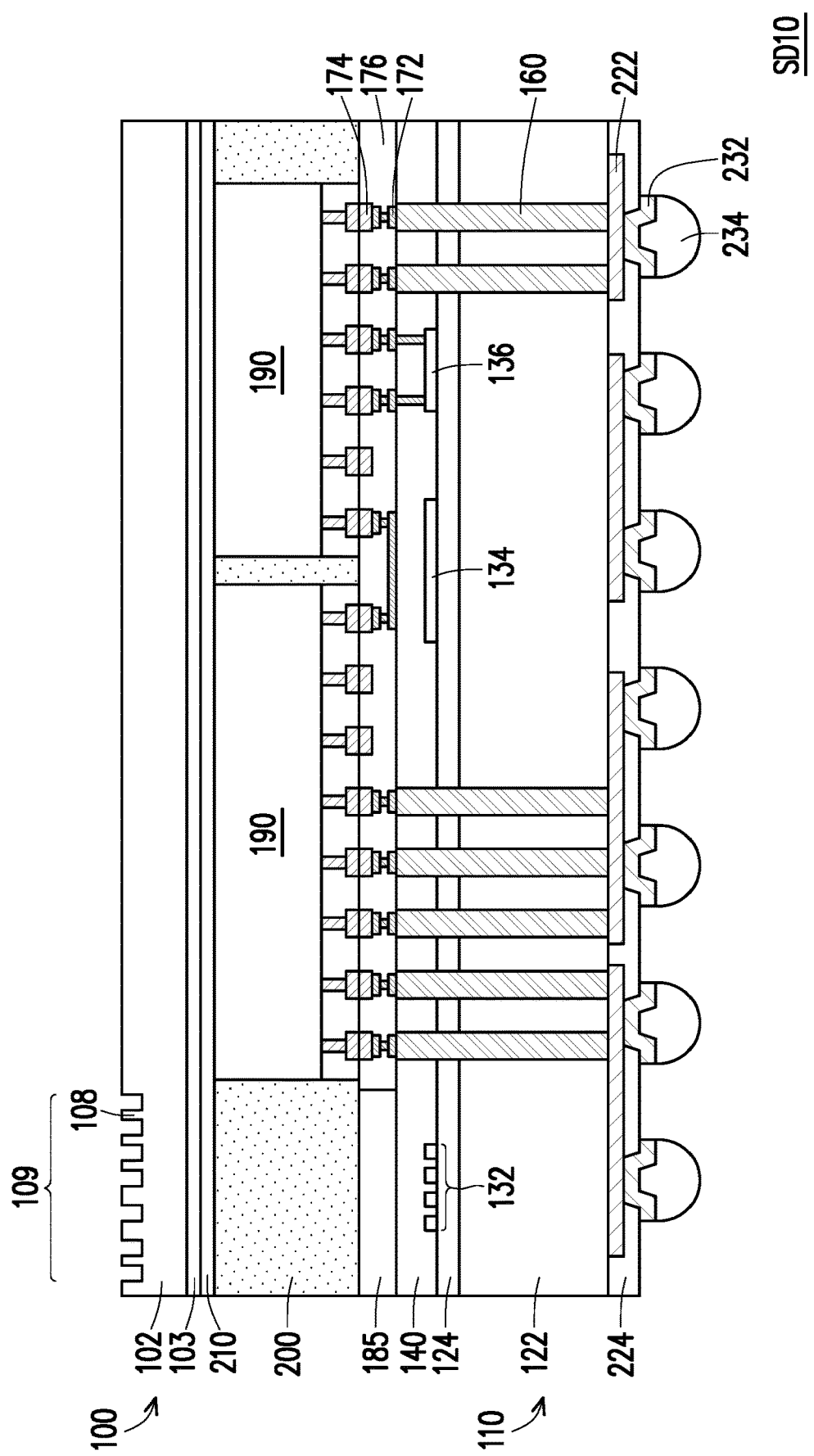
Figure 20:
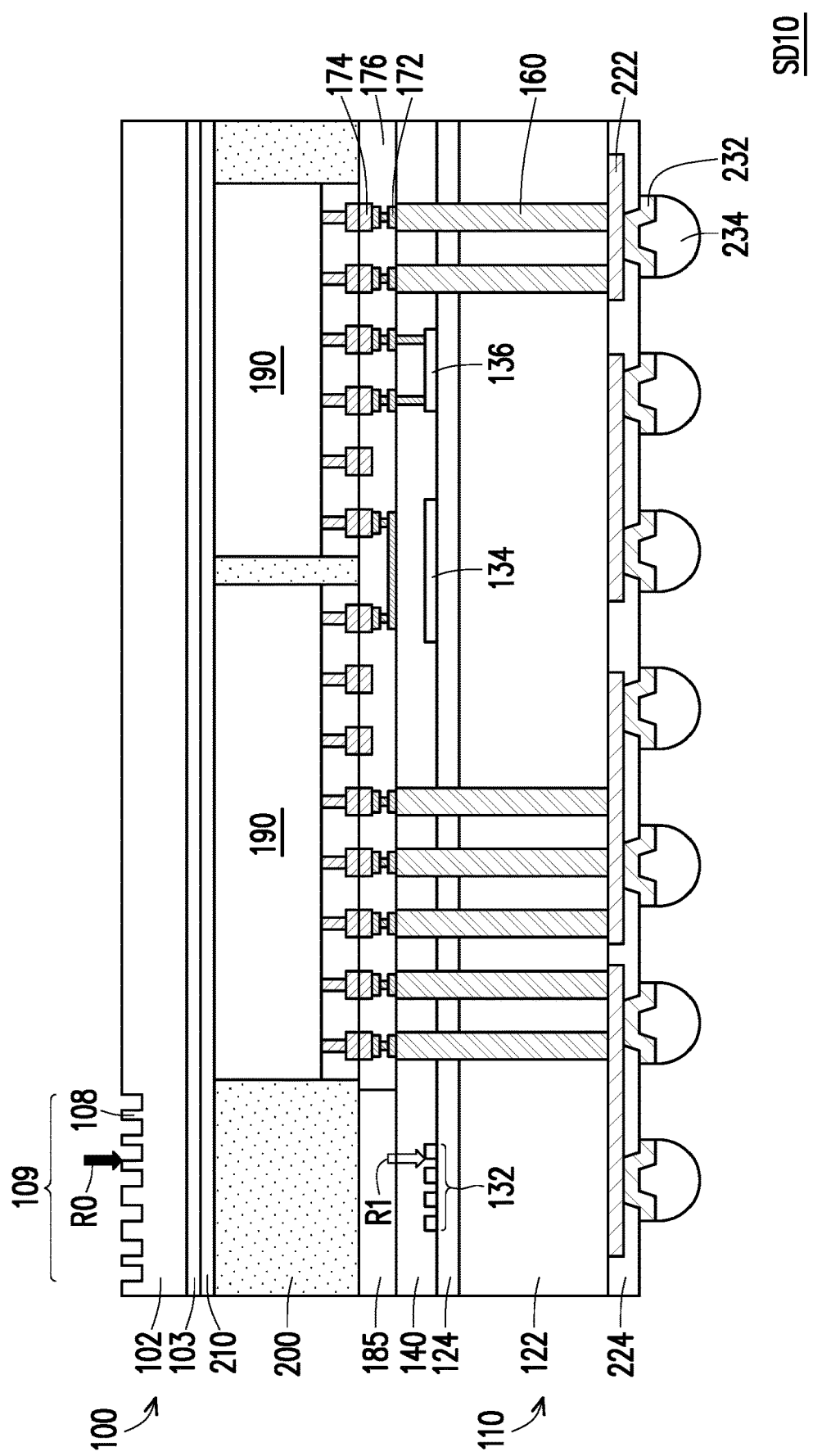

FIG. 2A to FIG. 2N are schematic cross-sectional views illustrating structures formed during a manufacturing process of a semiconductor device SD10 according to some embodiments of the disclosure. In FIG. 2A, a substrate 110 is provided. In some embodiments, the substrate 110 is a semiconductor-on-insulator wafer, including a bulk semiconductor layer 122, an insulator layer 124, and a front semiconductor layer 126 sequentially stacked. In some embodiments, the thickness T122 of the bulk semiconductor layer 122 is larger than the thickness T126 of the front semiconductor layer 126, so as to facilitate handling of the substrate 110. Both thicknesses T122 and T126 are measured along a stacking direction of the layers. The bulk semiconductor layer 122 and the front semiconductor layer 126 independently include one or more semiconductor materials, which may be elemental semiconductor materials, compound semiconductor materials, or semiconductor alloys, as described above for the substrate 102 (illustrated in FIG. 1A). In some embodiments, the bulk semiconductor layer 122 and the front semiconductor layer 126 include the same material.

The insulator layer 124 separates the front semiconductor layer 126 from the bulk semiconductor layer 122. The insulator layer 124 has a first surface 124i in contact with the bulk semiconductor layer 122 and a second surface 124ii opposite to the first surface 124i facing the front semiconductor layer 126. In some embodiments, the second surface 124ii is in contact with the front semiconductor layer 126. In some embodiments, the insulator layer 124 includes dielectric materials. For example, the insulator layer 124 may include an oxide such as silicon oxide, and may be referred to as a buried oxide layer (BOX). In some embodiments, the substrate 110 may be prepared according to any one of a number of suitable approaches. For example, oxygen ions may be implanted in a semiconductor wafer, followed by an annealing step to repair damages which the implantation stage may have caused. Alternatively, a first semiconductor wafer may be bonded to an oxidized surface of a second semiconductor wafer. The first semiconductor wafer may be subsequently thinned to the desired thickness, for example through a sequence of grinding and polishing steps. Alternative processes, for example involving combinations of wafer bonding, splitting, and/or ion implantation are also possible, and are contemplated within the scope of the disclosure.

In some embodiments, the substrate 110 is in wafer form. That is, different regions of the wafer may correspond to different device unit regions U2, so that multiple device unit regions U2 may be simultaneously manufactured from the same wafer. In the drawings, an individual device unit region U2 is shown for illustration purposes, however, multiple device unit regions U2 may be formed in the substrate 110, and processed together with wafer-level technology.

Referring to FIG. 2A and FIG. 2B, the front semiconductor layer 126 is patterned to form several devices, such as at least one grating coupler 132, one or more waveguide patterns 134, and one or more optical devices 136 (e.g. modulators, detectors, multiplexers, demultiplexers, etc.). One or more ion implantation processes may also be performed in one or more regions of the front semiconductor layer 126 to form the optical devices 136. Inactive portions of the front semiconductor layer 126 may also remain on the insulator layer 124, separated from the devices 132, 134, 136.

In FIG. 2C, one or more insulating materials (e.g., oxides) are disposed on the patterned front semiconductor layer 126 to blanketly cover the patterned front semiconductor layer 126. In some embodiments, the grating coupler 132, the waveguide pattern(s) 134, and the optical device(s) 136 are buried underneath the dielectric layer 140. In some embodiments, the dielectric layer 140 includes an oxide such as silicon oxide.

In FIG. 2D, through-semiconductor holes 150 are formed in the bulk semiconductor layer 122, extending through the dielectric layer 140 and the insulator layer 124. In some embodiments, the through-semiconductor holes 150 are blind holes, penetrating in the bulk semiconductor layer 122 for less than its total thickness T122. Through-semiconductor vias (TSVs) 160 are formed in the through-semiconductor holes 150, for example through one or more deposition and/or plating steps. In some embodiments, the TSVs 160 may be formed by filling the through-semiconductor holes 150 with a conductive material, for example including cobalt (Co), tungsten (W), copper (Cu), titanium (Ti), tantalum (Ta), aluminum (Al), zirconium (Zr), hafnium (Hf), a combination thereof, or other suitable metallic materials. In some embodiments, the conductive material may be disposed after forming optional barrier layers, seed layers, liner layers, etc. That is, the TSVs 160 may optionally include one or more barrier layers, seed layers, and/or liner layers, etc. A planarization step may be performed after the through-semiconductor holes 150 are filled with conductive material, so that ends 160a of the TSVs 160 may be substantially coplanar with the top surface of the dielectric layer 140. Opposite ends 160b of the TSVs 160 are buried within the bulk semiconductor layer 122.

In FIG. 2E, an interconnection structure 170 is formed over the dielectric layer 140. In some embodiments, the interconnection structure 170 includes the patterned conductive traces 172 connecting the TSVs 160 and the optical device(s) 136 to the bonding pads 174, and a dielectric layer 176 in which the patterned conductive traces 172 and the bonding pads 174 are embedded. The bonding pads 174 are entrenched in the dielectric layer 176 and exposed at a top surface 176t of the dielectric layer 176. Even though the dielectric layer 176 is shown as a single layer, in practice it may comprise a plurality of stacked dielectric layers. In some embodiments, the patterned conductive traces 172 are arranged in one or more metallization tiers alternately stacked with dielectric layers of the dielectric layer 176. For example, the patterned conductive traces 172 may contact the optical device(s) 136 or the ends 160a of the TSVs 160 exposed by the dielectric layer 140. In some embodiments, patterned conductive traces 172 of different metallization tiers may extend through the dielectric layers 176 and 140 to establish electrical interconnections between the optical devices 136. In some embodiments, the grating coupler 132 is connected to an optical device 136 by at least one waveguide pattern 134, so that light incident on the grating coupler 132 is transmitted to and processed by the optical device 136. The optical device(s) 136 may be configured to generate electric signals upon detection of the electromagnetic radiation received from the grating coupler 132. The interconnection structure 170 may then connect the optical device 136 to other devices (not shown) which have been formed at the same or different level than the grating coupler 132 and the waveguide pattern(s) 134. In some embodiments, the interconnected devices (e.g., the grating coupler 132 and the optical device(s) 136) included in the substrate 110 may be referred to as a photonic integrated circuit (PIC), and the substrate 110 with the interconnection structure 170 may be referred to as a photonic die. In some embodiments, a material of the dielectric layer 176 includes inorganic materials such as oxides, nitrides, carbides, or a combination thereof. For example, the dielectric layer 176 may include silicon oxide, silicon nitride, silicon oxynitride, silicon carbonitride, silicon oxycarbonitride, or a combination thereof. The dielectric layer 176 may be formed by suitable fabrication techniques such as spin-on coating, sputtering (e.g., CVD, ALD, PVD, etc.), or the like. In some embodiments, materials of the patterned conductive traces 172 and the bonding pads 174 independently include cobalt (Co), tungsten (W), copper (Cu), titanium (Ti), tantalum (Ta), aluminum (Al), zirconium (Zr), hafnium (Hf), a combination thereof, or other suitable metallic materials. The patterned conductive traces 172 may be formed by, for example, electroplating, deposition, and/or photolithography and etching. In some embodiments, the interconnection structure 170 is formed by sequential CVD and (dual) damascene processes. In some embodiments, the number of metallization tiers and dielectric layers in the interconnection structure 170 may be adjusted depending on the routing requirements. In some embodiments, the bonding pads 174 may be formed by forming trenches in the dielectric layer 176 exposing the patterned conductive traces 172 at their bottom, and subsequently filling the trenches with conductive materials.

In FIG. 2F, the interconnection structure 170 is patterned to form a recess 180 overlying the grating coupler 132. That is, a portion of the interconnection structure 170 is removed, for example via one or more etching processes, to expose the dielectric layer 140 in an area overlying and around the grating coupler 132. The depth of the recess 180 may be controlled in various manners, for example by adjusting the timing of the etching process, exploiting etching selectivity between the material of the dielectric layer 140 and the dielectric layer 176, or any other suitable method. In some alternative embodiments, the recess 180 may further extend through the dielectric layer 140, to expose the grating coupler 132. Referring to FIG. 2F and FIG. 2G, an insulating material is disposed in the recess 180 to form a filler layer 185. The insulating material of the filler layer 185 is not particularly limited, and may be selected, for example, on the basis of its refractive index and the refractive index of the material of the dielectric layer 140. In some embodiments, the filler layer 185 includes an inorganic material, such as an oxide, a nitride, a carbide, or the like. In some embodiments, the filler layer 185 includes silicon oxide. In some embodiments, the filler layer 185 and the portion of dielectric layer 140 overlying the grating coupler 132 include the same material. In some embodiments, the filler layer 185 and the portion of dielectric layer 140 overlying the grating coupler includes different materials, optionally with matching refractive index to achieve desired optical effects on the incident radiation. In some embodiments, the filler layer 185 is at least as thick as the interconnection structure 170. That is, the filler layer 185 may include a single layer of equal or greater thickness than the combined thickness of the dielectric layers constituting the dielectric layer 176 of the interconnection structure 170. In some embodiments, replacement of the portion of the interconnection structure 170 (and, possibly, part or all of the dielectric layer 140) with the filler layer 185 over the grating coupler 132 may reduce or eliminate the number of optical interfaces encountered by the incident radiation. The insulating material of the filler layer 185 may be formed according to any suitable process, such as sputtering (e.g., CVD, PVD, ALD), or the like. In some embodiments, a planarization process (e.g., grinding, chemical mechanical planarization, a combination thereof, or the like) is performed after the insulating material is disposed in the recess 180. Following planarization, the top surface 185t of the filler layer 185, the top surface 176t of the dielectric layer 176 and the top surfaces 174t of the bonding pads 174 are substantially coplanar (e.g., located at the same level height along the stacking direction of the dielectric layers 140, 176), to provide an appropriate active surface AS1 for hybrid bonding.

In FIG. 2H, one or more semiconductor dies 190 are provided on the active surface AS1. In some embodiments, one or more semiconductor dies 190 may be disposed in a single device unit region U2, according to design requirements. The semiconductor dies 190 may be of the same type or perform the same function, but the disclosure is not limited thereto. In some alternative embodiments, the semiconductor dies 190 disposed in a same device unit region U2 may be different from each other, or perform different functions. Briefly, a semiconductor die 190 may include a semiconductor substrate 192 in which active and/or passive devices are formed, conductive traces 194 interconnecting the active and/or passive devices with each other and with the bonding pads 196, and a dielectric layer 198 in which the conductive traces 194 and the bonding pads 196 are embedded. In some embodiments, top surfaces 196t of the bonding pads 196 and the top surface 198t of the dielectric layer 198 are part of the active surface AS2 of a semiconductor die 190.

In some embodiments, the semiconductor dies 190 are bonded to the dielectric layer 176 and the bonding pads 174, for example through a hybrid bonding process. In some embodiments, the semiconductor dies 190 are picked-and-placed onto the active surface AS1 such that the active surfaces AS2 of the semiconductor dies 190 are in contact with the active surface AS1. Furthermore, the bonding pads 196 of the semiconductor dies 190 are substantially aligned and in direct contact with corresponding bonding pads 174 and the dielectric layers 198 are directly in contact with at least a portion of the dielectric layer 176. In some embodiments, the footprint of a semiconductor die 190 (or the combined footprints of the semiconductor dies 190 of a device unit region U2) is smaller than a span of the device unit region U2. That is, even after placement of the semiconductor dies 190, portions of the dielectric layer 176 within a device unit region U2 may be left exposed. Similarly, the semiconductor dies 190 may leave exposed the filling layer 185 overlying the grating coupler 132. That is, the semiconductor dies 190 may be disposed on the dielectric layer 176 without covering the filled recess 180. In some embodiments, to facilitate the hybrid bonding of the semiconductor dies 190, surface preparation for the surfaces to be bonded (i.e. the active surfaces AS1 and the active surfaces AS2) may be performed. The surface preparation may include surface cleaning and activation, for example.

After cleaning the active surfaces AS1 and AS2, activation of the bonding surfaces of the dielectric layers 198 and 176 may be performed for development of high bonding strength. For example, plasma activation may be performed to treat the top surfaces 176t and 198t of the dielectric layers 176 and 198. After the activated top surfaces 198t and 176t of the dielectric layers 198 and 176 are in contact with each other, a hybrid bonding step is performed. The hybrid bonding step may include a thermal treatment process for dielectric bonding and a thermal annealing process for conductor bonding. In some embodiments, the temperature of the thermal annealing process for conductor bonding is higher than the temperature of the thermal treatment process for dielectric bonding. After performing the thermal annealing process for conductor bonding, the dielectric layer 176 is bonded to the overlying dielectric layers 198, and the bonding pads 196 are bonded to the underlying bonding pads 174. It will be apparent that while hybrid bonding has been described to connect the semiconductor dies 190 to the photonic integrated circuits, alternative connection schemes are also possible, with corresponding adaptations to the bonding interface. For example, the semiconductor dies 190 may be flip-chip bonded to the photonic integrated circuits, with the connection established through C4 bumps, and the structure of the interconnection structure 170 may be adapted accordingly. In some embodiments, the semiconductor dies 190 receive and process the electrical signals generated by the photonic integrated circuits upon detection of incident radiation. In some embodiments, the semiconductor dies 190 may be referred to as electronic dies, and the interconnected devices formed therein may be referred as electronic integrated circuits.

Referring to FIG. 2I, in some embodiments, a filling process is performed to form an encapsulant 200 over the dielectric layer 176 and the filling layer 185 to encapsulate the semiconductor dies 190. In some embodiments, the encapsulant 200 may be formed so as to fill gaps between the semiconductor dies 190 over the dielectric layer 176. In some embodiments, the encapsulant 200 may initially cover the rear surfaces 190r of the semiconductor die 190. In some embodiments, a material of the encapsulant 200 includes inorganic materials such as silicon oxide, silicon nitride, or the like. For example, the encapsulant 200 may include silicon oxide. The material of the encapsulant 200 may be selected taking into account the refractive index of the filler layer 185 and the portion of the dielectric layer 140 over the grating coupler 132. In some embodiments, the encapsulant 200 includes the same material as the filler layer 185 and the dielectric layer 140. In some embodiments, the encapsulant 200 may be formed by suitable processes, such as sputtering (e.g., CVD, PVD, ALD), or the like. In some embodiments, the thickness of the encapsulant 200 is adjusted through one or more planarization processes (e.g., grinding, CMP, or the like) so that the top surface 200t of the encapsulant 200 becomes substantially coplanar with the rear surfaces 190r of the semiconductor dies 190. By doing so, the semiconductor dies 190 are exposed by the encapsulant 200. In some embodiments, portions of the semiconductor dies 190 may also be removed during the planarization process.

In some embodiments, a bonding layer 210 is formed on the encapsulant 200 and the rear surfaces 190r of the semiconductor dies 190. The bonding layer 210 may be blanketly formed over the encapsulant 200 and the semiconductor dies 190, and also extend in an area overlying the grating coupler 132. In some embodiments, a material of the bonding layer 210 may be selected from the same materials listed above for the bonding layer 103 (illustrated, e.g., in FIG. 1D). The bonding layer 210 may be formed by spin-coating, sputtering, or any other suitable process.

In FIG. 2J, the optical wafer of FIG. 1D is bonded to the structure of FIG. 2I. For example, the optical wafer of FIG. 1D is disposed with the bonding layer 103 contacting the bonding layer 210, and an annealing step is performed so that the material of the bonding layers 103 and 210 react together to form Si—Si, Si—O, and/or other suitable bonds. In some embodiments, the optical wafer is disposed with the optical active areas 109 of the individual die unit regions U1 overlying the grating couplers 132 formed in the device unit regions U2. That is, the wafer including the optical dies 100 is disposed so that the optical dies 100 are aligned with corresponding device units U2, and the optical nanostructures 108 vertically overlap with the grating coupler 132. By doing so, the optically active areas 109 may transform (e.g., focus, polarize, filter, etc.) incident radiation before it reaches the grating coupler 132 and is processed by the optical device(s) 136. By selecting the pattern of the optical nanostructures 108, the incident radiation may be conveniently manipulated by the optical die 100 (e.g., a single optical die 100) without having to stack multiple optical components on the path to the grating coupler 132. Therefore, alignment issues from the use of multiple optics may be avoided, the manufacturing process may be simplified, and the product yield may be increased.

In FIG. 2K, the system is overturned and the bulk semiconductor layer 122 is thinned from the opposite side with respect to the insulator layer 124 until the buried ends 160b of the TSVs 160 are exposed. In some embodiments, the substrate 102 of the optical die 100 may have sufficient thickness to allow easy handling and further processing of the reconstructed wafer. In some alternative embodiments, an auxiliary carrier (not shown) may be temporarily bonded on the side of the optical wafer to facilitate handling, if needed. The thinning of the bulk semiconductor layer 122 may involve one or more etching processes, a chemical mechanical planarization process, grinding, or the like.

In FIG. 2L, after the TSVs 160 are exposed, an interconnection structure 220 is formed on the bulk semiconductor layer 122. The interconnection structure 220 includes conductive traces 222 and a dielectric layer 224. In some embodiments, the conductive traces 222 establish electrical contact with one or more of the TSVs 160. For example, some of the conductive traces 222 may interconnect some of the TSVs 160 with each other. In some embodiments, the dielectric layer 224 includes openings exposing portions of the conductive traces 222. The number of dielectric layers 224 and conductive traces 222 may be selected according to routing requirements, and multiple interconnection tiers may be stacked over each other if required. In some embodiments, a material of the dielectric layer 224 includes polyimide, epoxy resin, acrylic resin, phenol resin, benzocyclobutene (BCB), polybenzooxazole (PBO), combinations thereof, or other suitable dielectric materials. The dielectric layer 224 may be formed by suitable fabrication techniques such as spin-on coating, lamination, or the like. In some embodiments, materials of the conductive traces 222 include cobalt (Co), tungsten (W), copper (Cu), titanium (Ti), tantalum (Ta), aluminum (Al), zirconium (Zr), hafnium (Hf), a combination thereof, or other suitable metallic materials.

The conductive traces 222 may be formed by, for example, electroplating, deposition, and/or photolithography and etching.

In some embodiments, under-bump metallurgies 232 may be optionally formed in the openings of the dielectric layer 224, contacting the conductive traces 222 at the bottom of the openings. In some embodiments, the under-bump metallurgies 232 may partially extend on the dielectric layer 224 around the openings. In some embodiments, a material of the under-bump metallurgies 232 includes copper, nickel, tin, palladium, gold, titanium, aluminum, or alloys thereof. In some embodiments, multiple layers of conductive material are stacked over each other to form the under-bump metallurgies 232. In some embodiments, the under-bump metallurgies 232 are formed by a plating process. The plating process is, for example, electroplating, electroless-plating, immersion plating, or the like.

In some embodiments, conductive terminals 234 are formed on the under-bump metallurgies 232 or on the exposed portions of the conductive traces 222 (for example, if formation of the under-bump metallurgies 232 is skipped). In some embodiments, the conductive terminals 234 include solder balls, ball grid array (BGA) connectors, metal pillars, controlled collapse chip connection (C4) bumps, micro bumps, bumps formed via electroless nickel—electroless palladium—immersion gold technique (ENEPIG), a combination thereof (e. g, a metal pillar with a solder ball attached), or the like. Referring to FIG. 2M and FIG. 2N, the wafer including multiple device unit regions U2 is singulated, for example by cutting along cutting lines SC with a laser saw or a mechanical saw, to produce a plurality of semiconductor packages SD10. In the case of wafer-scale devices, cutting may be performed, for example to trim the edges of the wafer-scale device.

In view of the above, the semiconductor device SD10 includes the optical die 100 capable of transforming incident radiation by way of the optically active area 109 before the radiation reaches the grating coupler 132 and is transmitted to the optical device(s) 136. For example, referring to FIG. 2O, in some embodiments incident radiation R0 passes through the optically active area 109 and undergoes an optical transformation (lensing, polarization, filtering, etc.), so that the transformed radiation R1 is actually incident on the grating coupler 132. In some embodiments, the pattern of the optical nanostructures 108 in the optically active area 109 is selected to achieve desired transformation of the incident radiation. In some embodiments, by transforming the incident radiation with the optical nanostructures 108 rather than one or more optics (e.g., lenses, filters, etc.), integration of optical functions can be simplified and the overall thickness of the semiconductor device SD10 can be reduced. In some embodiments, the optical nanostructures 108 may be conveniently formed by etching the optical die 100, possibly avoiding process failures encountered when convex or concave optics (e.g., lenses or the like) have to be formed.

Figure 2P:
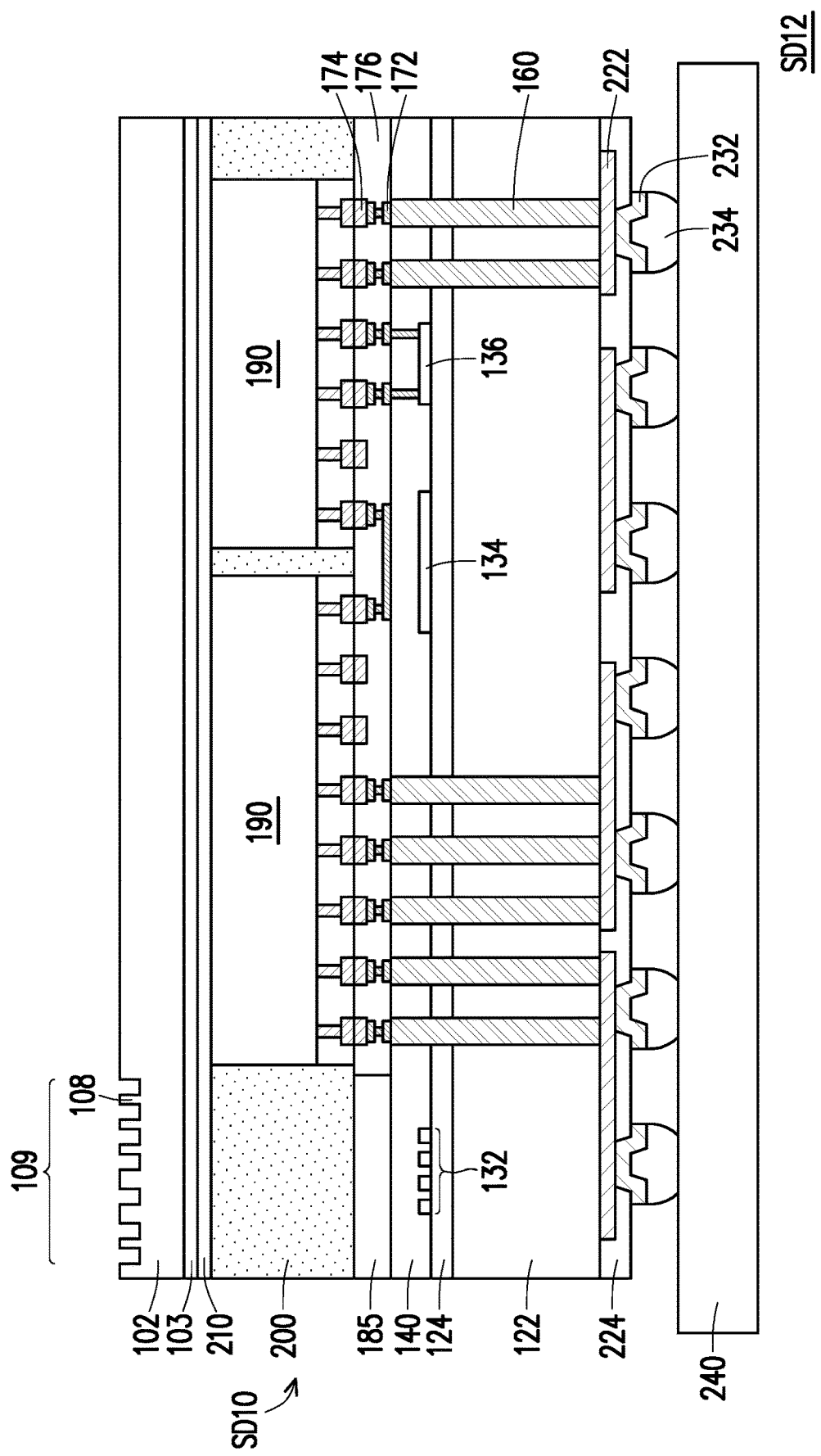

In some embodiments, as illustrated in FIG. 2P, a semiconductor device SD10 may be disposed on a circuit substrate 240 and connected to the circuit substrate 240 through the conductive terminals 234, to be integrated in a larger semiconductor device SD12. In some embodiments, the circuit substrate 240 may be a printed circuit board, or the like.

In the following, several other optical dies and semiconductor devices will be described. Unless otherwise specified, materials and processes described above for the semiconductor device SD10 may be applied to the other optical dies and semiconductor devices of the disclosure.

Figure 3A:
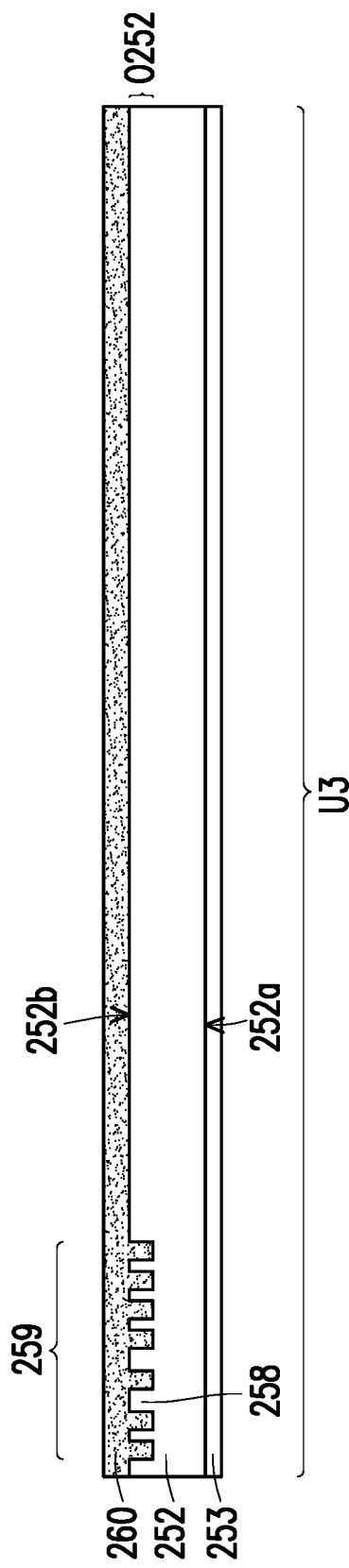
FIG. 3A and FIG. 3B are schematic cross-sectional views illustrating structures formed during a manufacturing process of an optical die according to some embodiments of the disclosure.
Figure 3B:
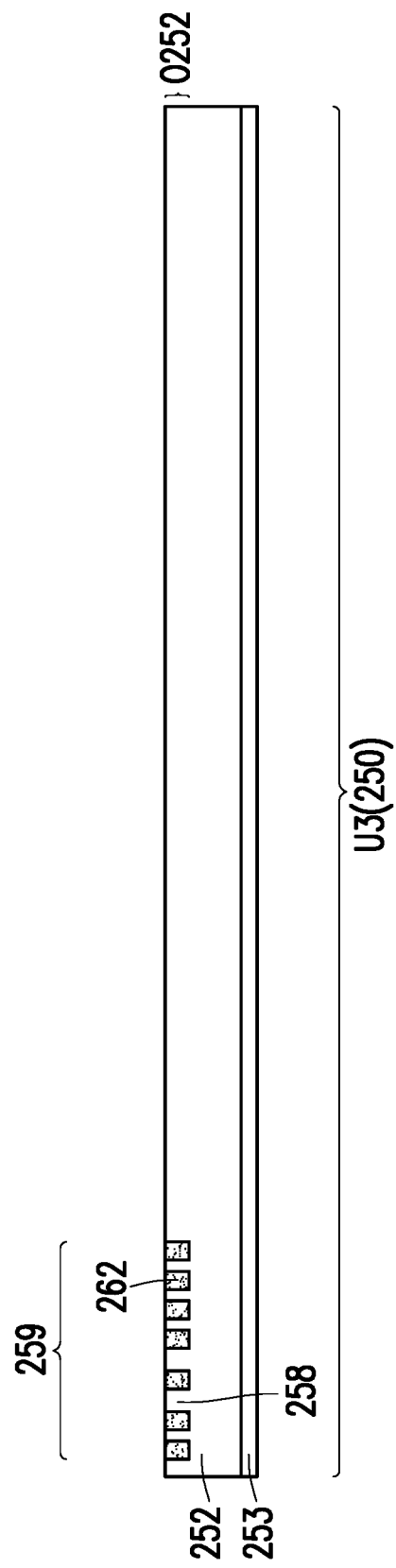

FIG. 3A and FIG. 3B are schematic cross-sectional views illustrating a manufacturing process of an optical die 250 according to some embodiments of the disclosure. In some embodiments, the structure illustrated in FIG. 3A may be obtained following a similar process as previously described with reference to FIG. 1A to FIG. 1D. Briefly, the bonding layer 253 is formed on a side 252a of the substrate 252, and the substrate 252 is patterned at a side 252b opposite with respect to the bonding layer 253 to form the optical nanostructures 258 in the optically active area 259 of the optical layer O252. Then, a filling layer 260 is formed on the side 252b of the substrate where the optical nanostructures 258 are located. The filling layer 260 fills the interstices between the optical nanostructures 258, and may initially blanketly cover the side 252b, extending also outside the optically active area 259. In some embodiments, the filling layer 260 includes a material having a different refractive index with respect to the material of the substrate 252 of which the optical nanostructures 258 are made. In some embodiments, the material of the filling layer 260 is selected so as to tune the effect of the optical nanostructures 258 on the incident radiation. For example, the filling layer 260 may include an inorganic material, such as an oxide (e.g., silicon oxide), a nitride (e.g., silicon nitride), silicon oxynitride, or a combination thereof. In some alternative embodiments, the filling layer 260 includes an organic polymer such as polyimide, or the like. The filling layer 260 may be formed according to any suitable method, such as spin-coating, sputtering, or the like.

In FIG. 3B, a planarization process (e.g., grinding, CMP, or the like) is performed to remove excess material of the filling layer 260 from the substrate 252. For example, the filling layer 260 may be removed until the substrate 252 is exposed again and an optical filler 262 remains in the interstices of the optical nanostructures 258. In some embodiments, the optical filler 262 may be confined within the optically active area 259. At the stage illustrated in FIG. 3B, the optical dies 250 may still be in wafer form, corresponding to different die unit regions U3 of the optical wafer.

Figure 4:
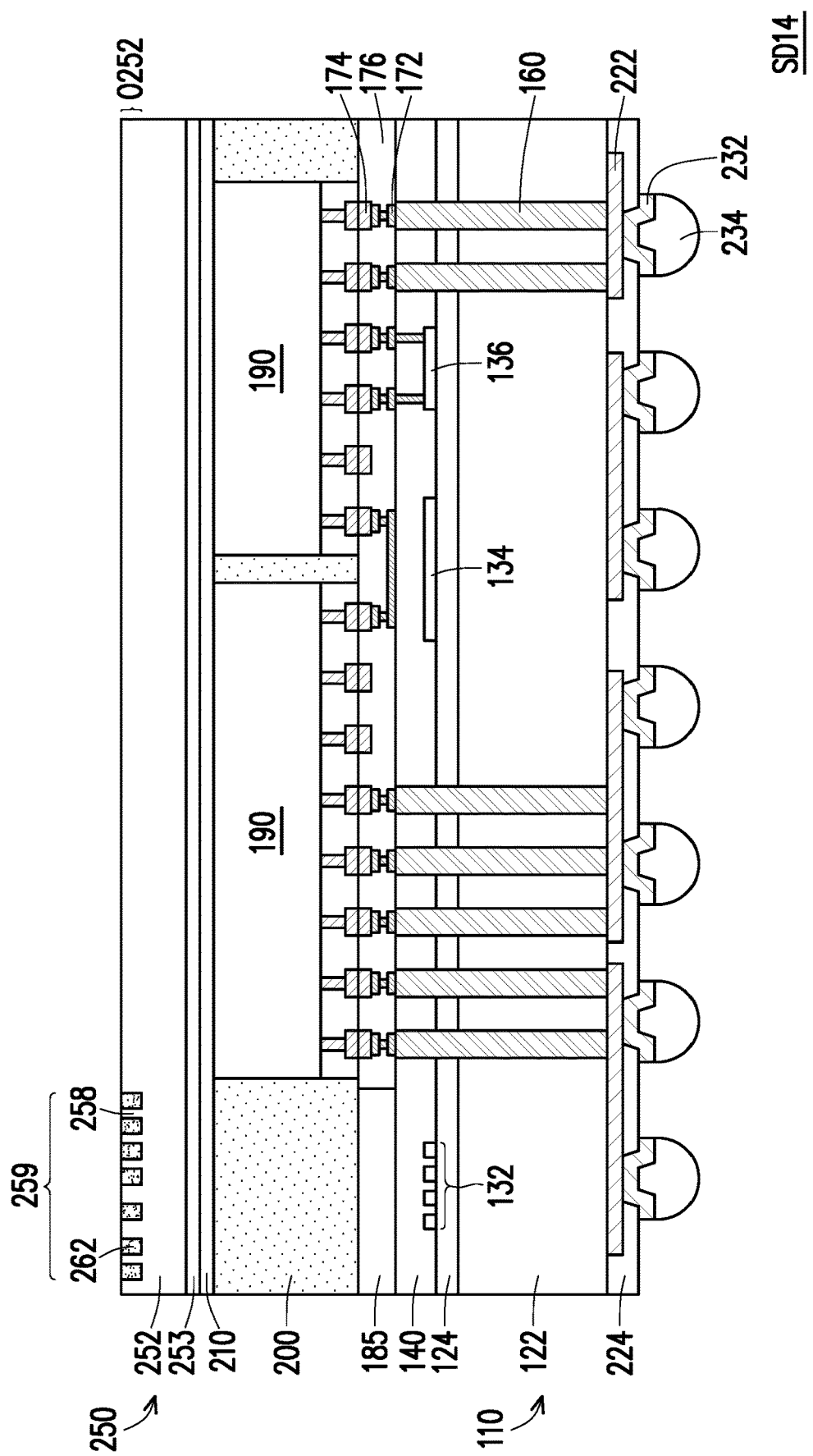
FIG. 4 is a schematic cross-sectional view of a semiconductor device according to some embodiments of the disclosure.

In FIG. 4 is illustrated a cross-sectional view of a semiconductor device SD14 according to some embodiments of the disclosure. The semiconductor device SD14 may be obtained following a similar process as previously described for the semiconductor device SD10 of FIG. 2N. In some embodiments, the optical dies 250 including the optical filler 262 are included in the semiconductor devices SD14 in place of the optical dies 100 of the semiconductor devices SD10. For example, the wafer of FIG. 3B including the optical dies 250 may be bonded to the wafer including the photonic dies 110 and the semiconductor dies 190 (illustrated, e.g., in FIG. 2I), by fusion bonding of the bonding layers 253 and 210. The optical dies 250 are bonded to the photonic dies 110 ensuring overlap between the optically active areas 259 and the grating couplers 132, so that a desired optical transformation may be applied to the incident radiation during usage of the semiconductor device SD14. In some embodiments, by including the optical filler 262, the optical transformation of the incident radiation effected may be further tuned or controlled.

Figure 5A:
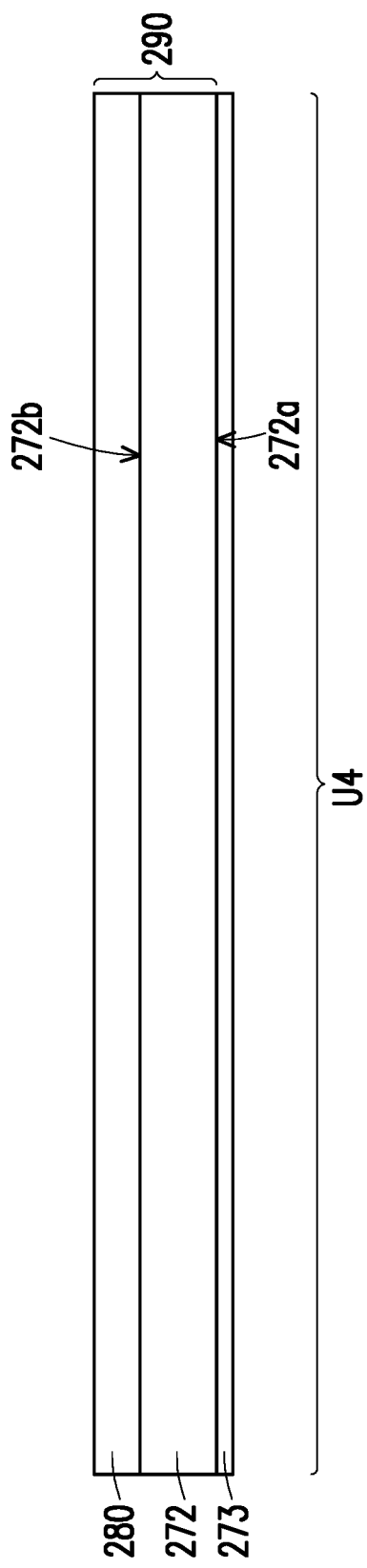
FIG. 5A to FIG. 5C are schematic cross-sectional views illustrating structures formed during a manufacturing process of an optical die according to some embodiments of the disclosure.
Figure 5B:
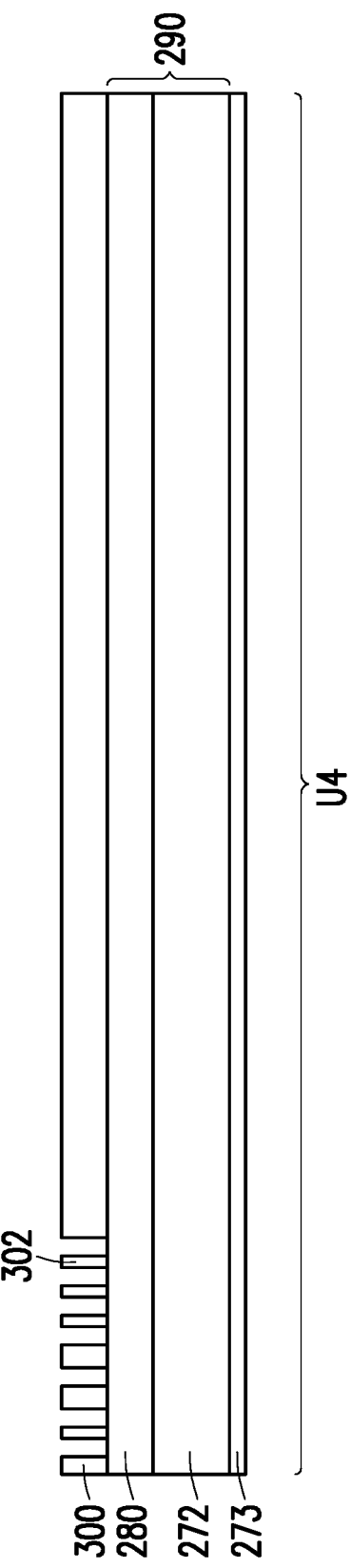
Figure 5C:
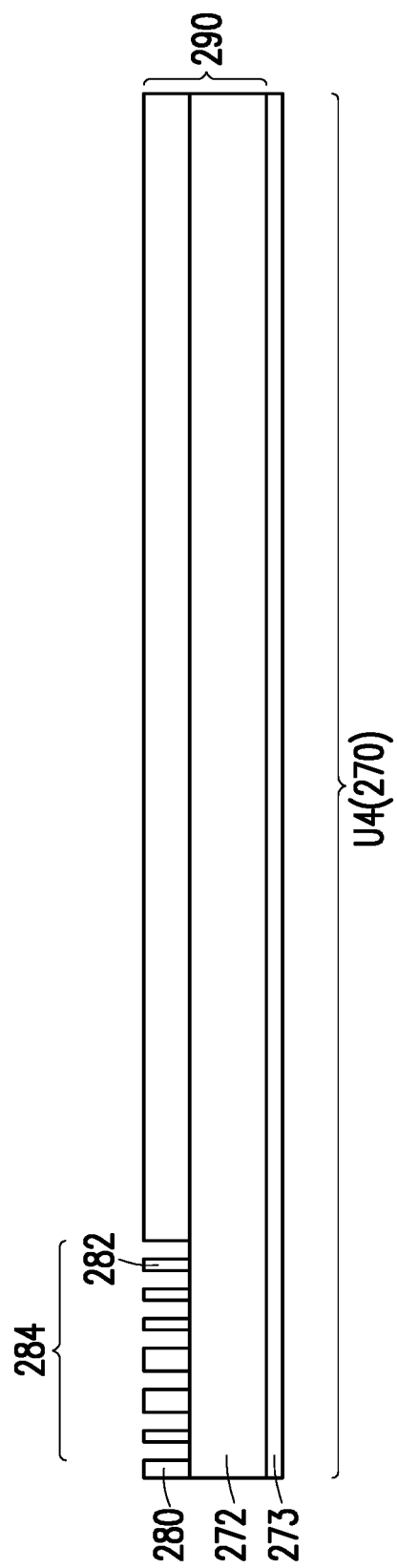

FIG. 5A to FIG. 5C are schematic cross-sectional views illustrating a manufacturing process of an optical die 270 according to some embodiments of the disclosure. In some embodiments, a bulk substrate 272 is provided, similar to the substrate 102 of FIG. 1A. The bonding layer 273 is formed on the side 272a of the bulk substrate 272, and on an opposite side 272b of the bulk substrate 272 is formed the optical layer 280. In some embodiments, the material of the optical layer 280 and of the bulk substrate 272 may be independently selected from the options listed above for the substrate 102 of FIG. 1A. In some embodiments, the material of the optical layer 280 is different from the material of the bulk substrate 272, for example to facilitate patterning of the optical layer 280 or to tune the optical properties of the optical dies 270. That is, the substrate of the optical dies 270 may be a composite substrate 290, including the bulk substrate 272 (e.g., a bulk substrate layer) and an optical layer 280 of different materials. In some embodiments, the material of the optical layer 280 may be easier to pattern than the material of the bulk substrate 272, or may have a sufficiently different refractive index to form an optical interface with the bulk substrate 272, so as to manipulate incident radiation in a desired manner.

In FIG. 5B, a pattered mask 300 is provided on the optical layer 280, employing similar materials and methods as previously described for the patterned mask 104 of FIG. 1B. In some embodiments, the patterned mask 300 is patterned to form a plurality of patterning microstructures 302. The patterning microstructures 302 may be formed in a selected region of the patterned mask 300, and portions of the optical layer 280 are exposed by gaps existing in between adjacent patterning microstructures 302.

Referring to FIG. 5B and FIG. 5C, the pattern of the patterning microstructures 302 is transferred to the optical layer 280. For example, one or more etching steps may be performed to remove exposed portions of the optical layer 280 in between the patterning microstructures 302. The etching may be any acceptable etch process, such as wet or dry etching, a reactive ion etch (RIE), neutral beam etch (NBE), the like, or a combination thereof. The etching may be anisotropic. In some embodiments, the etch is performed so that optical nanostructures 282 are formed from the optical layer 280 in an optically active area 284. For example, the optical nanostructures 282 may be obtained by forming a plurality of through holes in the optical layer 280, so that the bulk substrate 272 is exposed in between adjacent optical nanostructures 282. The shapes and positions of the optical nanostructures 282 may be selected according to the desired optical transformation, as previously described for the optical nanostructures 108 of FIG. 1D. After patterning of the optical layer 280, the patterned mask 300 is removed, for example via stripping or ashing. At the stage illustrated in FIG. 5C, the optical dies 270 may still be in wafer form, corresponding to different die unit regions U4 of the optical wafer.

Figure 6:
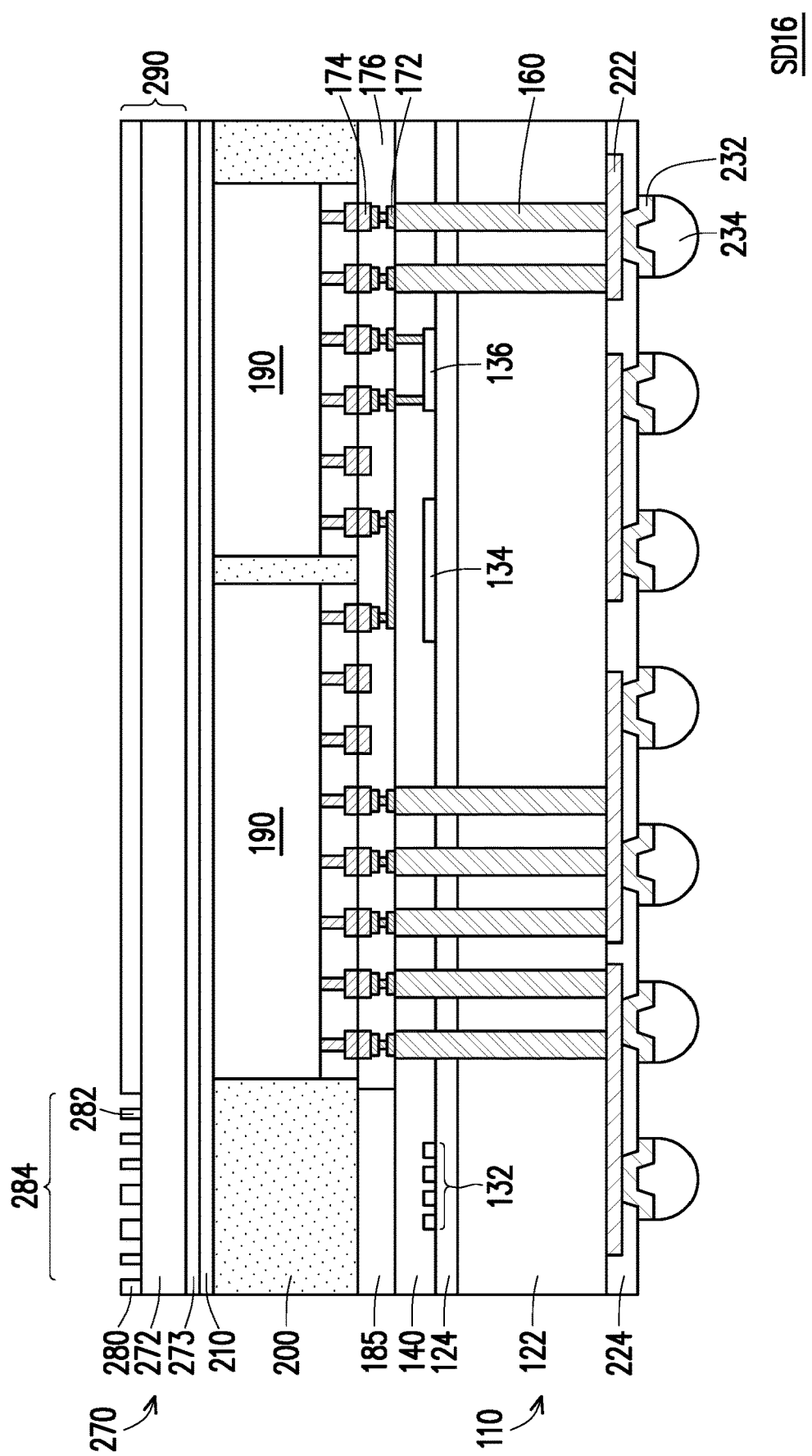
FIG. 6 is a schematic cross-sectional view of a semiconductor device according to some embodiments of the disclosure.

In FIG. 6 is illustrated a cross-sectional view of a semiconductor device SD16 according to some embodiments of the disclosure. The semiconductor device SD16 may be obtained following a similar process as previously described for the semiconductor device SD10 of FIG. 2N. In some embodiments, the optical dies 270 having the composite substrate 290 are included in the semiconductor devices SD16 in place of the optical dies 100 of the semiconductor devices SD10. For example, the wafer including the optical dies 270 may be bonded to the wafer (illustrated, e.g., in FIG. 2I) including the photonic dies 110 and the semiconductor dies 190, by fusion bonding of the bonding layers 273 and 210. The optical dies 270 are bonded to the photonic dies 110 ensuring overlap between the optically active areas 284 and the grating couplers 132, so that a desired optical transformation may be applied to the incident radiation during usage of the semiconductor device SD16. In some embodiments, by including the composite substrate 290, the optical nanostructures 282 may be easily formed, and/or the optical transformation of the incident radiation may be further tuned or controlled.

Figure 7:
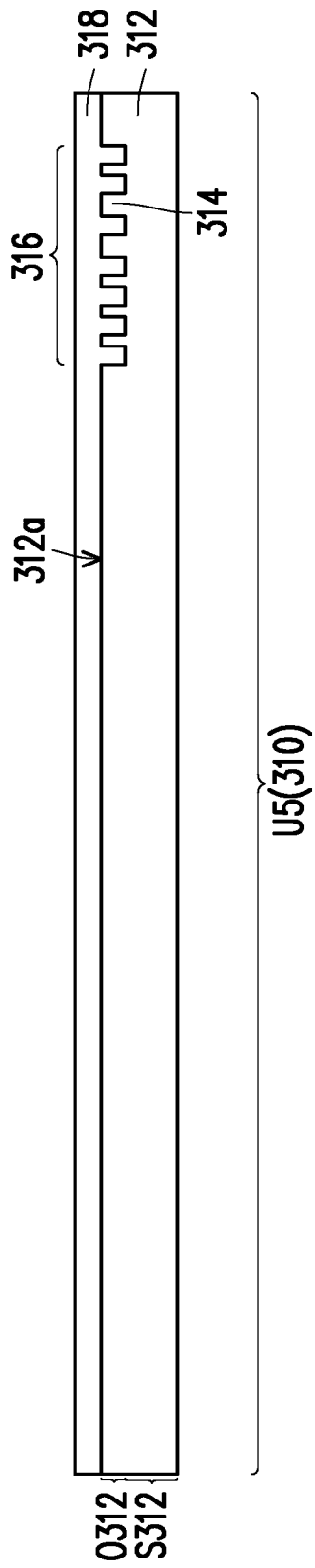
FIG. 7 is a schematic cross-sectional view illustrating a structure formed during a manufacturing process of an optical die according to some embodiments of the disclosure.

FIG. 7 is a schematic cross-sectional view of an optical die 310 according to some embodiments of the disclosure. In some embodiment, the optical die 310 includes the substrate 312. The substrate 312 has an optical layer O312 protruding from a bulk substrate layer S312, as previously described for the substrate 102 of FIG. 1D. In the optical layer O312, the optical nanostructures 314 are formed in the optically active area 316. In some embodiments, the bonding layer 318 is formed on the same side 312a of the optical layer O312, extending on the optical layer O312 and in between the optical nanostructures 314. That is, the bonding layer 318 may also act as optical filler, similar to what was previously described for the optical filler 262 of FIG. 4. In some embodiments, the optical dies 310 may be manufactured in wafer form, corresponding to different die unit regions U5 of the optical wafer.

Figure 8A:
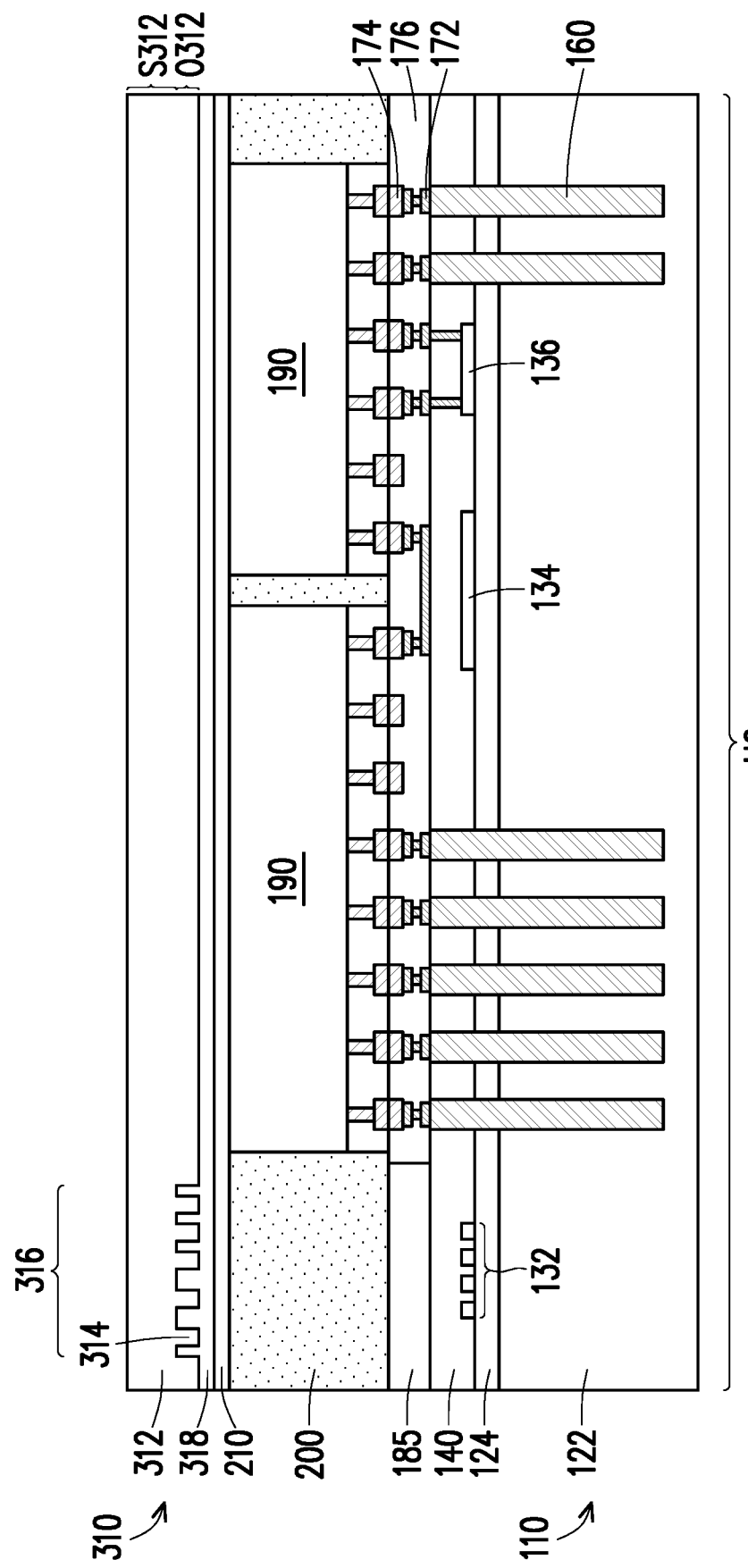
FIG. 8A to FIG. 8C are schematic cross-sectional views illustrating structures formed during a manufacturing process of a semiconductor device according to some embodiments of the disclosure.
Figure 8B:
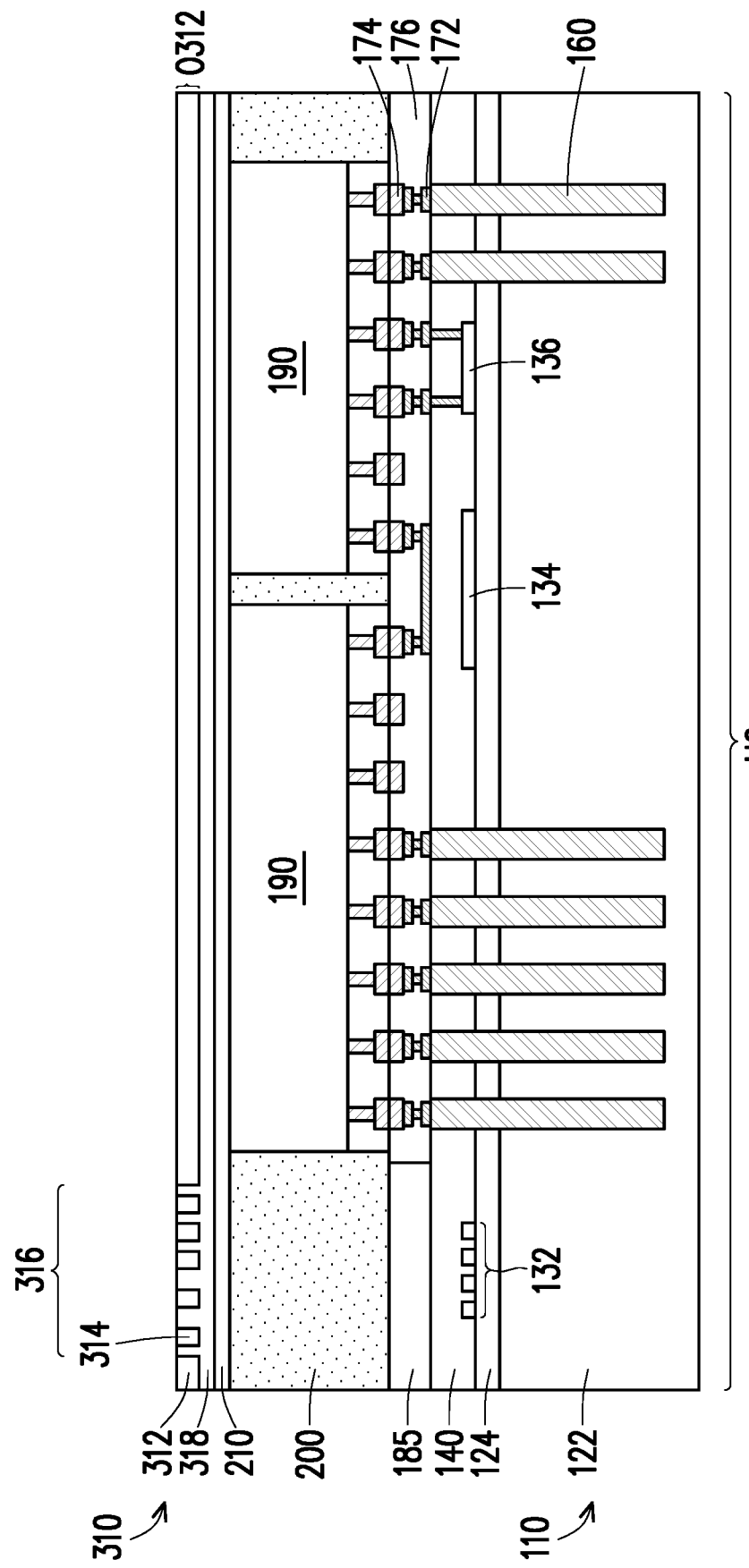
Figure 8C:
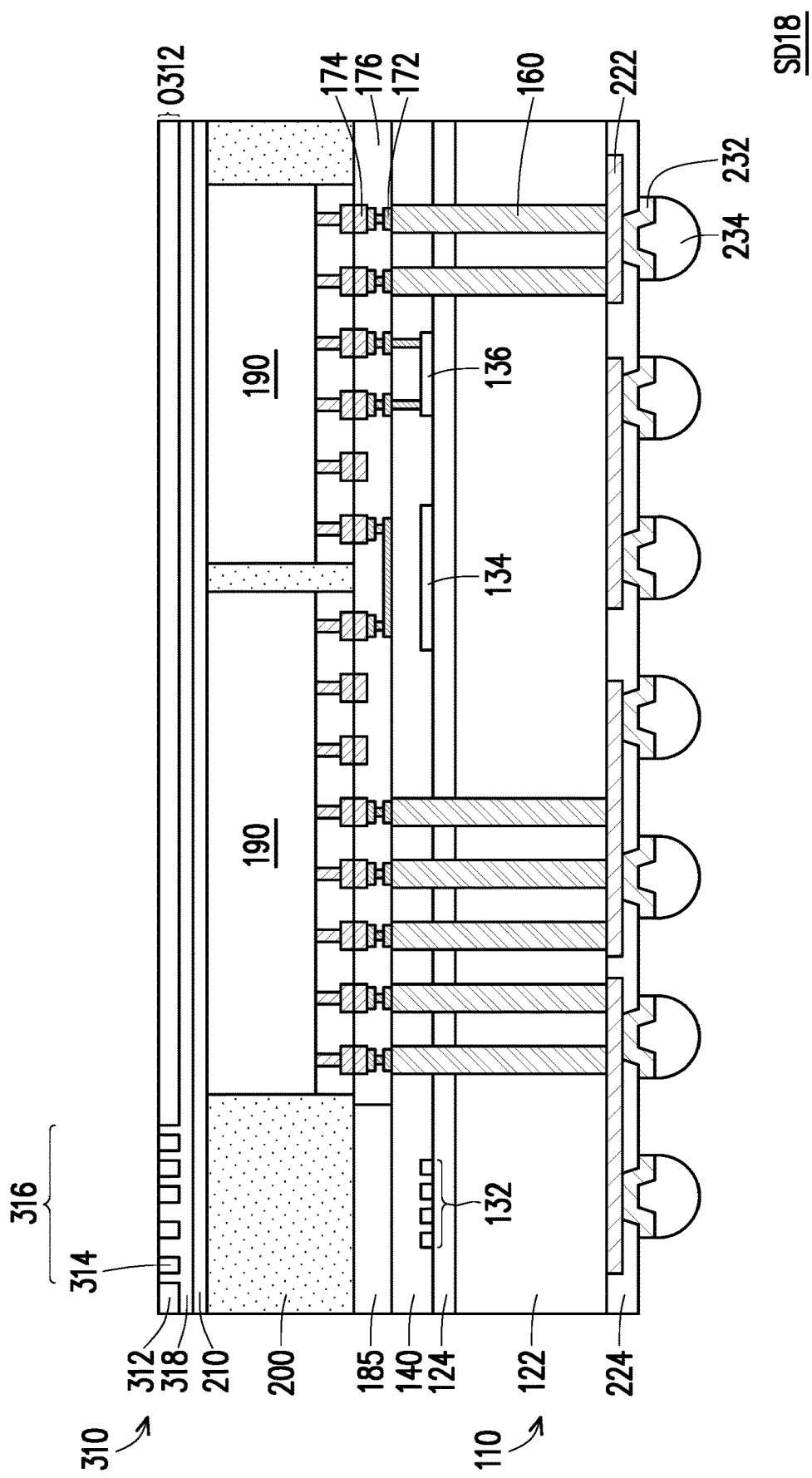

In FIG. 8A, the wafer including the optical dies 310 is bonded to the wafer including the photonic dies 110 and the semiconductor (electronic) dies 190, by fusion bonding of the bonding layers 318 and 210. The optical dies 310 are disposed on the corresponding device unit regions U6 with the optical nanostructures 314 closer to the bonding layer 210. That is, in the structure of FIG. 8A, the optical layer O312 is interposed between the photonic die 110 and the bulk substrate layer S312 of the optical die 310. Referring to FIG. 8A and FIG. 8B, in some embodiments the optical dies 310 are thinned by removing partially or completely the bulk substrate layer S312, for example via grinding, CMP, or similar processes. In some embodiments, the optical dies 310 are thinned until the portions of bonding layer 318 disposed between the optical nanostructures 314 are exposed. In some embodiments, the semiconductor device SD18 of FIG. 8C may be obtained after thinning of the optical dies 310, for example through similar process steps as previously described with reference to FIG. 2K to FIG. 2N. In some embodiments, removal of the bulk substrate layer S312 may further reduce the thickness of the semiconductor devices SD18.

Figure 9A:
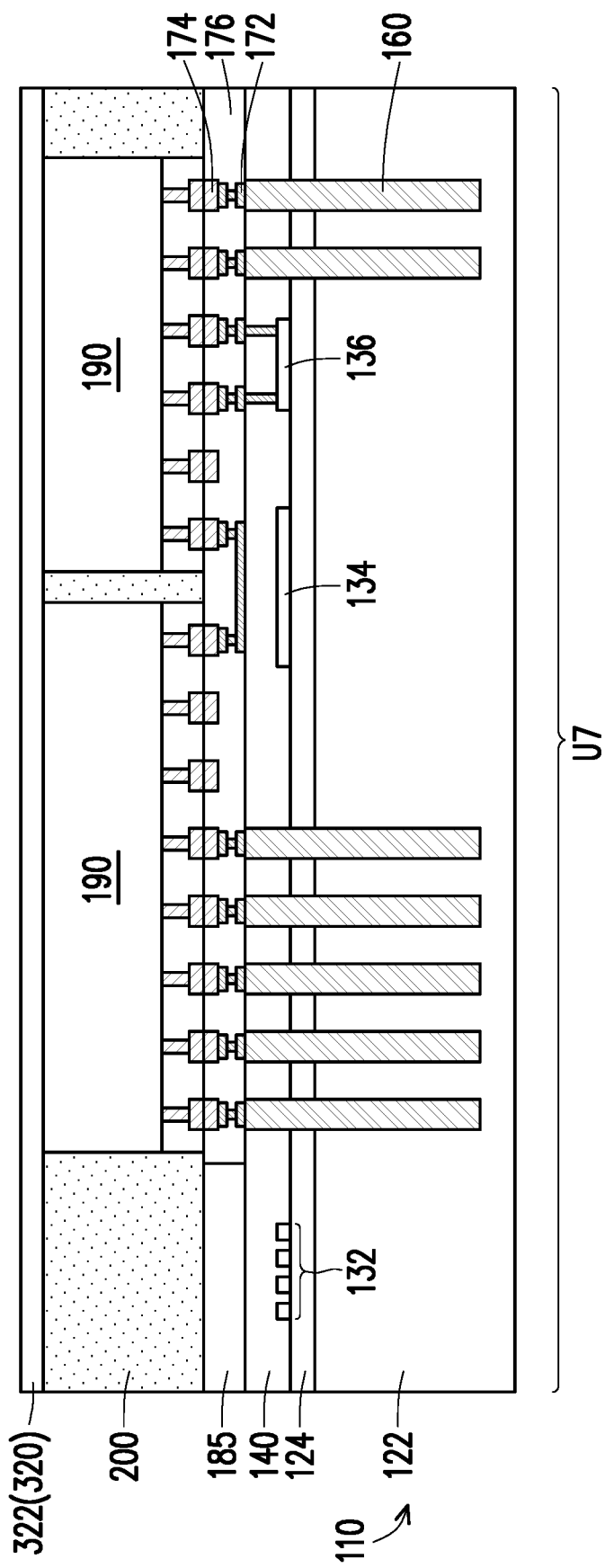
FIG. 9A to FIG. 9C are schematic cross-sectional views illustrating structures formed during a manufacturing process of a semiconductor device according to some embodiments of the disclosure.
Figure 9B:
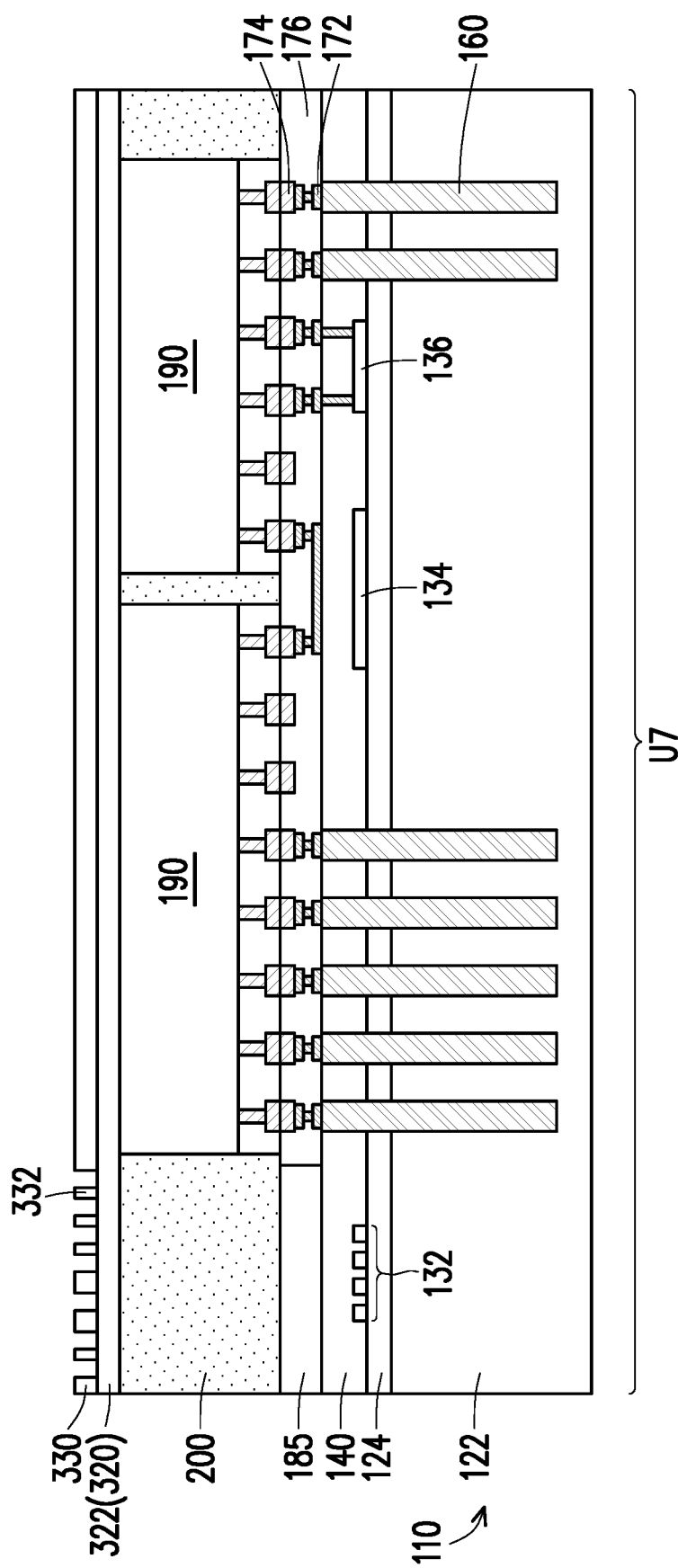
Figure 9C:
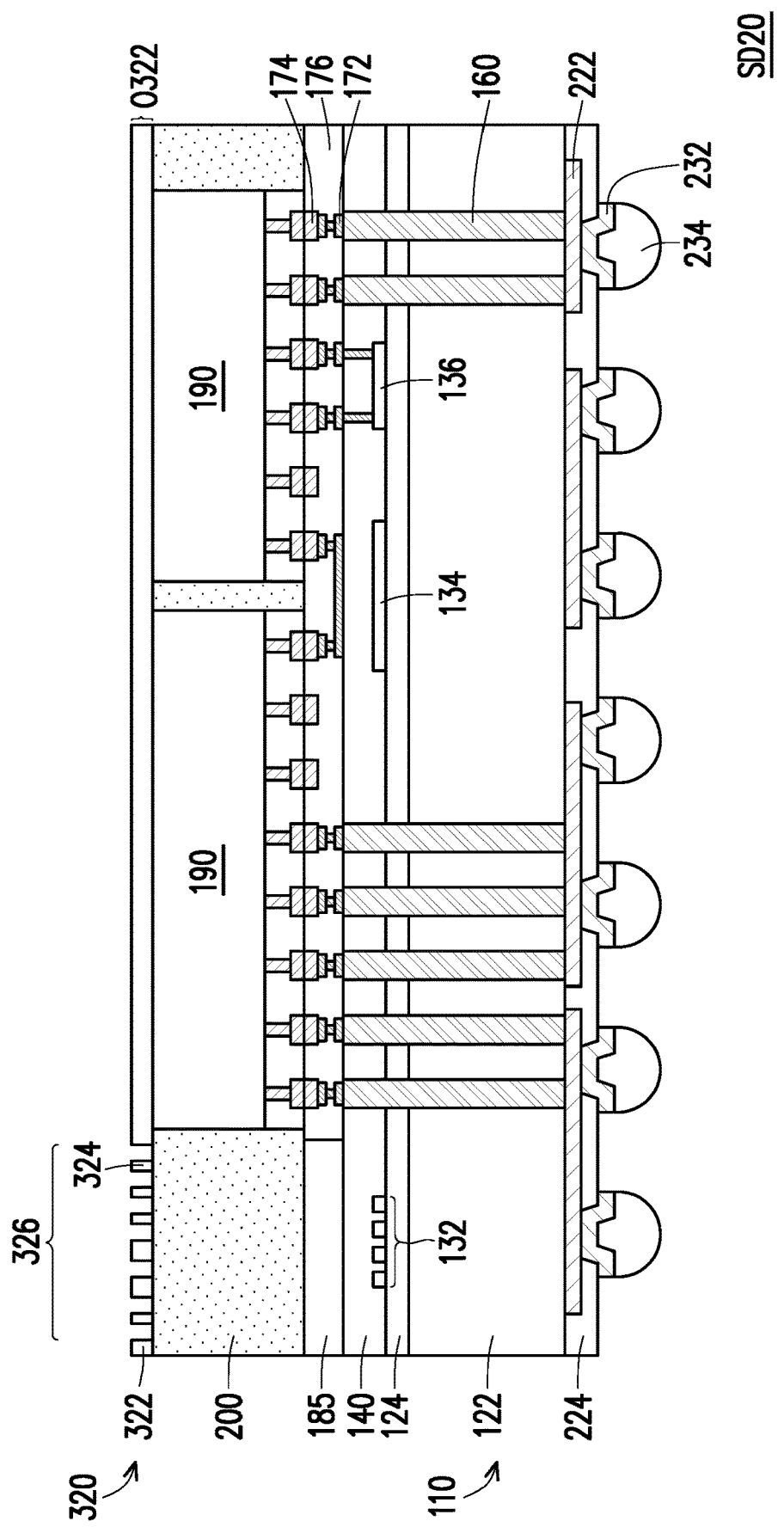

FIG. 9A to FIG. 9C are schematic cross-sectional views of structures produced during a manufacturing method of a semiconductor device SD20 according to some embodiments of the disclosure. In some embodiments, the structure illustrated in FIG. 9A may be obtained following a similar process as previously described with reference to FIG. 2A to FIG. 2I, omitting the formation of the bonding layer 210 illustrated in FIG. 2I. Rather, the material of the substrate 322 of the optical die 320 is directly deposited or grown (e.g., epitaxial growth) on the encapsulant 200 and the rear surfaces 190r of the semiconductor dies 190. In some embodiments, the substrate 322 is formed so as to blankety cover the device unit regions U7. The material of the substrate 322 is not particularly limited, and may be selected, for example, as previously described for the material of the substrate 102 of FIG. 1A.

In FIG. 9B, a pattered mask 330 is provided on the substrate 322, employing similar materials and methods as previously described for the patterned mask 104 of FIG. 1B. In some embodiments, the patterned mask 330 is patterned to form a plurality of patterning microstructures 332. The patterning microstructures 332 are formed in a region of the patterned mask 330 overlying the grating coupler 132. Portions of the substrate 322 are exposed by gaps existing in between adjacent patterning microstructures 332. Referring to FIG. 9B and FIG. 9C, the pattern of the patterning microstructures 332 is transferred to the substrate 322, thus forming the optical layer O322. For example, one or more etching steps may be performed to remove exposed portions of the substrate 322 in between the patterning microstructures 332. The etching may be any acceptable etch process, such as wet or dry etching, a reactive ion etch (RIE), neutral beam etch (NBE), the like, or a combination thereof. The etching may be anisotropic. In some embodiments, the etch is performed so that optical nanostructures 324 are formed from the substrate 322 in an optically active area 326 overlapping the grating coupler 132. For example, the optical nanostructures 324 may be obtained by forming a plurality of through holes in the substrate 322, so that the encapsulant 200 is exposed in between adjacent optical nanostructures 324. In such cases, the thickness of the optical layer O322 coincides with the thickness of the originally grown substrate 322, however, the disclosure is not limited thereto. In some alternative embodiments, the thickness of the optical layer O322 may be only a portion of the thickness of the substrate 322. The shapes and patterns of the optical nanostructures 324 may be selected according to the desired optical transformation, as previously described for the optical nanostructures 108 of FIG. 1D. After patterning of the optical layer O322, the patterned mask 330 is removed, for example via stripping or ashing. In some embodiments, the semiconductor device SD20 of FIG. 9C may be obtained after removal of the patterned mask 330, for example through similar process steps as previously described with reference to FIG. 2K to FIG. 2N. In some embodiments, by forming the optical dies 320 directly on the encapsulated semiconductor dies 190, the optical dies 320 may be integrated without additional fusion bonding steps or requiring formation of bonding layers such as the bonding layers 210 and 103 of FIG. 2N. Therefore, the manufacturing process may be simplified and, possibly, the thermal load of the manufacturing process may be reduced. In some embodiments, the semiconductor devices SD20 may also be of reduced thickness, as the optical dies 320 may include only the optical layer O322, without a bulk substrate layer (such as the bulk substrate layer S102 of FIG. 1D).

Figure 10C:
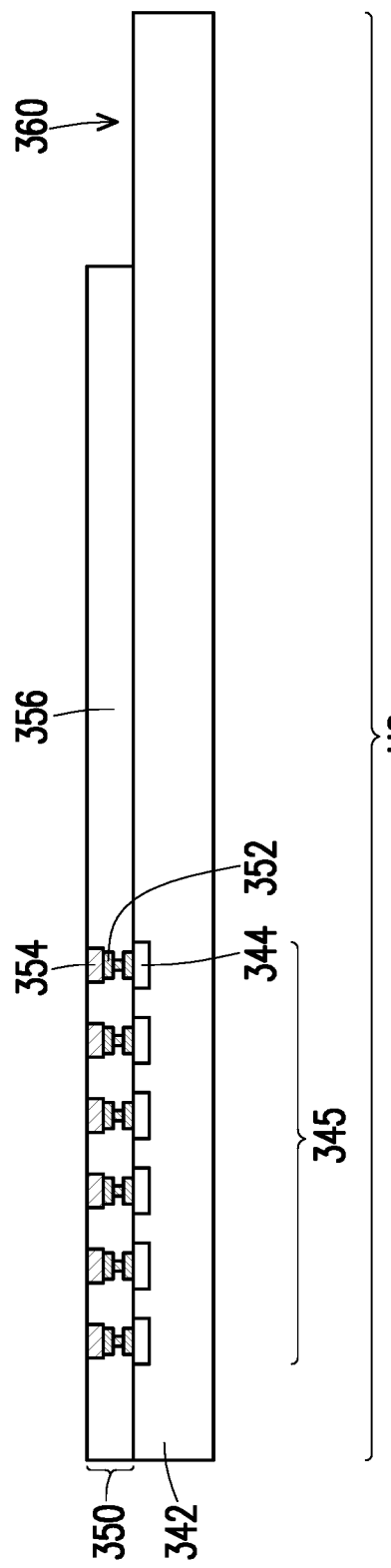

FIG. 10A to FIG. 10E are schematic cross-sectional views of structures formed during manufacturing of optical dies 340 according to some embodiments of the disclosure. In FIG. 10A is illustrated a substrate 342. The substrate 342 may be formed from similar materials as listed above for the substrate 102 of FIG. 1A. In some embodiments, the substrate 342 includes a semiconductor material, and has devices 344 formed on at least one side 342a. The devices 344 may be active devices (e.g., transistors, diodes, etc.) or passive devices (e.g., capacitors, resistors, inductors, etc.) and may be formed according to any suitable process. In some embodiments, the devices 344 are formed in a device region 345 of the substrate 342 within each die unit region U8, while another region of the substrate 342 adjacent to the device region 345 may be free of devices.

In FIG. 10B, an interconnection structure 350 is formed on the side of 342a of the substrate 342 where the devices 344 are formed. The interconnection structure 350 includes the patterned conductive traces 352 interconnecting the devices 344 to each other and to the bonding pads 354 formed at an outer side of the interconnection structure 350, and the dielectric layer 356 in which the patterned conductive traces 352 and the bonding pads 354 are embedded. Materials and processes to form the interconnection structure 350 may be similar to the ones previously described for the interconnection structure 170.

Figure 10D:
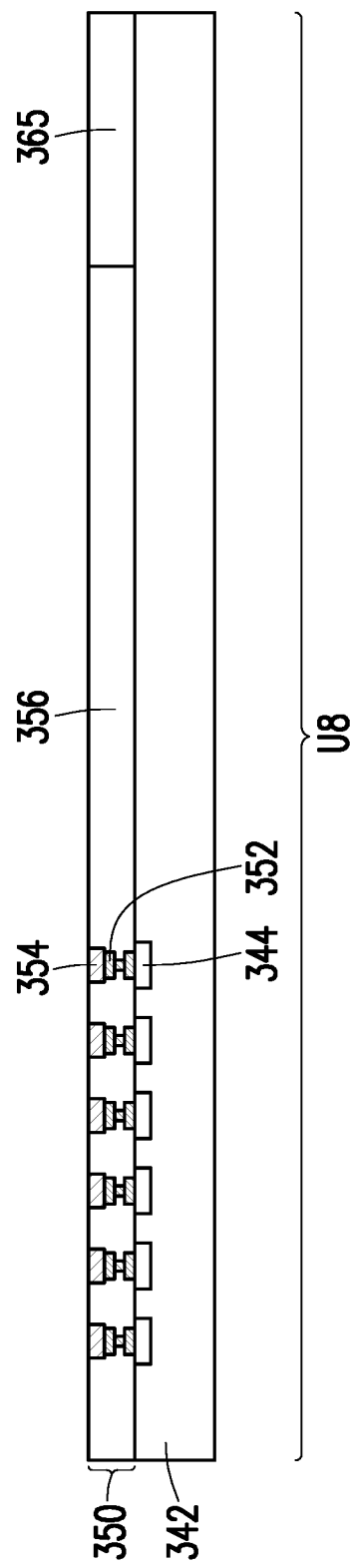

In FIG. 10C, the interconnection structure 350 is patterned to form a recess 360 exposing a region of the substrate 342 beside the device region 345. For example, the region exposed by the recess 360 may be free of devices 344. Referring to FIG. 10C and FIG. 10D, a filler layer 365 is formed on the substrate 342 in the recess 360, for example to reduce the number of optical interfaces encountered by radiation travelling through the interconnection structure 350. The filler layer 365 may be formed with similar materials and processes as previously described for the filler layer 185 of FIG. 2G.

Figure 10E:
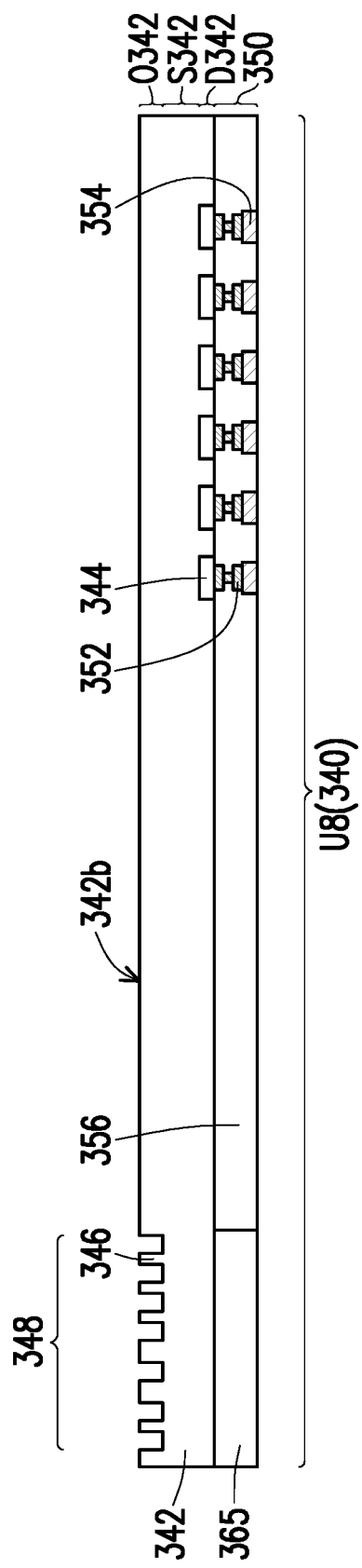

In FIG. 10E, a side 342b of the substrate 342 opposite with respect to the interconnection structure 350 is patterned to form optical nanostructures 346, following similar processes as previously described with reference to FIG. 1B to FIG. 1D. In the optical dies 340, the optically active areas 348 in which the optical nanostructures 346 are formed correspond to regions of the substrate 342 overlying the filler layers 365. As such, in some embodiments the optical dies 340 include a device layer D342 in which the devices 344 are formed and an optical layer O342 in which the optical nanostructures 346 are formed, and the device layer D342 and the optical layer O342 are disposed at opposite sides of the bulk substrate layer S342. At the stage illustrated in FIG. 10E, the optical dies 340 may still be in wafer form, corresponding to different die unit regions U8 of the optical wafer. It should be noted that while in FIG. 10A to FIG. 10E the optical nanostructures 346 were formed after the devices 344 and the interconnection structure 350, the disclosure is not limited thereto, and the order of the process steps may be swapped according to production requirements.

FIG. 11A to FIG. 11F are schematic cross-sectional views illustrating structures formed during a manufacturing process of a semiconductor device SD22 according to some embodiments of the disclosure. The structure illustrated in FIG. 11A may be formed following a similar process as previously described with reference to FIG. 2A to FIG. 2H. In some embodiments, after the semiconductor dies 190 are bonded to the photonic dies 110, some of the bonding pads 174 are left exposed. For example, fewer semiconductor dies 190 may be bonded within a device unit region U9, so that connection of further components to the interconnection structure 170 may be possible.

Figure 11A:
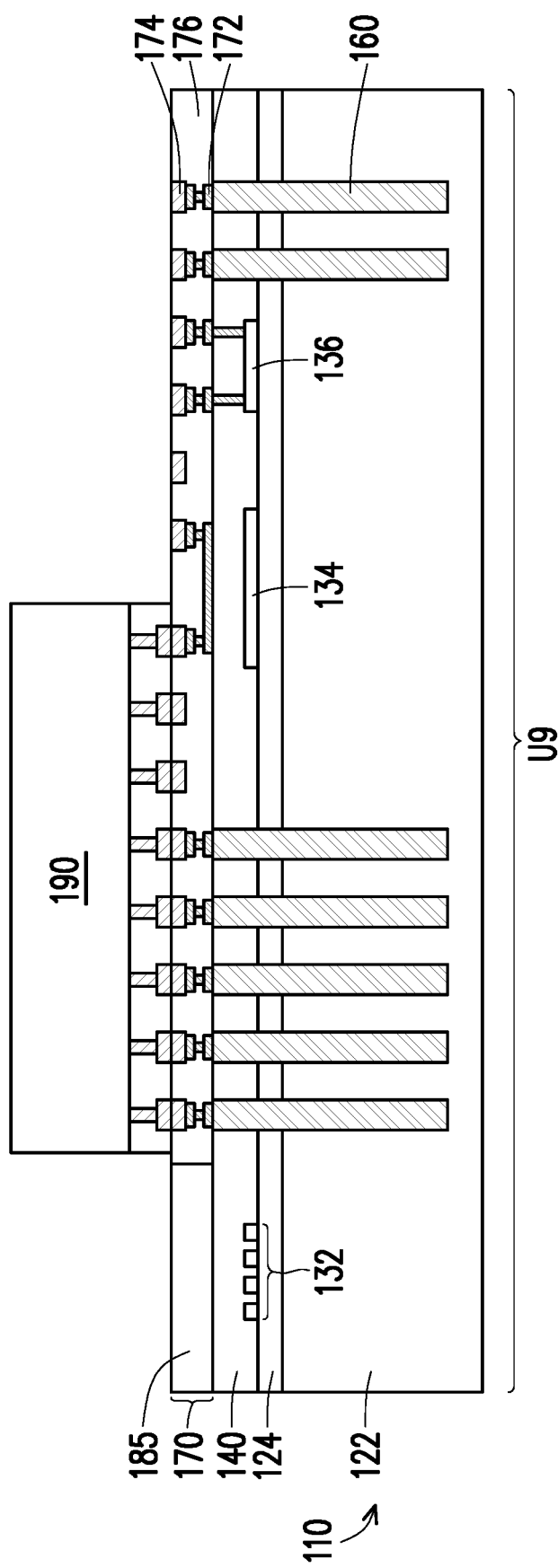
FIG. 11A to FIG. 11F are schematic cross-sectional views illustrating structures formed during a manufacturing process of a semiconductor device according to some embodiments of the disclosure.
Figure 11B:
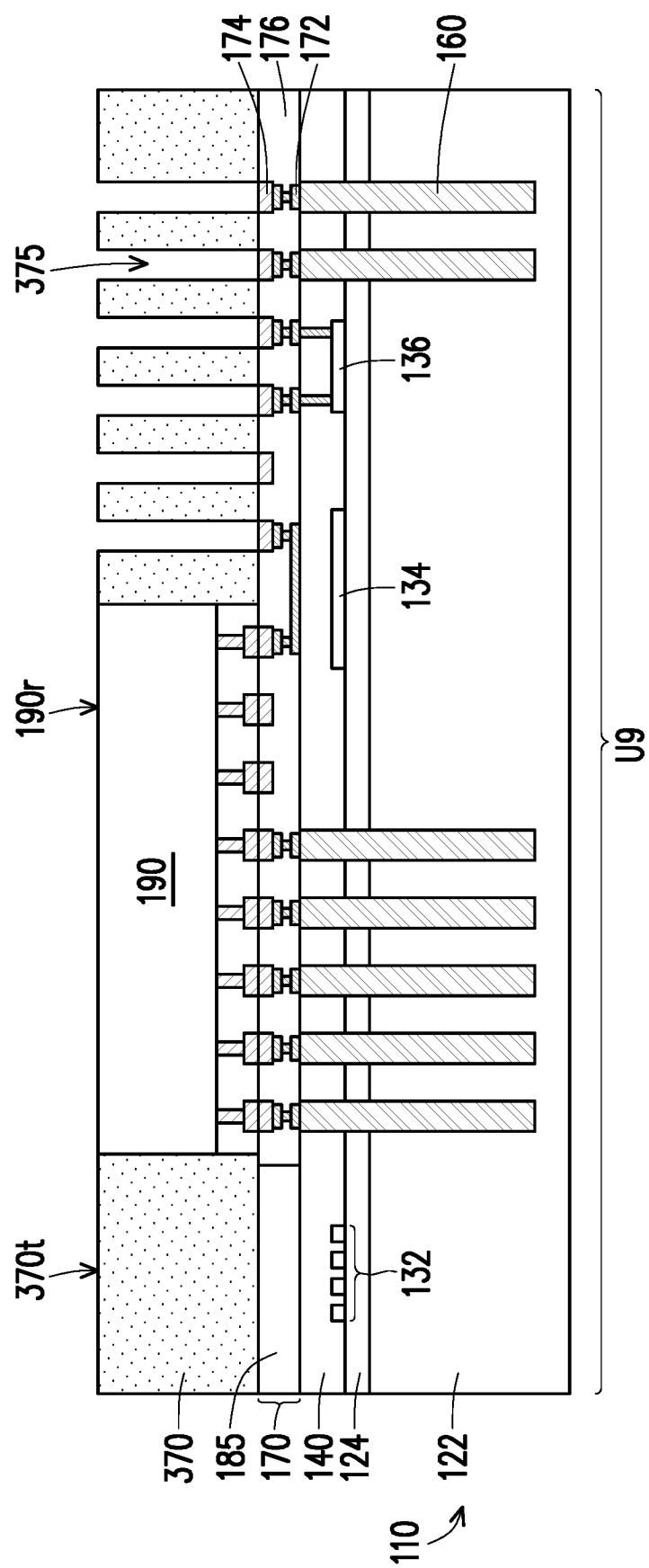
Figure 11C:
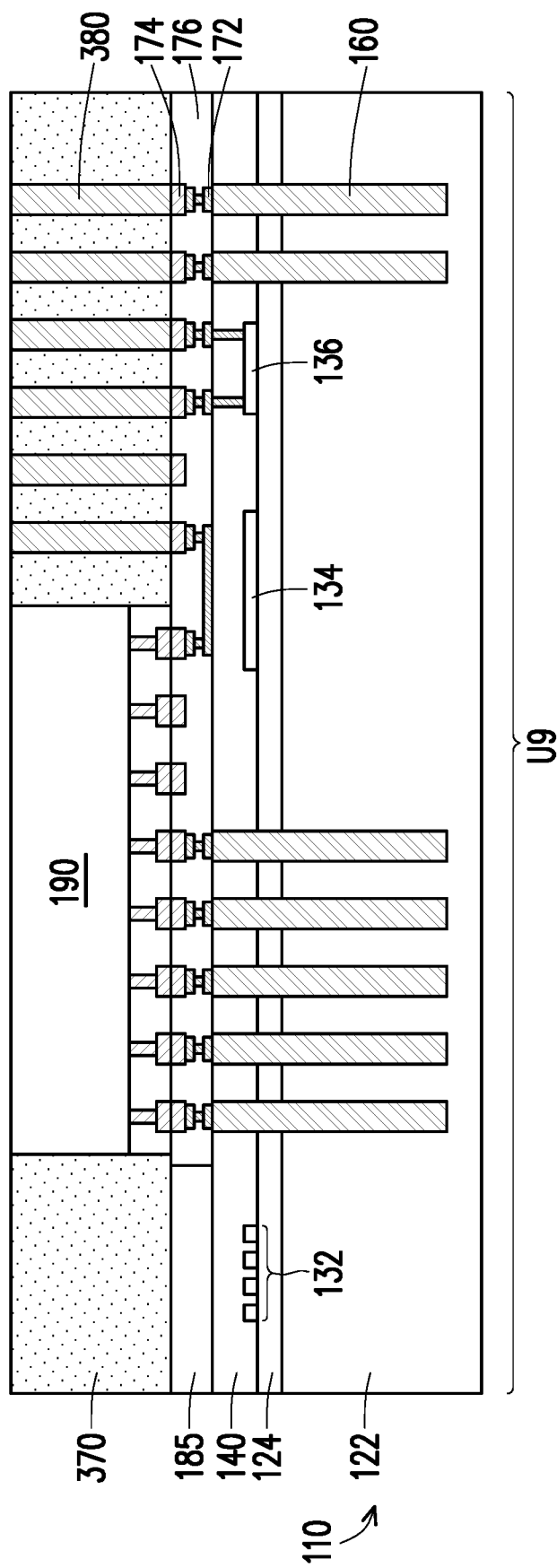

In FIG. 11B, the encapsulant 370 is formed over the interconnection structure 170 and the filler layer 185, with similar materials and processes as previously described for the encapsulant 200. The encapsulant 370 may be formed through a sequence of deposition and planarization steps, so as to laterally wrap the semiconductor dies 190. Rear surfaces 190r of the semiconductor dies 190 may be at the same level height as the top surface 370t of the encapsulant 370. The encapsulant 370 may initially cover the bonding pads 174 left exposed after bonding of the semiconductor dies 190. In some embodiments, through holes 375 are formed extending for the entire thickness of the encapsulant 370 to expose the bonding pads 174 at their bottom, for example via one or more etching step. One or more auxiliary masks (not shown) may be employed to define the regions of the encapsulant 370 to be patterned. Referring to FIG. 11B and FIG. 11C, the through holes 375 are filled with conductive material to form through insulator vias (TIVs) 380, providing electrical connection to the optical device(s) 136 and the TSVs 160 of the photonic dies 110 via the bonding pads 174. The conductive material of the TIVs 380 may be a metallic material, for example including cobalt (Co), tungsten (W), copper (Cu), titanium (Ti), tantalum (Ta), aluminum (Al), zirconium (Zr), hafnium (Hf), a combination thereof. In some embodiments, seed layers, barrier layers, or the like may be optionally formed before filling the through holes 375 with the conductive material. In some embodiments, the conductive material of the TIVs 380 may be provided via plating and/or other suitable deposition processes.

Figure 11D:
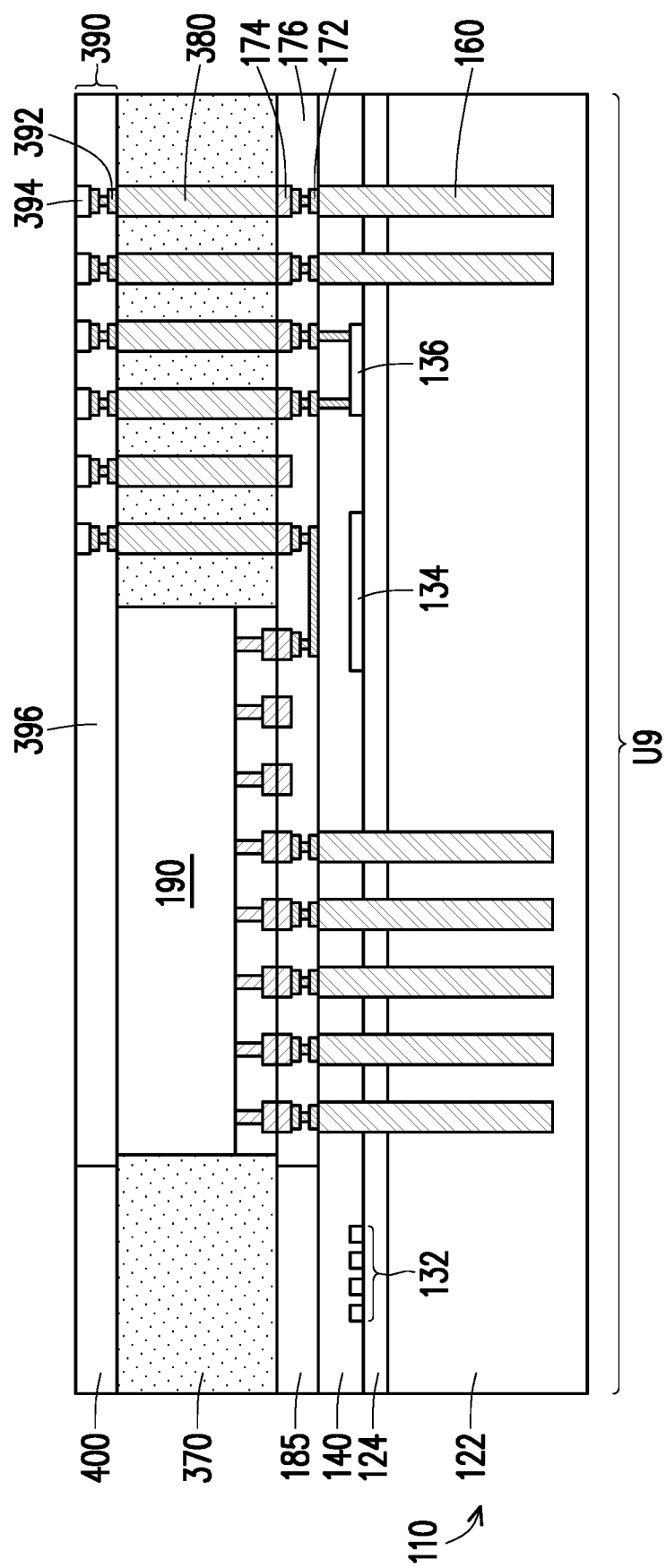

In FIG. 11D, an interconnection structure 390 is formed on the encapsulated semiconductor die 190 and the TIVs 380, with similar materials and processes as previously described for the interconnection structure 170. The interconnection structure 390 includes the patterned conductive traces 392, the bonding pads 394 and the dielectric layer 396 in which the patterned conductive traces 392 and the bonding pads 394 are embedded. The patterned conducive traces 392 establish electrical connection between the TIVs 380 and the bonding pads 394. A portion of the interconnection structure 390 overlying the grating coupler 132 is removed to form the filler layer 400, with similar material and processes as previously described for the filler layer 185.

Figure 11E:
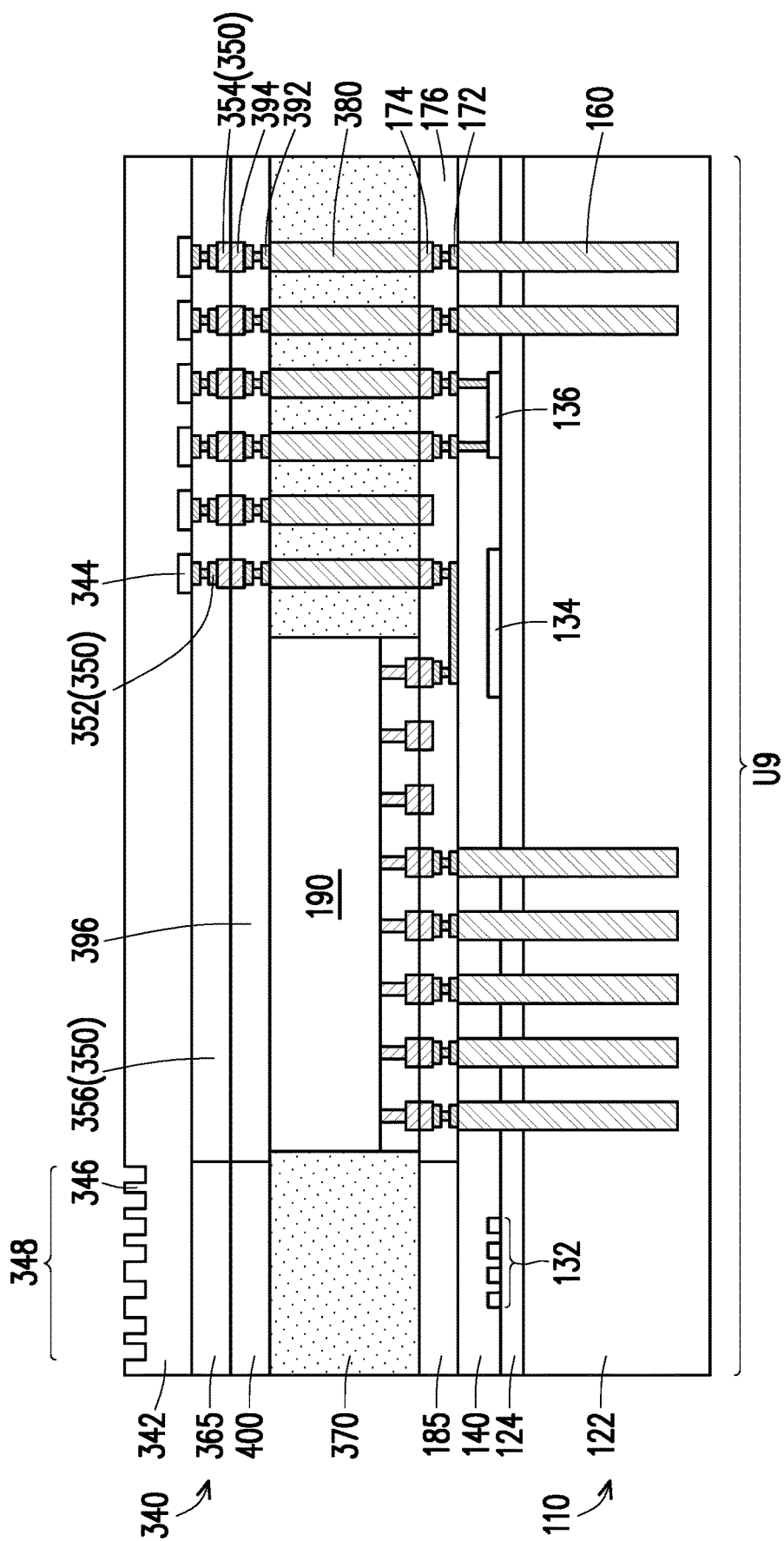
Figure 11F:
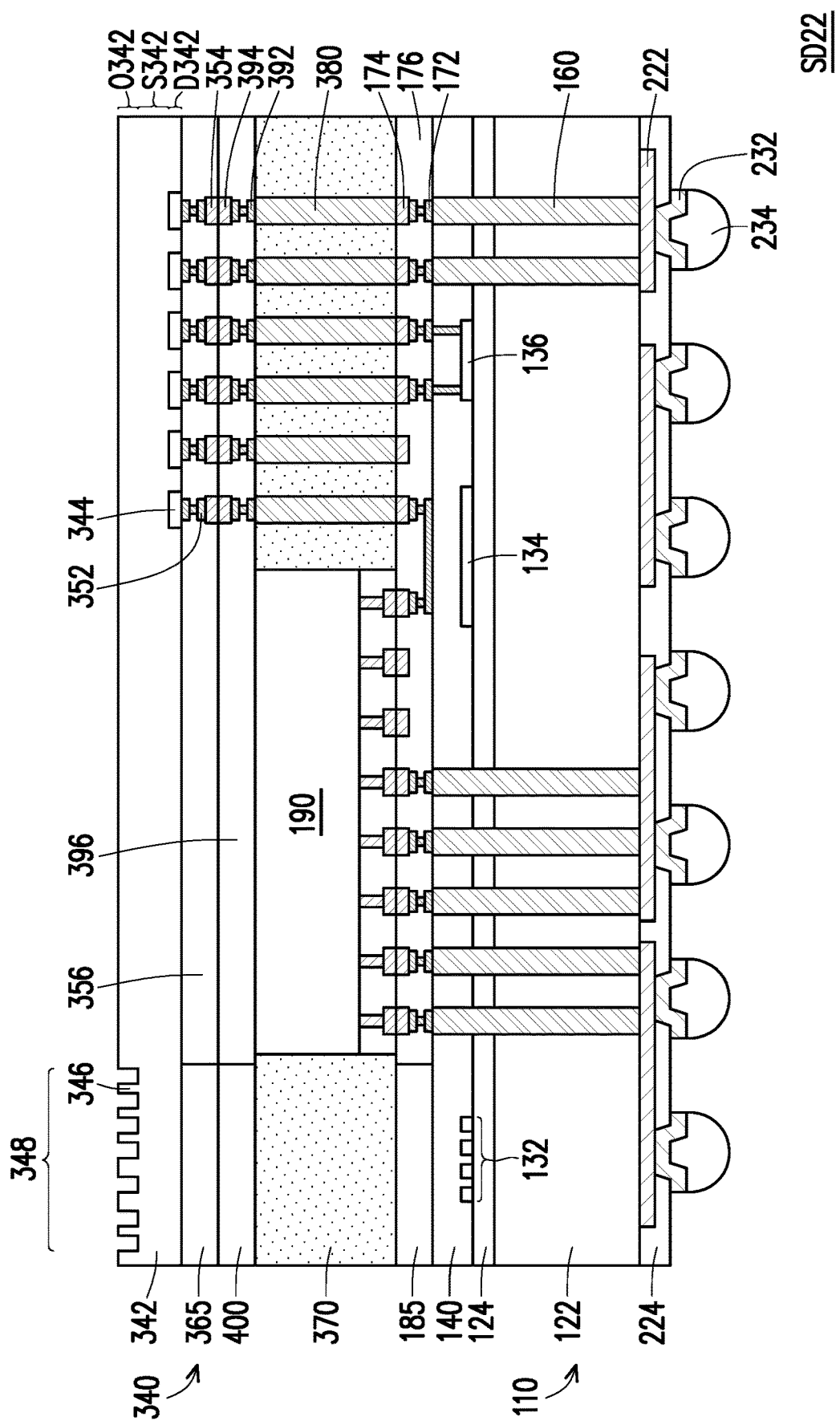

In FIG. 11E, the wafer including the optical dies 340 is hybrid-bonded to the wafer including the photonic dies 110 and the electronic dies 190. More specifically, the bonding pads 354 are bonded to the bonding pads 394, the dielectric layer 356 is bonded to the dielectric layer 396, and the filler layer 365 is bonded to the filler layer 400. That is, the interconnection structure 350 may act as a bonding layer for the optical wafer. The optical dies 340 are disposed so that the optically active areas 348 overlies the grating couplers 132, to perform a desired optical transformation on incident radiation. After bonding, the devices 344 of the optical dies 340 are also connected to the photonic dies 110 and the electronic dies 190, via the TIVs 380. That is, functional circuitry may also be included in the optical die 340. In some embodiments, the semiconductor device SD22 of FIG. 11F may be obtained after bonding of the optical die 340, for example through similar process steps as previously described with reference to FIG. 2K to FIG. 2N. While in the present embodiment the connection between the optical die 340 and the photonic die 110 or the electronic die 190 is established by the TIVs 380, the disclosure is not limited thereto. In some alternative embodiments, semiconductor dies having TSVs formed therethrough may be included to establish electrical connection to the devices 344 of the optical die 340. Similarly, while in the present embodiment the devices 344 and the optical nanostructures 346 are formed at opposite sides of the substrate 342, the disclosure is not limited thereto. In some alternative embodiments, the optical nanostructures 346 and the devices 344 may be formed on a same side of the substrate 342. For example, the optical nanostructures 346 may be formed on the side of the substrate 342 which is disposed closer to the photonic dies 110, so that the optical layer O342 and the device layer D342 coincide. In such cases, the filler layer 365 may also fill the interstices between the optical nanostructures 346.

Figure 12:
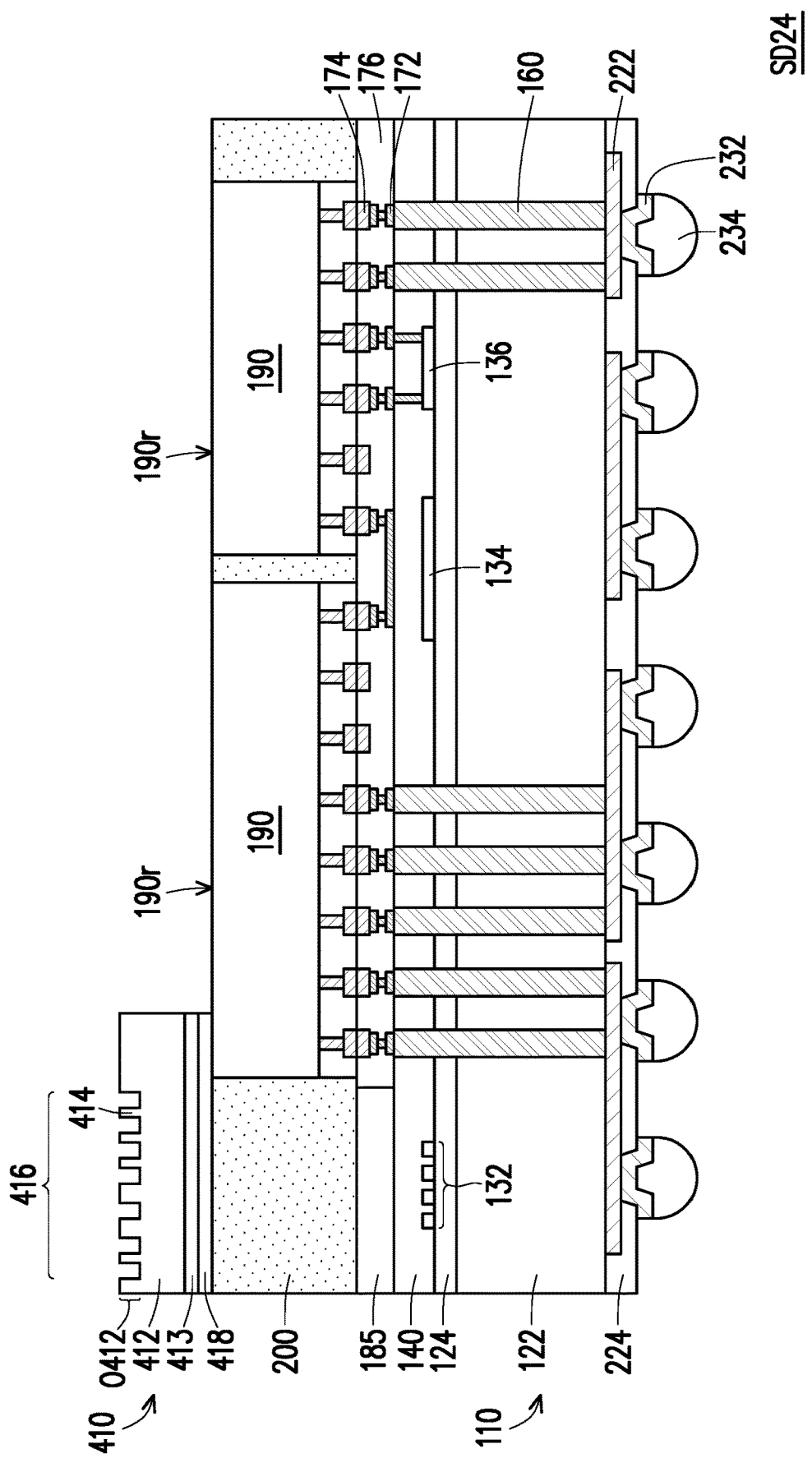
FIG. 12 to FIG. 14 are schematic cross-sectional views of semiconductor devices according to some embodiments of the disclosure.

FIG. 12 is a schematic cross-sectional view of a semiconductor device SD24 according to some embodiments of the disclosure. The semiconductor device SD24 of FIG. 12 has a similar structure and may be formed following a similar manufacturing process as previously described for the semiconductor device SD10 of FIG. 2N. In the semiconductor device SD24, the optical die 410 may have a smaller span than the photonic die 110. For example, the optical die 410 may be disposed in a region overlying the grating coupler 132 so as to be able to optically transform incident radiation, while leaving exposed at least portions (if not the entirety) of the rear surfaces 190r of the semiconductor dies 190. For example, the optical dies 410 having the bonding layer 413 and the optical nanostructures 414 may be singulated (e.g., at the stage illustrated in FIG. 1D) before being bonded to the wafer including the photonic dies 110, and may be disposed on the wafer including the photonic dies 110, for example with a pick-and-place step. Alignment marks may be formed, for example on the bonding layer 418, to ensure correct alignment of the optically active areas 416 formed in the substrate 412 with the grating couplers 132 during placement of the optical dies 410. The bonding layers 413 and 418 may then be bonded together. The bonding layer 418 may be originally blanketly formed over the wafer including the photonic dies 110 (as illustrated, e.g., in FIG. 2I), and portions left exposed after bonding of the optical dies 410 may be selectively removed. In some embodiments, heat exchangers (not shown) may be disposed on or over the exposed portions of the rear surfaces 190r of the semiconductor dies 190, so that heat generated during usage of the semiconductor devices SD24 may be efficiently dissipated.

Figure 13:
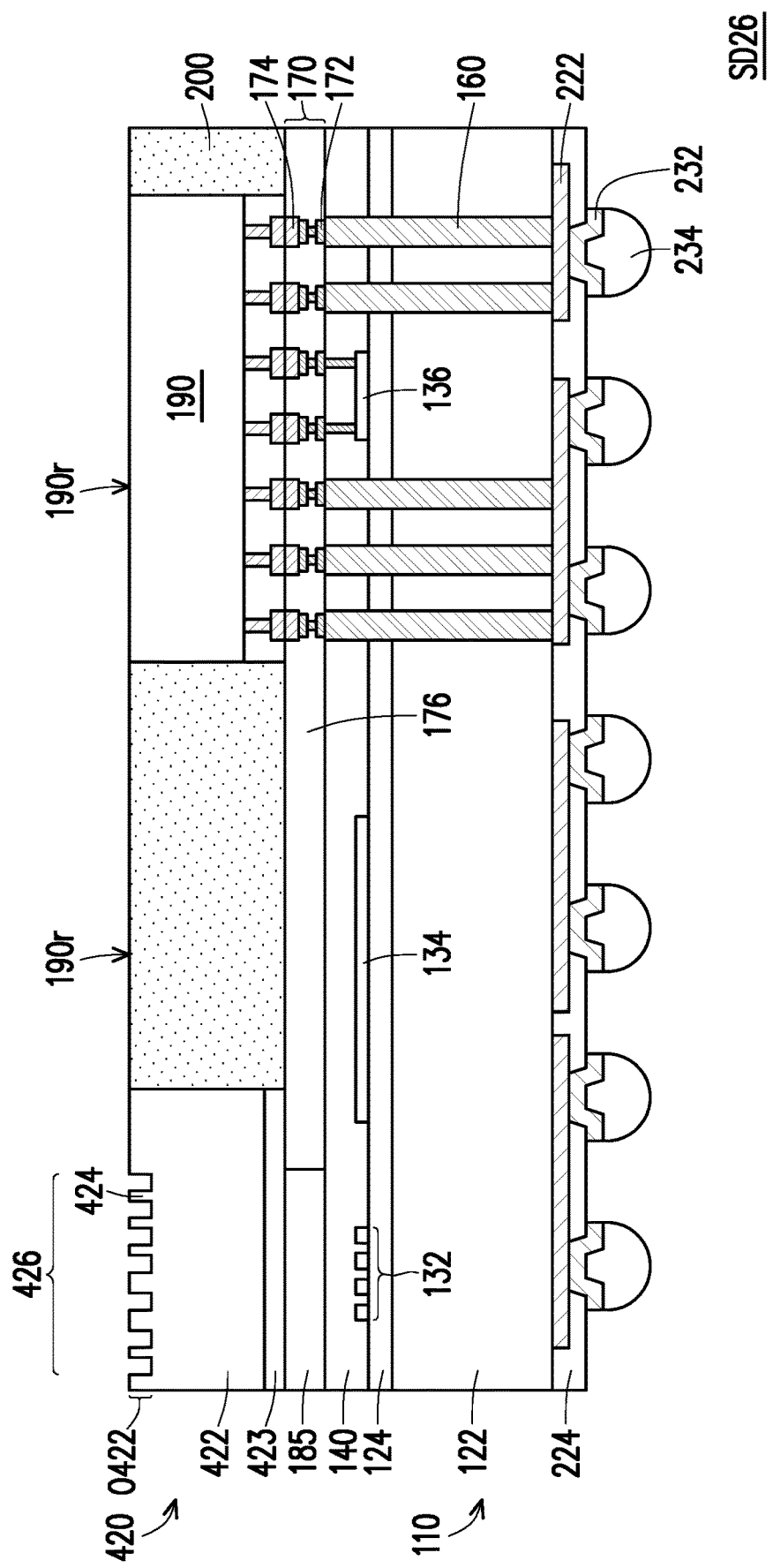

FIG. 13 is a schematic cross-sectional view of a semiconductor device SD26 according to some embodiments of the disclosure. The semiconductor device SD26 of FIG. 13 has a similar structure and may be formed following a similar manufacturing process as previously described for the semiconductor device SD10 of FIG. 2N. In some embodiments, the optical die 420 included in the semiconductor device SD26 is disposed at a same level as the semiconductor die(s) 190. For example, optical dies 420 may be disposed on the interconnection structure 170 beside the semiconductor dies 190, so as to cover the filler layers 185. In particular, the optical dies 420 are disposed so that the optical nanostructures 424 formed in the optical layer O422 of the substrate 422 overlie the grating couplers 132. In some embodiments, a bonding layer 423 is formed on the side of the substrate 422 closer to the interconnection structure 170, so that the optical dies 420 are (fusion) bonded to the filler layers 185 and, possibly, the dielectric layer 176. The encapsulant 200 is then formed, laterally wrapping the semiconductor dies 190 and the optical dies 420. In some embodiments, the material of the encapsulant 200 may also be deposited in the optically active area 426 of the optical die 420, filling the spaces in between the optical nanostructures 424 as previously described for the optical filler 262 of FIG. 4. In some embodiments, by embedding the optical die 420 in the encapsulant 200, the thickness of the semiconductor device SD26 may be reduced. Furthermore, the rear surfaces 190r of the semiconductor dies 190 are exposed, so that heat dissipation (for example, with auxiliary heat exchangers) may be facilitated.

Figure 14:
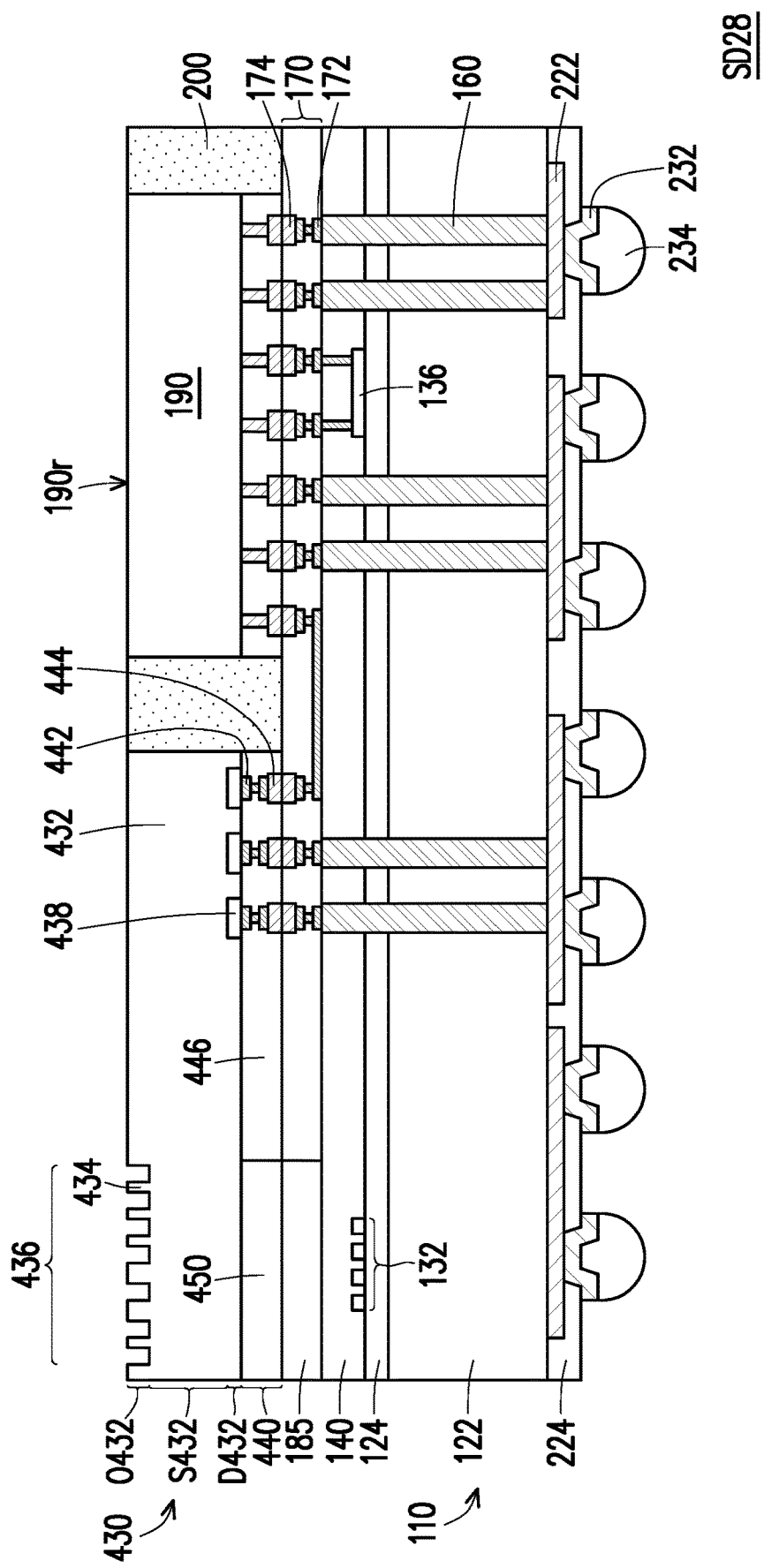

FIG. 14 is a schematic cross-sectional view of a semiconductor device SD28 according to some embodiments of the disclosure. The semiconductor device SD28 of FIG. 14 has a similar structure and may be formed following a similar manufacturing process as previously described for the semiconductor device SD10 of FIG. 2N. In some embodiments, the optical dies 430 included in the semiconductor devices SD28 have similar structures to the optical dies 340 of FIG. 11F. For example, the optical dies 430 include optical nanostructures 434 formed in an optically active area 436 of the optical layer O432 of the substrate 432, and devices 438 formed outside of the optically active area 436 in a device layer 432. In some embodiments, the optical layer O432 may be disposed at an opposite side of the bulk substrate layer S432 with respect to the device layer D432. In some alternative embodiments, the optical layer O432 and the device layer D432 may coincide or anyway be formed at a same side of the bulk substrate layer S432. In some embodiments, the interconnection structure 440 of the optical die 430 is (hybrid) bonded to the interconnection structure 170, thus acting as a bonding layer. More particularly, the bonding pads 444 are bonded to the bonding pads 174, the dielectric layer 446 is bonded to the dielectric layer 176, and the filler layer 450 is bonded to the filler layer 185. The patterned conductive traces 442 establish electrical connection between the bonding pads 444 and the devices 438. In some embodiments, when devices 438 of the optical die 430 are integrated in the circuitry of the semiconductor device SD28, the photonic die 110 can serve as an optical routing platform, for example including only passive devices, thus avoiding the risk of process failure encountered when manufacturing active devices. In some embodiments, the encapsulant 200 laterally wraps the semiconductor dies 190 and the optical die 430. In some embodiments, the material of the encapsulant 200 may also be deposited in the optically active area 436 of the optical die 430, filling the spaces in between the optical nanostructures 434 as previously described for the optical filler 262 of FIG. 4. In some embodiments, by embedding the optical die 430 in the encapsulant 200, the thickness of the semiconductor device SD28 may be reduced. Furthermore, the rear surfaces 190r of the semiconductor dies 190 are exposed, so that heat dissipation (for example, with auxiliary heat exchangers) may be facilitated. In some embodiments, the semiconductor dies 190 may be omitted. For example, the functions performed by the semiconductor die 190 may be performed instead by the devices 438 of the optical die 430. For example, the optically active area 436 of the optical die 430 performs the desired transformation on the incident radiation, while the devices 438 elaborate the signals received from the photonic die 110. Therefore, the number of components to be integrated may be reduced and the manufacturing process may be simplified.

Based on the above, in some embodiments, by including in a semiconductor device an optical die having optical nanostructures formed in an optically active area, radiation incident on a photonic die may be optically transformed. In some embodiments, use of the optical nanostructures allows increased flexibility in the configuration of the optical die, and may reduce the number of components required as multiple optical effect may be achieved by a single array of optical nanostructures. Furthermore, the optical nanostructures may be realized without significant increase in the complexity of the manufacturing process, thus containing production costs and times. The possibility of forming functional devices in the optical dies further increase the flexibility (in terms of configuration and possible applications) of the semiconductor devices of the disclosure.

In some embodiments, features of the semiconductor devices SD10-SD28 may be combined as required. For example, an optical filler such as the optical filler 262 of FIG. 4 may be applied to the optical dies 270 of FIG. 5C, 320 of FIG. 9C, 340 of FIG. 11F, 410 of FIG. 12, 420 of FIG. 13, or 430 of FIG. 14, filling the interstices between the optical nanostructures 282, 324, 346, 414, 424, or 434. In some other embodiments, the bonding layer 273 of the optical dies 270, the filler layer 365 of the optical dies 340, or even the encapsulant 200 may also function as optical filler, as described for the bonding layer 318 of FIG. 7. In some embodiments, any one of the optical dies disclosed may have a composite substrate as the optical die 270 of FIG. 5C. For example, an additional layer of a different material may be deposited on the substrate 322 of FIG. 9A, and the optical layer O322 may be formed from the additional layer alone or from multiple ones (e.g., all) of the deposited layers. In some embodiments, the optical layers O342, O412, O422, O432 of the optical dies 340 of FIG. 11F, 410 of FIG. 12, 420 of FIG. 13, and 430 of FIG. 14 may be formed of different materials than the rest of the corresponding substrates 342, 412, 422, 432. In some embodiments, any one of the optical dies disclosed may leave the semiconductor dies 190 exposed, as illustrated for the optical die 410 of FIG. 12, 420 of FIG. 13, or 430 of FIG. 14.

In accordance with some embodiments of the disclosure, a semiconductor device includes a photonic die and an optical die. The photonic die includes a grating coupler and an optical device. The optical device is connected to the grating coupler to receive radiation of predetermined wavelength incident on the grating coupler. The optical die is disposed over the photonic die and includes a substrate having optical nanostructures formed therein. Positions and shapes of the optical nanostructures are such to perform an optical transformation on the incident radiation of predetermined wavelength when the incident radiation passes through an area of the substrate where the optical nanostructures are located. The optical nanostructures overlie the grating coupler so that the incident radiation of predetermined wavelength crosses the optical die where the optical nanostructures are located before reaching the grating coupler.

In accordance with some embodiments of the disclosure, a semiconductor device includes a first dielectric layer, a grating coupler, an optical device, a first interconnection structure, a first filler layer, a first die, an encapsulant, and an optical layer. The first dielectric layer extends on a bulk semiconductor layer. The grating coupler and the optical device are disposed beside each other on the first dielectric layer. The grating coupler is configured to transmit incident radiation of at least one wavelength to the optical device. The optical device is configured to produce an electronic signal based on the incident radiation received from the grating coupler. The first interconnection structure extends over the optical device at an opposite side with respect to the first dielectric layer and is electrically connected to the optical device. The first filler layer extends over the grating coupler at an opposite side with respect to the first dielectric layer and at a same level height over the bulk semiconductor layer as the first interconnection structure. The first die is disposed on the first interconnection structure and is electrically connected to the optical device by the first interconnection structure so as to receive the electronic signal generated by the optical device. The encapsulant extends on the first interconnection structure to encapsulate the first die. The optical layer includes a pattern of columnar nanostructures. The pattern of columnar nanostructures is disposed over the first filler layer at an opposite side of the first filler layer with respect to the grating coupler. The pattern of columnar nano structures is configured to perform an optical transformation on the incident radiation before the incident radiation reaches the grating coupler.

In accordance with some embodiments of the disclosure, a manufacturing method of a semiconductor device includes the following steps. A front semiconductor layer of a semiconductor-on-insulator substrate is patterned to form at least one grating coupler and at least one optical device connected to the grating coupler. An optical die is provided over the grating coupler. The optical die includes an optically active area in which nanostructures are located. The nanostructures are positioned and shaped so that an optical transformation is performed on incident radiation of predetermined wavelength when the incident radiation passes through the optically active area. The nanostructures overlie the grating coupler so that the incident radiation of predetermined wavelength crosses the optically active area before reaching the grating coupler.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
    a photonic die, comprising a grating coupler; and
    an optical die, disposed over the photonic die and comprising a substrate having optical nanostructures formed therein,
    wherein the optical nanostructures vertically overlap the grating coupler so that an incident radiation of predetermined wavelength passes through the substrate of the optical die before reaching the grating coupler.

2. The semiconductor device of claim 1, wherein the optical nanostructures protrude from a bulk substrate layer of the substrate of the optical die.

3. The semiconductor device of claim 2, wherein a material of the optical nanostructures has a different composition than a material of the bulk substrate layer.

4. The semiconductor device of claim 1, wherein the optical die further comprises an optical filler filling interstices between adjacent optical nanostructures, and a material of the optical nanostructures has a different composition than a material of the optical filler.

5. The semiconductor device of claim 1, wherein the photonic die further comprises:
    an optical device connected to the grating coupler to receive the radiation of predetermined wavelength;
    an interconnection structure extending over the optical device, the interconnection structure comprising patterned conductive traces electrically connected to the optical device; and
    a filler layer, disposed over the grating coupler beside the interconnection structure, between the grating coupler and the optical die,
    wherein the filler layer is at least as thick as the interconnection structure.

6. The semiconductor device of claim 5, wherein the optical die comprises at least one active device formed on the substrate and electrically connected to the interconnection structure of the photonic die.

7. The semiconductor device of claim 5, further comprising an electronic die connected to the interconnection structure of the photonic die on a same side of the interconnection structure with respect to the optical die.

8. The semiconductor device of claim 7, wherein the electronic die is disposed between the photonic die and the optical die and,
    the semiconductor device further comprises an encapsulant laterally wrapping the electronic die, so that the incident radiation passes through the encapsulant and the filler layer after leaving the optical die and before reaching the grating coupler.

9. A semiconductor device, comprising:
a grating coupler configured to transmit incident radiation of at least one wavelength;
a first filler layer, disposed over the grating coupler;
a first interconnection structure, located at a same level height as the first filler layer;
a first die, disposed on the first interconnection structure and electrically connected to the first interconnection structure; and
an optical layer comprising a pattern of columnar nanostructures disposed over the first filler layer at an opposite side of the first filler layer with respect to the grating coupler, wherein the pattern of columnar nanostructures is configured to perform an optical transformation on the incident radiation before the incident radiation reaches the grating coupler.

10. The semiconductor device of claim 9, wherein the optical transformation performed by the pattern of columnar nanostructures is one of a lensing effect, a polarization effect, a filtering effect, or a combination thereof.

11. The semiconductor device of claim 9, wherein the optical layer further extends over the first die.

12. The semiconductor device of claim 9, further comprising:
a first bonding layer extending over the first filler layer and the first die, and
an optical die, comprising:
the optical layer;
a bulk substrate layer on which the optical layer is located, whereby the columnar nanostructures protrude from the bulk substrate layer; and
a second bonding layer, extending on a side of the bulk substrate layer,
wherein the first bonding layer physically contacts the second bonding layer, and a material of the first bonding layer is bonded to a material of the second bonding layer.

13. The semiconductor device of claim 12, wherein the second bonding layer and the optical layer are formed on a same side of the bulk substrate layer, and the second bonding layer further extends between adjacent columnar nanostructures of the pattern of columnar nanostructures.

14. The semiconductor device of claim 12, wherein the optical die further comprises a device layer in which devices of a functional circuit are formed,
the second bonding layer comprises a second dielectric layer and first bonding pads embedded in the second dielectric layer and electrically connected to the devices of the device layer,
the first bonding layer comprises a third dielectric layer and second bonding pads embedded in the third dielectric layer,
the first bonding pads are aligned with and bonded to the second bonding pads,
the second dielectric layer is bonded to the third dielectric layer, and
the semiconductor device further comprises through insulator vias electrically connecting the second bonding pads to the first interconnection structure.

15. A manufacturing method of a semiconductor device, comprising:
patterning a front semiconductor layer of a first substrate to form at least one grating coupler; and
providing an optical die over the grating coupler,
wherein the optical die comprises an optically active area in which nanostructures are located, the nanostructures being configured to perform an optical transformation on incident radiation of predetermined wavelength when the incident radiation passes through the optically active area, and
the nanostructures cover the grating coupler so that the incident radiation of predetermined wavelength passes through the optically active area before reaching the grating coupler.

16. The manufacturing method of claim 15, further comprising:
forming an interconnection structure over the first substrate, wherein patterned conductive traces of the interconnection structure contact at least one optical device connected to the grating coupler;
removing a portion of the interconnection structure overlying the grating coupler; and
filling the gap left by the removed portion of the interconnection structure with a filling material before providing the optical die.

17. The manufacturing method of claim 16, further comprising:
hybrid-bonding an electronic die to the interconnection structure, whereby devices formed in the electronic die are connected to the at least one optical device; and
forming an encapsulant on the interconnection structure and the filling material to encapsulate the electronic die, wherein the encapsulant extends between the filling material and the optically active area of the optical die.

18. The manufacturing method of claim 17, wherein providing the optical die comprises:
forming an optical layer on the encapsulated electronic die; and
etching the optical layer to form the nanostructures of the optically active area.

19. The manufacturing method of claim 17, wherein providing the optical die comprises:
etching a second substrate to form the nanostructures of the optically active area;
forming a first bonding layer on one side of the second substrate;
forming a second bonding layer on the encapsulated electronic die;
disposing the second substrate with the first bonding layer contacting the second bonding layer; and
performing at least one heating step to bond together the first bonding layer and the second bonding layer.

20. The manufacturing method of claim 17, wherein providing the optical die comprises:
etching a second substrate to form the nanostructures of the optically active area;
forming a first bonding layer on one side of the second substrate;
disposing the second substrate with the first bonding layer contacting the filling material and the interconnection structure beside the electronic die before the encapsulant is formed; and
performing at least one heating step to bond together the first bonding layer and the filling material.

* * * * *